(12) United States Patent
Prater et al.

(10) Patent No.: US 10,942,116 B2
(45) Date of Patent: Mar. 9, 2021

(54) METHOD AND APPARATUS FOR ENHANCED PHOTO-THERMAL IMAGING AND SPECTROSCOPY

(71) Applicant: Photothermal Spectroscopy Corp., Santa Barbara, CA (US)

(72) Inventors: Craig Prater, Santa Barbara, CA (US); Kevin Kjoller, Santa Barbara, CA (US); Roshan Shetty, Westlake Village, CA (US)

(73) Assignee: Photothermal Spectroscopy Corp., Santa Barbara, CA (US)

( * ) Notice: Subject to any disclaimer, the term of this patent is extended or adjusted under 35 U.S.C. 154(b) by 0 days.

(21) Appl. No.: 16/155,089

(22) Filed: Oct. 9, 2018

(65) Prior Publication Data
US 2019/0120753 A1    Apr. 25, 2019

Related U.S. Application Data

(60) Provisional application No. 62/569,944, filed on Oct. 9, 2017.

(51) Int. Cl.
*G01N 21/35* (2014.01)
*G01N 21/65* (2006.01)
(Continued)

(52) U.S. Cl.
CPC .......... *G01N 21/35* (2013.01); *G01N 21/171* (2013.01); *G01N 21/1717* (2013.01);
(Continued)

(58) Field of Classification Search
None
See application file for complete search history.

(56) References Cited

U.S. PATENT DOCUMENTS 2,940,355 A    6/1960  Cary
7,630,081 B2  12/2009  Ressler et al.
(Continued)

FOREIGN PATENT DOCUMENTS

CN    105699358 A    6/2016
DE    102014108424 B3  6/2015
WO    WO 2013/078471 A1  5/2013

OTHER PUBLICATIONS

Grodecki, K., et al. "Optical absorption and raman scattering studies of few-layer epitaxial graphene grown on 4H-SiC substrates." Acta Phys. Pol. A 116.5 (2009): 835-837 (Year: 2009).*
(Continued)

*Primary Examiner* — Shawn Decenzo
(74) *Attorney, Agent, or Firm* — Patterson Thuente Pedersen, P.A.

(57) ABSTRACT

System for performing chemical spectroscopy on samples from the scale of nanometers to millimeters or more with a multifunctional platform combining analytical and imaging techniques including dual beam photo-thermal spectroscopy with confocal microscopy, Raman spectroscopy, fluorescence detection, various vacuum analytical techniques and/ or mass spectrometry. In embodiments described herein, the light beams of a dual-beam system are used for heating and sensing.

46 Claims, 24 Drawing Sheets

(51) Int. Cl.

| | | |
|---|---|---|
| *G01N 21/59* | (2006.01) | |
| *H01J 37/26* | (2006.01) | |
| *G01N 23/20091* | (2018.01) | |
| *G01N 23/207* | (2018.01) | |
| *G01N 21/552* | (2014.01) | |
| *G01N 21/17* | (2006.01) | |
| *G01N 21/3563* | (2014.01) | |
| *H01J 49/26* | (2006.01) | |
| *G01N 21/47* | (2006.01) | |
| *G01N 21/64* | (2006.01) | |

(52) U.S. Cl.
CPC ....... *G01N 21/3563* (2013.01); *G01N 21/552* (2013.01); *G01N 21/59* (2013.01); *G01N 21/65* (2013.01); *G01N 23/207* (2013.01); *G01N 23/20091* (2013.01); *H01J 37/26* (2013.01); *G01N 21/6458* (2013.01); *G01N 2021/1725* (2013.01); *G01N 2021/1731* (2013.01); *G01N 2021/479* (2013.01); *H01J 49/26* (2013.01)

(56) References Cited

U.S. PATENT DOCUMENTS

| | | | |
|---|---|---|---|
| 7,855,780 B1 | 12/2010 | Djeu | |
| 8,001,830 B2 | 8/2011 | Dazzi et al. | |
| 8,242,448 B2 | 8/2012 | Prater et al. | |
| 8,402,819 B2 | 3/2013 | Dazzi et al. | |
| 8,607,622 B2 | 12/2013 | Dazzi et al. | |
| 8,646,319 B2 | 2/2014 | Prater et al. | |
| 8,680,457 B2 | 3/2014 | Maxik et al. | |
| 8,793,811 B1 | 7/2014 | Prater et al. | |
| 8,869,602 B2 | 10/2014 | Belkin et al. | |
| 9,046,492 B1* | 6/2015 | Prater | G01N 21/658 |
| 9,091,594 B2* | 7/2015 | Furstenberg | G01J 3/02 |
| 9,134,341 B2 | 9/2015 | Prater et al. | |
| 9,250,061 B2* | 2/2016 | Lorbeer | G01N 21/4795 |
| 9,372,154 B2 | 6/2016 | Prater | |
| 9,658,247 B2 | 5/2017 | Yang et al. | |
| 10,228,388 B2 | 3/2019 | Prater et al. | |
| 10,228,389 B2 | 3/2019 | Yang et al. | |
| 10,241,131 B2 | 3/2019 | Prater | |
| 10,473,693 B2 | 11/2019 | Yang et al. | |
| 2002/0105641 A1 | 8/2002 | Anderson | |
| 2005/0105099 A1 | 5/2005 | Shpantzer et al. | |
| 2008/0304046 A1 | 12/2008 | Lee et al. | |
| 2009/0236528 A1 | 9/2009 | Shpantzer et al. | |
| 2009/0249521 A1 | 10/2009 | Dazzi et al. | |
| 2010/0044570 A1 | 2/2010 | McGill et al. | |
| 2010/0320171 A1 | 12/2010 | Mao et al. | |
| 2011/0248166 A1 | 10/2011 | Diem et al. | |
| 2012/0002030 A1 | 1/2012 | Kalkbrenner et al. | |
| 2012/0122084 A1* | 5/2012 | Wagner | G01N 15/1434 435/6.1 |
| 2012/0167261 A1 | 6/2012 | Belkin et al. | |
| 2012/0314206 A1 | 12/2012 | Spizig et al. | |
| 2013/0134310 A1* | 5/2013 | Furstenberg | G01J 3/02 250/341.6 |
| 2014/0289912 A1 | 9/2014 | Andreev | |
| 2014/0361150 A1 | 12/2014 | Cheng et al. | |
| 2015/0085098 A1* | 3/2015 | Dowaki | G01J 3/44 348/79 |
| 2015/0308947 A1 | 10/2015 | Xu et al. | |
| 2017/0127983 A1* | 5/2017 | Spegazzini | A61B 5/1495 |
| 2017/0146455 A1 | 5/2017 | Mantele et al. | |
| 2018/0052186 A1 | 2/2018 | Su et al. | |
| 2018/0088041 A1 | 3/2018 | Zhang et al. | |
| 2018/0180642 A1* | 6/2018 | Shetty | G01N 21/1717 |
| 2018/0259553 A1 | 9/2018 | Yang et al. | |
| 2019/0120753 A1* | 4/2019 | Prater | G01N 23/207 |
| 2019/0204230 A1* | 7/2019 | Ota | G01N 21/65 |
| 2020/0025677 A1 | 1/2020 | Prater et al. | |

OTHER PUBLICATIONS

Article "Helium-Neon Laser," University of New Mexico, dated Nov. 22, 2012 (Retrieved on May 4, 2018), 6 pages.
Bialkowski, "Application of the BaTiO3 Beam-Fanning Optical Limiter as an Adaptive Spatial Filter for Signal Enhancement in Pulsed Infrared Laser-Excited Photothermal Spectroscopy," Optics Letters, Sep. 1989, 3 pages.
Bialkowski, "Pulsed-Laser Excited Differential Photothermal Deflection Spectroscopy," Society for Applied Spectroscopy, 1992, 11 pages.
Bialkowski, "Ultrasensitive Photothermal Deflection Spectrometry Using an Analyzer Etalon," American Chemical Society, 1988, 6 pages.
Boyer et al., "Photothermal Imaging of Nanometer-Sized Metal Particles Among Scatters," Science, vol. 297, Aug. 2002, 4 pages.
Brandstetter et al., "High Power Terahertz Quantum Cascade Lasers with Symmetric Wafer Bonded Active Regions," Applied Physics Letters 103, 171113 (2013), 6 pages.
Burghoff et al., "Terahertz Laser Frequency Combs," Nature Photonics, 2014, 10 pages.
Cariou et al., "Refractive-Index Variations with Temperature of PMMA and Polycarbonate," Applied Optics vol. 25, No. 3, 1986.
Dowrey et al., Industrial Applications of Near-IR Imaging, Spectrochemical Analysis Using Infrared Multichannel Detectors, Blackwell Publishing, 2005, pp. 175-188.
Gorgulu et al. "All-Silicon Ultra-Broadband Infrared Light Absorbers," Scientific Reports, 2016, 7 pages.
Grodecki et al., "Optical Absorption and Raman Scattering Studies of Few-Layer Epitaxial Graphene Grown on 4H-SiC Substrates," Acta Phys. Pol. A 116.5 (2009); 835-837 (Year 2009).
Harthcock et al., Applications of Transmittance and Reflectance Micro/FT-IR to Polymeric Materials, Analytical Services, vol. 40, Issue 2, 1986, pp. 210-214.
Harthcock et al., Imaging with Functional Group Maps Using Infrared Microspectroscopy, Analytical and Engineering Sciences, vol. 42, Issue 3, 1988, pp. 449-455.
Hemming et al., "A High Power Mid-IR ZGP Ring OPO," with over 30 W of optical power (DOI: 10.1364/CLEO_SI.2013.CW1B.7).
Inoue et al., "Realization of Dynamic Thermal Emission Control," Kyoto University, Jul. 2014, pp. 928-931.
Jiang et al., "Compact High Power Mid-Infrared Optical Parametric Oscillator Pumped by a Gain-Switched Fiber Laser with Figure-of-h Pulse Shape," Optical Society of America, 2015, 6 pages.
Jiang et al., "Narrow-Linewidth Megahertz-Repetition-Rate Optical Parametric Oscillator for High-Speed Flow and Combustion Diagnostics", Applied Optics, vol. 47, No. 1, 2008, pp. 64-71.
Jung et al., "Infrared Broadband Metasurface Absorber for Reducing the Thermal Mass of a Microbolometer," Scientific Reports, 2017, 8 pages.
Kluk et al., "A High-Bandwidth, High-Precision, Two-Axis Steering Mirror with Moving Iron Actuator," Mechanical Engineering Department, Massachusetts Institute of Technology, 2010, pp. 552-557.
Li et al., "Super-Resolution Imaging with Mid-IR Photothermal Microscopy on the Single Particle Level," SPIE Proceedings vol. 9549, 954912-1, 2015, 8 pages.
Liu, "Differential Interference Contrast-Photothermal Microscopy in Nanospace: Impacts of Systematic Parameters," Journal of Microscopy, Mar. 2017, 9 pages.
Marcott et al., "Mining the Information Content Buried in Infrared and Near-Infrared Band Shapes by Temporal, Spatial, and Other Perturbations," Applied Spectroscopy, 2009, 9 pages.
Moscatelli, "Tiny Lenses for Miniature Devices," Scientific American, Dec. 2019, 1 page.
Peng et al., High-Power Mid-Infrared Tunable Optical Parametric Oscillator Based on 3-mm-Thick PPMgCLN[1], Institute of Applied Electronics, China Academy of Engineering Physics, 2012, pp. 87-90.
Selmke et al., "Photothermal Single Particle Microscopy: Detection of a Nanolens," ACS Nano, 2011, 11 pages.
Sullenberger et al., "Spatially-Resolved Individual Particle Spectroscopy Using Photothermal Modulation of Mie Scattering," Mas-

(56) References Cited

OTHER PUBLICATIONS sachusetts Institute of Technology, vol. 42, No. 2, Jan. 15, 2017, pp. 203-206.
Tapos et al., "High Bandwidth Fast Steering Mirror," Optomechanics, 2005, 14 pages.
Wang et al., "High-Power Terahertz Quantum Cascade Lasers with ~0.23 W in Continuous Wave Mode," AIP Advances, 2016, 6 pages.
Webpage—Optotronics—https://www.optotronics.com/532nm-green-laser-systems.php, 2017, 2 pages.
Winefordner et al., "Comparison of Calculated Detection Limits in Molecular Absorption, Molecular Luminescence, Raman, Molecular Ionization, and Photothermal Spectroscopy," Applied Spectroscopy, vol. 39, No. 3, 1985, 15 pages.
Zanuto, "Analysis of the Thermo-Reflectivity Coefficient Influence Using Photothermal Pump-Probe Techniques," Applied Spectroscopoy, 2016, 7 pages.
Zhao, "Heterogeneous and Cross-Distributed Metal Structure Hybridized with Mos2 as High-Performance Flexible SERS Substrate," School of Physics and Electronics, Sep. 2018, 13 pages.
Callaway, "It Opens up a Whole New Universe: Revolutionary Microscopy Technique See Individual Atoms for First Time," Nature, vol. 582, Jun. 11, 2020, 2 pages.
Cho Pak et al., "Investigation of Standoff Explosives Detection Via Photothermal/Photoacoustic Interferometry," Chemical, Biological, Radiological, Nuclear, and Explosives Sensing XII, vol. 8018, No. 1, May 13, 2011, 15 pages.
Totachawattana et al. "Optimization of Mid-IR Photothermal Imaging for Tissue Analysis," Visual Communications and Image Processing, Aug. 26, 2015, 7 pages.
Nedosekin et al., "Photothermal Confocal Spectromicroscopy of Multiple Cellular Chromophores and Fluorophores," Biophysical Journal, Feb. 1, 2012, 10 pages.
Zhang et al., "Depth-Resolved Mid-Infrared Photothermal Imaging of Living Cells and Organisms with Submicrometer Spatial Resolution," Science Advances, Sep. 28, 2016, 8 pages.
CN Patent Application No. 201780084916.1, First Office Action dated Mar. 20, 2020, 3 pages.
EP Patent Application No. 17875919.7, Extended EP Search Report dated Jul. 30, 2020, 9 pages.
EP Patent Application No. 17875650.8, Supplementary Partial Search Report dated Jun. 8, 2020, 15 pages.
PCT Application No. PCT/US2017/063810, Search Report dated Mar. 6, 2018, 4 pages.
PCT Application No. PCT/US2017/063810, Written Opinion dated Mar. 6, 2018, 14 pages.
PCT Application No. PCT/US2017/063807, Search Report and Written Opinion dated Apr. 25, 2018, 11 pages.
PCT Application No. PCT/US2018/021814, Search Report and Written Opinion dated May 21, 2018, 8 pages.
PCT Application No. PCT/US2017/053407, Search Report and Written Opinion dated Dec. 1, 2017, 12 pages.
Application and file history for U.S. Appl. No. 15/715,534, filed Sep. 26, 2017. Inventors: Zhang et al.
Application and file history for U.S. Appl. No. 15/826,147, filed Nov. 29, 2017. Inventors: Shetty et al.
Application and file history for U.S. Appl. No. 15/917,210, filed Mar. 9, 2018. Inventors: Yang et al.
Application and file history for U.S. Appl. No. 16/465,824, filed May 31, 2019. Inventors: Prater et al.
Chinese Application No. 201780084916.1, Second Office Action dated Dec. 1, 2020, 5 pages.

\* cited by examiner

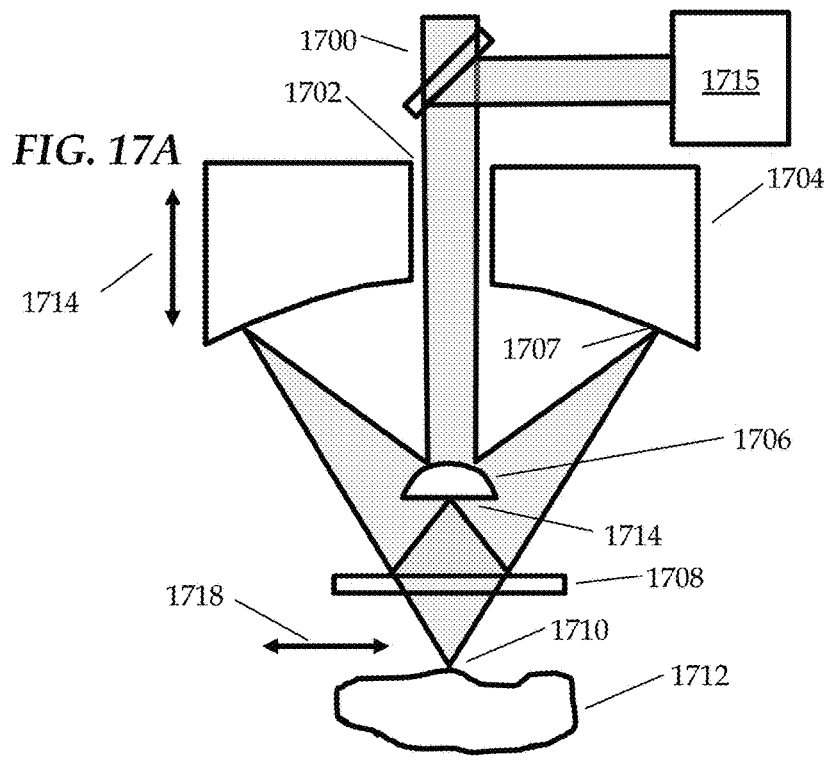
*FIG. 17A*
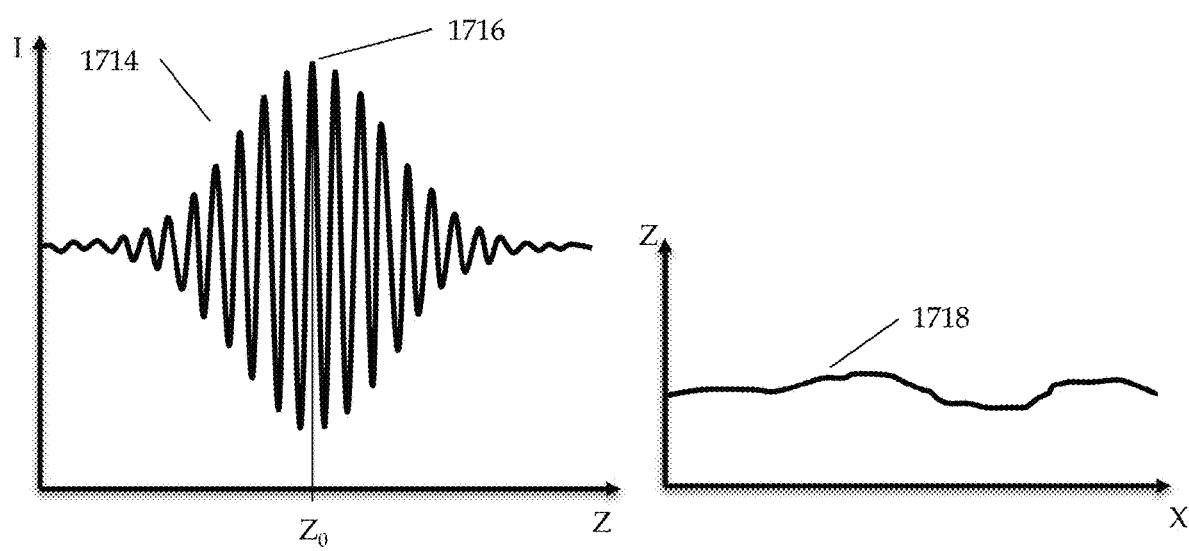
*FIG. 17B*
*FIG. 17C*

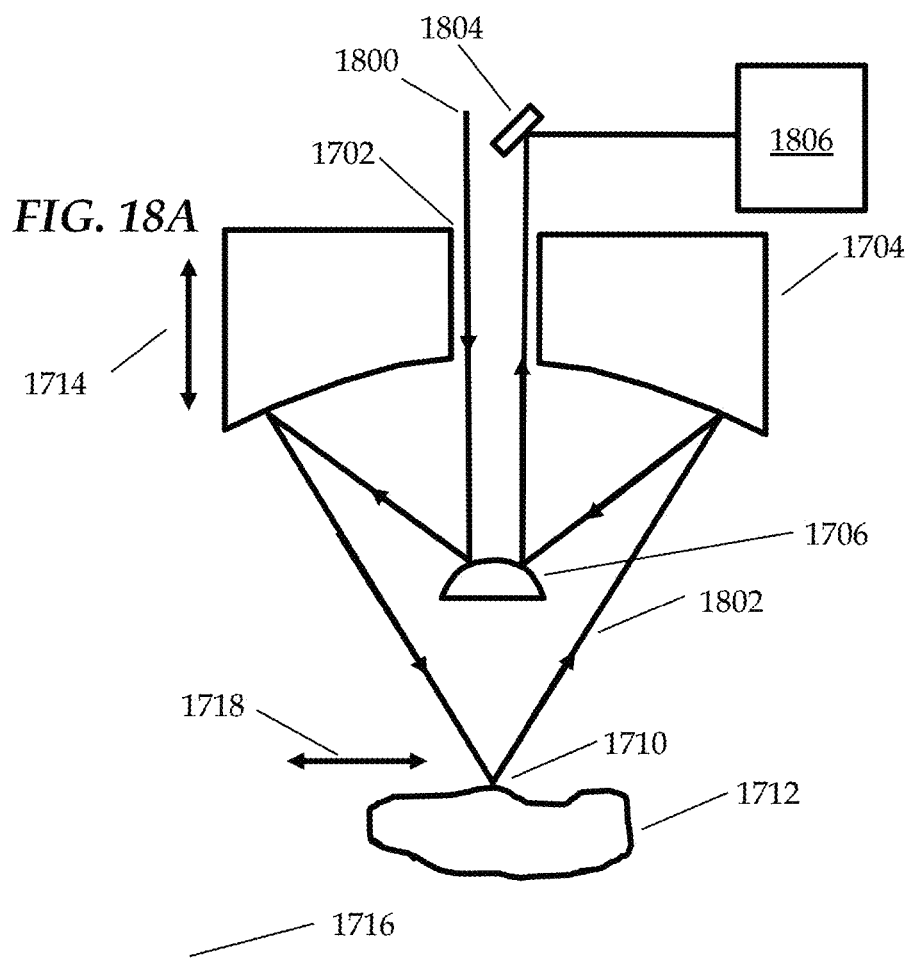
*FIG. 18A*
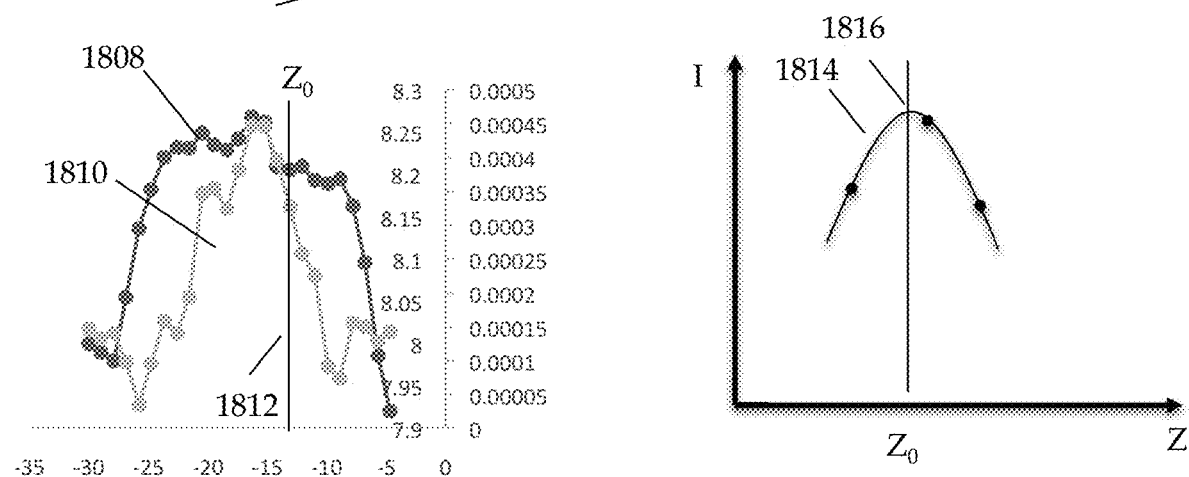
*FIG. 18B*  *FIG. 18C*

METHOD AND APPARATUS FOR ENHANCED PHOTO-THERMAL IMAGING AND SPECTROSCOPY

RELATED APPLICATION

This application claims the benefit of U.S. Provisional Application No. 62/569,944 filed Oct. 9, 2017, which is hereby fully incorporated herein by reference.

PRIORITY

Various aspects of the embodiments and techniques described in this application are described in U.S. Provisional Applications, Ser. Nos. 62/427,671, filed Nov. 29, 2016, 62/469,349, filed Mar. 9, 2017, 62/505,533, filed May 12, 2017, and 62/541,749, filed Aug. 6, 2017, the disclosures of each of which are hereby incorporated by reference.

BACKGROUND

1. Field of the Invention

The specification relates to investigating or analyzing materials by the use of optical means, i.e. using infra-red, visible, or ultraviolet light. Embodiments described herein relate to imaging and spectroscopy, and, more particularly, to enhancements to photo-thermal imaging and spectroscopy systems and techniques for acquiring spectral information indicative of the optical properties and/or material/chemical composition of a sample, for example, information that correlates to an infrared (IR) absorption spectrum.

2. Background of the Invention

Fourier Transform Infrared (FTIR) spectroscopy is the most common form of IR spectroscopy. FTIR works by measuring transmission of an infrared light through a sample or reflection of IR light from a sample as a function of wavenumber (a measure of the frequency of the IR light,). FTIR based microscopes combine an FTIR spectrometer and microscope optics to provide spatially resolved measurements of IR absorption, transmission, and/or reflection. Conventional FTIR microscopy can only achieve spatial resolution on the order of the wavelength of the IR light. The fundamental limit is determined by optical diffraction and is set by the wavelength of the IR light and the numerical aperture of the IR illumination and/or collection optics. Practical limitation may degrade this spatial resolution further. The spatial of the FTIR microscope is wavelength dependent, but is on the order of 10 microns in transmission for wavelengths in the mid-IR. An example of an FTIR spectroscopy approach is shown, for example, in U.S. Pat. No. 7,630,081, which describes recent improvements to FTIR interferometers. FTIR spectroscopy can be insufficiently precise, and involves significant sample preparation to insure appropriate transmission of the mid-IR beam through the sample, which is not practicable or desirable for many opaque, frangible, or biological substances.

Attenuated Total Reflection (ATR) spectroscopy is based on indirect reflection of a beam through an intervening crystal in direct contact with the sample. ATR spectroscopy can only achieve resolutions on the order of 3 microns using mid-IR beams. Unfortunately, ATR spectroscopy necessarily requires direct contact of the intervening crystal with the sample which can cause deformation or breaking of the sample, and requires a significant amount of sample preparation, particularly for organic samples. Furthermore, reflection or refraction between the crystal and the sample requires good contact between the two. If good contact is not established, then the light may reflect or refract based on the refractive index of the material between the sample and the crystal, rather than based on the properties of the sample itself.

Raman spectroscopy is based on measurement of Raman scattering in response to illumination of a sample by a mid-IR beam. Raman spectroscopy can achieve resolutions as low as a few hundred nanometers, but usually has a practical limit of 1 micron or more. An early example of a Raman spectroscopy approach is shown, for example, in U.S. Pat. No. 2,940,355. Although Raman spectroscopy can achieve resolutions down to several hundred nanometers, the information generated from this approach includes noisy or dispersive artifacts that are inherent in Raman scattering.

U.S. Pat. No. 9,091,594 describes an alternative non-destructive approach for photo-thermal spectroscopy for chemical spectroscopy and imaging that uses two beams of light of differing wavelengths to achieve sub-micron spatial resolution, but in a non-contact manner and without the onerous sample preparation requirements associated with ATR or FTIR techniques described above. The method describes illuminating a sample with a first beam of IR light having a wavelength of at least 2.5 microns to create a photo-thermal change in a region within the sample due to absorption of energy from the first beam, and then illuminating at least a portion of the region within the sample with a second beam of light having a wavelength of less than 2.5 microns to detect the photo-thermal change in the region at a resolution smaller than a diffraction limit of the first beam.

Although the alternative dual beam photo-thermal spectroscopy technique described in U.S. Pat. No. 9,091,594 provides significant advantages over the three general approaches to mid-IR spectroscopy and imaging, further enhancements and improvements to this new photo-thermal technique are desirable.

SUMMARY

Various embodiments are described for performing chemical spectroscopy on samples using a multifunctional platform that combines the analytical and imaging techniques of dual beam photo-thermal spectroscopy with confocal microscopy, Raman spectroscopy, fluorescence detection, various vacuum analytical techniques, and/or mass spectrometry. In embodiments described herein, the light beams of a dual-beam system are used for heating and sensing.

The dual-beam system as described in various embodiments can include at least a first light beam of infrared radiation for heating and a separate second light beam for probing/sensing having a wavelength shorter than the first beam. In various embodiments, these light beams can be arranged parallel to one another, or arranged along a common path, and these two different beams may be spatially distinct from one another or may be distinguished by different wavelengths.

The heating/infrared beams can be, for example, a beam that is tuned to induce molecular vibrations in a sample. The probing/sensing beams can be a beam that is tuned for high resolution detection of the characteristics of the sample, and can have a lower wavelength than the heating beam in some embodiments. Characteristics of the sample that can be measured by the probing/sensing beam include index of refraction as well as deformation, expansion, and/or change in index of refraction of a sample. In some embodiments, the probing/sensing beam can also detect properties of the sample, such as by Raman spectroscopy, fluorescence, or combinations of those techniques.

For the dual-beam photo-thermal spectroscopy, a sample region is illuminated by the heating light beam and the resulting photo-thermal response due to infrared absorption is read out as an undistorted spectra with the probing/sensing light beam. The measurements collected by these two light beams operating in coordination with one another contains more data and can be collected at a higher resolution than operating the beams independently from one another. That is, the probing/sensing light beam has a more precise spatial resolution than the heating/infrared light beam due to its lower Abbe diffraction limit, whereas the heating/infrared light beam can initiate spectroscopy data or wavelength shifts due to a photo-thermal response that would not be caused by a sensing light beam operating in isolation.

Definitions

For purposes of this specification, the following terms are specifically defined as follows:

"Optical property" refers to an optical property of a sample, including but not limited to index of refraction, absorption coefficient, reflectivity, absorptivity, real and/or imaginary components of the index refraction, real and/or imaginary components of the sample dielectric function and/or any property that is mathematically derivable from one or more of these optical properties.

"Illuminate," "Illuminating," and "Illumination" mean to direct radiation at an object, for example a surface of a sample, the probe tip, and/or the region of probe-sample interaction. Illumination may include radiation in the infrared wavelength range, visible, and other wavelengths from ultraviolet to a millimeter or more. Illumination may include any arbitrary configuration of radiation sources, reflecting elements, focusing elements and any other beam steering or conditioning elements.

"Infrared light source" refers to one or more optical sources that generate or emits radiation in the infrared wavelength range, For example it can comprise wavelengths within the mid-IR (2-25 microns). An infrared light source may generate radiation over a large portion of these wavelength sub-regions, or have a tuning range that is a subset of one of the wavelength ranges, or may provide emission across multiple discrete wavelength ranges, for example 2.5-4 microns, or 5-13 microns, for example. The radiation source may be one of a large number of sources, including thermal or Globar sources, supercontinuum laser sources, frequency combs, difference frequency generators, sum frequency generators, harmonic generators, optical parametric oscillators (OPOs), optical parametric generators (OPGs), quantum cascade lasers (QCLs), nanosecond, picosecond, femtosecond, and attosecond laser systems, CO2 lasers, heated cantilever probes or other microscopic heaters, and/ or any other source that produces a beam of radiation. The source may be narrowband, for example with a spectral width of <10 $cm^{-1}$ or <1 $cm^{-1}$ less, or may be broadband, for example with a spectral width of >10 $cm^{-1}$, >100 $cm^{-1}$ or greater than 500 $cm^{-1}$. "Near infrared light" generally refers to a wavelength range of IR light corresponding to 0.75-2 μm.

"Probe light source" refers to a radiation source that can be used for sensing of an optical property of a sample. A probe light source can be used to sense the response of the sample to the incidence of light from the infrared light source. The radiation source may comprise a gas laser, a laser diode, a superluminescent diode (SLD), a near infrared laser, a UV and/or visible laser beam generated via sum frequency or difference frequency generation, for example. It may also comprise any or other sources of near-infrared, UV, and/or visible light that can be focused to a spot on the scale smaller than 2.5 micrometer, and or even smaller than 1 micrometer, and possibly smaller than 0.5 micrometer. In some embodiments, the probe light source may operate at a wavelength that is outside the tuning or emission range of the infrared light source, but the probe light source can also be a fixed wavelength source at a select wavelength that does in fact overlap with the tuning range of the infrared light source. A "probe light beam" or "sensing light beam" is a beam originally emitted from a probe light source. In some embodiments, the probe light source is selected to be a "narrow band light source," as described below.

"Collecting probe light" refers to collecting radiation of a probe light beam that has interacted with a sample. The probe light can be collected after reflection, scattering, transmission, evanescent wave coupling, and/or transmission through an aperture probe.

"Signal indicative of" refers to a signal that is mathematically related to a property of interest. The signal may be an analog signal, a digital signal, and/or one or more numbers stored in a computer or other digital electronics. The signal may be a voltage, a current, or any other signal that may be readily transduced and recorded. The signal may be mathematically identical to the property being measured, for example explicitly an absolute phase signal or an absorption coefficient. It may also be a signal that is mathematically related to one or more properties of interest, for example including linear or other scaling, offsets, inversion, or even complex mathematical manipulations.

"Spectrum" refers to a measurement of one or more properties of a sample as a function of wavelength or equivalently (and more commonly) as a function of wavenumber.

"Infrared absorption spectrum" refers to a spectrum that is proportional to the wavelength dependence of the infrared absorption coefficient, absorbance, or similar indication of IR absorption properties of a sample. An example of an infrared absorption spectrum is the absorption measurement produced by a Fourier Transform Infrared spectrometer (FTIR), i.e. an FTIR absorption spectrum. In general, infrared light will either be absorbed (i.e., a part of the infrared absorption spectrum), transmitted (i.e., a part of the infrared transmission spectrum), or reflected. Reflected or transmitted spectra of a collected probe light can have a different intensity at each wavelength as compared to the intensity at that wavelength in the probe light source. It is noted that a IR measurements are often plotted showing the amount of transmitted light as an alternative to showing the amount of light absorbed. For the purposes of this definition, IR transmission spectra and IR absorption spectra are considered equivalent as the two data sets as there is a simple relationship between the two measurements.

"Modulating" or "modulation" when referring to radiation incident on a sample refers to changing the infrared laser intensity at a location periodically. Modulating the light beam intensity can be achieved by means of mechanical chopping of the beam, controlled laser pulsing, and/or deflecting the laser beam, for example by a tilting mirror that is driven electrostatically, electromagnetically, with piezo actuators or other means to tilt or deform the mirror, or high speed rotating mirror devices. Modulation can also be accomplished with devices that provide time varying transmission like acousto-optic modulators, electro-optic modulators, photo-elastic modulators, pockel cells, and the like. Modulation can also be accomplished with diffraction effects, for example by diffractive MEMS-based modulators, or by high speed shutters, attenuators, or other mechanisms that change the intensity, angle, and/or phase of the laser intensity incident on the sample.

"Demodulate" or "demodulation" refers to extracting an information-bearing signal from an overall signal, usually, but not necessarily at a specific frequency. For example, in this application, the collected probe light collected at a photo detector represents an overall signal. The demodulation process picks out the portion that is being perturbed by infrared light absorbed by the sample. Demodulation can be accomplished by a lock-in amplifier, a fast Fourier transform (FFT), a calculation of a discrete Fourier component at a desired frequency, a resonant amplifier, a narrow band bandpass filter, or any other technique that largely enhances the signal of interest while suppressing background and noise signals that are not in sync with the modulation. A "demodulator" refers to a device or system that performs demodulation.

An "analyzer/controller" refers to a system to facilitate data acquisition and control of the PTP system. The controller may be a single integrated electronic enclosure or may comprise multiple distributed elements. The control elements may provide control for positioning and/or scanning of the probe tip and/or sample. They may also collect data about the probe deflection, motion or other response, provide control over the radiation source power, polarization, steering, focus and/or other functions. The control elements etc. may include a computer program method or a digital logic method and may be implemented using any combination of a variety of computing devices (computers, Personal Electronic Devices), analog and/or digital discrete circuit components (transistors, resistors, capacitors, inductors, diodes, etc.), programmable logic, microprocessors, microcontrollers, application-specific integrated circuits, or other circuit elements. A memory configured to store computer programs may be implemented along with discrete circuit components to carry out one or more of the processes described herein.

A "lock-in amplifier" is one example of a "demodulator" (defined above) and is a device, system, and/or an algorithm that demodulates the response of a system at one of more reference frequencies. Lock-in amplifiers may be electronic assemblies that comprise analog electronics, digital electronics, and combinations of the two. They may also be computational algorithms implemented on digital electronic devices like microprocessors, field programmable gate arrays (FPGAs), digital signal processors, and personal computers. A lock-in amplifier can produce signals indicative of various metrics of an oscillatory system, including amplitude, phase, in phase (X) and quadrature (Y) components or any combination of the above. The lock-in amplifier in this context can also produce such measurements at both the reference frequencies, higher harmonics of the reference frequencies, and/or sideband frequencies of the reference frequencies.

A "detector" in the context of the probe light beam, refers to an optical detector that produces a signal indicative of the amount light incident on the detector. The detector can be any of a large variety of optical detectors, including but not limited to a silicon PIN photodiode, a gallium phosphide photodetector, other semiconducting detectors, an avalanche photodiode, a photomultiplier tube, pyrometer, bolometer, and/or other detector technologies that produce a signal indicative of the amount of light incident on the detector surface. The detector can also be fluorometers and/or Raman spectrometers. "Narrowband Light source" a light source with a narrow bandwidth or linewidth, for example a light of linewidth smaller than 8 cm-1, but in general it can be a light source with a linewidth narrow enough that the linewidth does not cover a spectral range of interest of the sample.

"Raman" refers light that is inelastically scattered from a sample at one or more wavelengths that are different from the excitation wavelength due to Raman scattering. "Raman spectroscopy" refers to measuring the spectroscopic content (Raman spectra) of Raman scattered light, for example the intensity of Raman scattered light as a function of Raman shift. "Raman spectrometer" is a device for examining Raman shifts in light collected from a sample and producing Raman spectra and/or Raman images.

"Fluorescence" refers to the emission of light from a sample at one wavelength due to excitation at another wavelength due to fluorescent excitation and emission processes.

"Mass spectrometer" refers to an apparatus for analyzing the molecular mass distribution of an analyte.

"Confocal microscopy" refers to a form of optical microscopy in which the light collected at a detector is confined to light that passes through a small volume within the 3D focus volume of an optical objective on a sample. Confocal microscopy is often performed by placing a "confocal aperture" at a focal plane that is equivalent with the focal plane of the sample, thus blocking stray light that does not pass through the focus volume on the sample.

"Vacuum Analytical Techniques" to any number of materials characterization techniques commonly or exclusively performed in vacuum, including, but not limited to: scanning electron microscopy (SEM), transmission electron microscopy (TEM), x-ray diffraction (XRD), energy dispersive X-ray spectroscopy (EDS), time of flight mass spectrometry (TOF-SIMS), mass spectrometry (MS), and atomic force microscope-based mass spectrometry (AFM-MS).

"Diffraction Limit" of a light beam means the minimum separation of two optical sources that can be distinguished by a detector. The Abbe diffraction limit d for a microscope having a numerical aperture NA and operating at a wavelength $\lambda$ is defined as $d=\lambda/(2 \cdot NA)$. Physical restraints on the numerical aperture of a microscope prohibit very large numerical apertures, and therefore the diffraction limit of a microscope depends strongly upon the operating wavelength used for detection, with large wavelengths corresponding to relatively poor resolution and high wavelengths corresponding to increased precision.

The terms "about" or "approximate" and the like are synonymous and are used to indicate that the value modified by the term has an understood range associated with it, where the range can be ±20%, ±15%, ±10%, ±5%, or ±1%.

The term "substantially" is used to indicate that a result (e.g., measurement value) is close to a targeted value, where close can mean, for example, the result is within 80% of the value, within 90% of the value, within 95% of the value, or within 99% of the value.

BRIEF DESCRIPTION OF THE DRAWINGS

Aspects and advantages of the embodiments provided herein are described with reference to the following detailed description in conjunction with the accompanying drawings. Throughout the drawings, reference numbers may be re-used to indicate correspondence between referenced elements. The drawings are provided to illustrate example embodiments described herein and are not intended to limit the scope of the disclosure.

FIGS. 17A, 17B, and 17C are simplified schematic diagrams of a system for mapping sample height according to an embodiment.

FIG. 18A is a simplified schematic diagram of a topographical mapping system according to an embodiment, and FIGS. 18B and 18C are diagrams of topography measured by the topographical mapping system of FIG. 18A.

DETAILED DESCRIPTION OF ILLUSTRATIVE EMBODIMENTS

Dual-Beam Imaging and Spectroscopy

Figure 1:
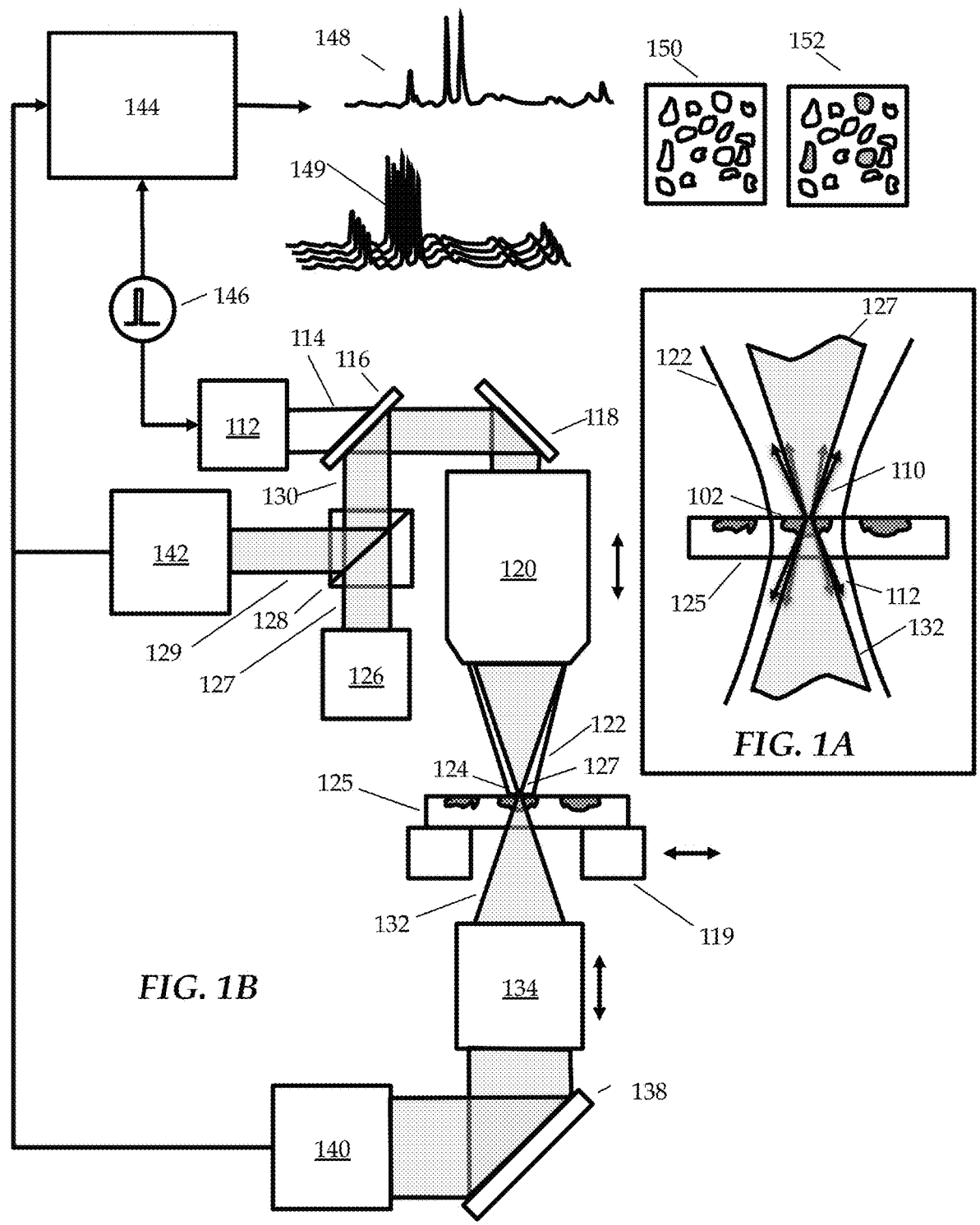
FIGS. 1A and 1B are simplified schematic diagrams of an embodiments including capability to perform measurements of heating beam absorption, fluorescence, and Raman spectroscopy.

The current disclosure is directed towards obtaining measurements of optical properties with a dual-beam system. The dual-beam system includes at least one heating beam, and at least one sensing beam. The two beams are directed towards a sample of material and data corresponding to that sample is collected at a resolution that is smaller than the diffraction limit of the heating beam. In embodiments, infrared absorption spectrum of a sample can be sensed with submicron scale resolution, and in some embodiments additional, complementary measurement techniques can also be used simultaneously or in parallel. FIG. 1A shows a simplified conceptual diagram of a principle of high resolution photo-thermal detection of infrared absorption. An infrared (IR) heating beam 122 is directed at a region of interest 102 of a sample 125. If the IR light beam is tuned to a wavelength where the sample absorbs IR light, for example associated with a molecular absorption band in the sample, then IR absorbing regions of the sample will heat up. This photo-thermal heating can result in both thermal expansion of the sample and/or a change in the index of refraction of the IR absorbing/heated regions of the sample.

These photo-thermal distortions in the sample can then be probed by separate probe beam 127 configured for sensing other characteristics of the sample, generally with a shorter wavelength than the IR beam. The use of a shorter wavelength probe beam allows the probe beam to be focused to a smaller diffraction-limited spot than the IR beam. The degree of IR absorption can be sensed by measuring changes in the trajectory of the probe beam 127 that is reflected and/or scattered from the surface (schematically indicated by arrows 110), and/or by probe light 132 that is transmitted through the sample. Specifically, when the probe beam is focused onto a region that is absorbing IR radiation, the probe beam can be affected by so called thermal lensing or other effects to modify the intensity, phase, and/or angular distribution of the probe beam after interacting with the sample. As shown schematically in FIG. 1A, for example the angular distribution of the probe beam can be modulated (indicated by arrows 110 and 112) as the sample is periodically heated and cooled via absorption of pulses of IR radiation. Thus by measuring changes to the probe beam as a function of IR radiation incident on the sample, it is possible to measure the IR absorption properties of a sample, even down to sub-micron spatial resolution.

In alternative embodiments, other wavelengths could be used for the heating beam, such in addition to or in lieu of infrared. Additionally or alternatively, one or more of the heating IR beam 122 and the sensing probe beam 127 could be reflected from the surface of the sample 125, rather than being transmitted through the sample. These and other variations are described in more detail with respect to other embodiments below.

FIG. 1B shows a simplified schematic diagram of an embodiment employing the detection mechanism outlined in FIG. 1A. A heating beam source 112 emits a beam of heating radiation 114 towards a beam combiner 116 and then towards optional mirror 118 and then to focusing optic 120 which focuses the beam of heating radiation 122 to a region of interest 124 of a sample 125. The heating source 112 may be a tunable narrowband infrared (IR) source (e.g., an infrared laser or a broadband source). Focusing optic 120 can be a single reflective optic, for example a parabolic mirror or spherical mirror, any combination of reflective optics, for example a reflective IR objective employing a Schwarzchild design (also called Cassegrain) or related design. It may also be a purely refracting objective capable of focusing IR and visible light simultaneously.

The sensing probe beam mentioned previously will be focused to a spot that overlaps with the focused IR spot on the region of interest 124 of the sample 125. A sensing or probe beam source 126 emits a probe beam 127 towards optional beamsplitter 128. Probe light 130 passing through the beamsplitter impinges on beam combiner 116 which then directs the probe beam onto a path that is substantially collinear and/or parallel with the heating radiation beam 114. In the configuration shown, beam combiner 116 is substantially transmissive to infrared light and substantially reflective to the wavelength of the probe light beam 130. In an alternate embodiment, the beam combiner can be used in an IR reflecting configuration where the relative positions of the heating source 112 and sensing beam source 126 are reversed (i.e., the IR heating beam is reflected by the beam combiner 116 and the probe beam is transmitted through the beam combiner 116). In the first configuration, the beam combiner may be for example a longpass IR filter, for example as supplied by Edmund Optics. ISP Optics supplies metal film dichroic filters that are also designed to selectively reflect IR and transmit visible light or vice versa. Probe beam source 126 generally emits a probe beam that comprises at least one wavelength that is shorter than the IR wavelength(s) emitted by IR source 112. In this embodiment the focus spot size of the probe beam as focused by focusing optic 120 can be substantially smaller than the smallest achievable focused spot from the heating beam, due to the difference in diffraction limit as between those beams. For example, if the IR source emits radiation at 10 μm and the probe beam is selected to have a center wavelength of 405 nm, the probe beam can achieve a spatial resolution improvement (10/0.405)=24.6, i.e. almost 25× better spatial resolution.

To detect the IR absorption with this improved spatial resolution, embodiments described herein sense the changes in the probe beam associated with the absorption of heating radiation. The probe beam is collected after it has been reflected, transmitted or otherwise scattered from the sample. In the embodiment in which transmitted/forward scattered light is being sensed, the probe light 132 that passes through the sample region 102—along with any light emitted from the sample due to the probe light illumination—can be collected by collection optic 134. The sample may emit or fluoresce light and/or Raman scattered light due to the probe excitation. For the purposes of this application, "collected probe light" can refer to light of all wavelengths that are re-emitted from the sample after excitation by the probe light beam and after interaction with the sample. As such, the sensed light can include light at the probe beam center wavelength as well as light that is wavelength shifted due to fluorescence, Raman scattering, or other optical processes.

The collected probe light can then be directed towards receiver module 140, optionally being redirected and/or steered by optional mirror 138. In one embodiment, collection element 134 can be a high numerical aperture condenser lens, for example an optical microscope condenser, or a collection optic made for example by a high NA molded asphere, for example sold by Thorlabs. The collection optic can also be a reflective element, for example a spherical, aspherical, or parabolic mirror. The collection optic is shown collinear with the incident beam, but in alternative embodiments it can also be mounted off axis to capture light that is scattered over wider angles.

Receiver module 140 can comprise one or more detectors and/or spectrometers. For example, receiver module 140 can contain be any of a large variety of optical detectors as described in the definitions section, depending on the wavelength and intensity of probe light and the bandwidth desired for a specific measurement.

The apparatus can also include additional filters, detectors, and spectrometers to enable simultaneous or sequential Raman spectroscopy and/or fluorescence measurements. In these embodiments, one or more optional fluorescence and/or Raman filters can be installed to substantially block light at the probe light source center wavelength and pass light that is wavelength shifted from the probe wavelength. This approach allows detection of inelastically scattered light, including but not limited to Raman and fluorescently shifted light. Additional optional detectors can be used to detect and/or spectrally analyze the wavelength shifted light. Specifically, a Raman spectrometer can be used to measure Raman spectra from light that emanates from the tip-sample region due to the excitation by the probe light beam. The receiver module can be free space coupled and/or can have one or more elements that are fiber coupled. For example, the collected probe light may be coupled into an optical fiber and then transmitted to a fiber coupled Raman spectrometer.

Samples may also be measured in a reflection/backscatter configuration. In this embodiment, probe light returning from the sample can be collected by the same optic 120 that was used to focus the incident light. In this embodiment probe light that is reflected and/or scattered from the sample can be collected by objective 120 and returned along the incidence path, reflecting off optional mirror 118, reflecting off beam combiner 116 back to beam splitter 128. A portion 129 of the returning probe beam will be reflected to a receiver module 142. In some configurations, it is possible for receiver modules 142 and 140 to be the same module. In one embodiment, at least a portion of the receiver module can be moved from one location to the other, for example on self-aligning mounts.

Alternatively the receiver module may be broken up into two or more separate components, for example a fiber coupling component and a detector/spectrometer component. In this embodiment, fiber coupling components can be placed at the positions shown for receiver modules 142 and 140 and the fibers can be routed into a single remote detector/spectrometer module, thus eliminating the need for duplicate detectors/spectrometers. Although both a transmitted light path 132 and a reflected/scattered light path 129 are shown, either one alone could be employed as well. The embodiment shown employs an optical arrangement where the IR beam and probe beam are focused by the same focusing element 120, (e.g., via a Schwarzchild objective). It is also possible to counter-propagate the IR and probe beams, as described in "Super-resolution imaging with mid-IR photo-thermal microscopy on the single particle level" by Cheng et al, SPIE Proceedings Vol. 9549 954912-1 2015, which is hereby incorporated by reference, in order to, for example, deliver the IR beam with focusing element 120 and deliver the probe beam via a probe focusing optic in the position of 134, or vice versa. As discussed previously, the probe beam can be collected in either reflection and/or transmission, depending on the optical transmission of the probe beam wavelength for the sample of interest. It is also possible to deliver both the IR and visible light from the same side of the sample, for example using one or more focusing objectives inclined relative to the surface, as shown in incorporated reference Ser. No. 62/427,671.

The signal(s) from one or both receiver modules may be amplified using current and/or voltage amplifiers and then sent to analyzing electronics, for example a demodulator or lock-in amplifier. The output of heating beam source 112 can be modulated and/or pulsed using an internal or external pulse control 146. In one embodiment, pulse control 146 can be used to trigger a pulse emission from a pulsed IR laser source or may be used to control an external modulator, for example a high-speed chopper or other beam modulator. Pulse control 146 can send a trigger or synch pulse to analyzing electronics 144 to act as a synchronizing reference. The IR laser is preferentially modulated and/or pulsed at a frequency ranging from the kHz to MHz regime or higher. The analyzing electronics then demodulate a strength of the variation of the detector signal synchronized to the pulse control 146. In embodiments, pulse control can be generated by the analyzing electronics and used to control the heating beam modulation, and can also act as an internal demodulation reference as described in more detail below.

Because the collected probe beam signal is demodulated at a frequency corresponding to the modulation of the IR beam, the demodulation signal can be indicative of the degree of deviation of the probe beam induced by the absorption of the IR beam at the sample. That is, the demodulation signal is indicative of the IR absorption by the sample region where the probe beam is focused. As such the demodulation signal can be used to map IR or other heating beam absorption of the sample on spatial resolution scales smaller than the diffraction limit of the IR beam.

The demodulation signal can be measured at a plurality of wavelengths (or equivalently wavenumbers) corresponding to the heating beam source to obtain a signal 148 that is indicative of an infrared absorption spectrum of the region 124 of the sample 125. These absorption spectra can be measured at a plurality of locations on the sample 125 translating the sample relative to the focused IR and probe beams, for example by moving the sample with sample stage 119, or by translating the objective 120, and/or by steering the IR and/or probe beams, for example with beam steering mirrors described in FIG. 2, or separate beam steering mirrors after the beam combination optics. For example, mirror 118 or similar can be used to steer both the IR and probe beams after beam combination. In certain embodiments, additional scan lenses or other optics may be desirable. By measuring a spectrum 148 at a plurality of locations produces a family of spectra 149 that can represent the chemical/spectroscopic variation in the sample. The spectra can be analyzed to produce chemical images 150 that show the distribution of different chemical species in the sample. Chemical image 150 can also be obtained by mapping the demodulation signal at a fixed wavelength/wavenumber over a plurality of points on the sample. For example, the IR source can be tuned to a wavelength where at least one chemical component in the sample absorbs. Creating a map of the demodulation signal at this fixed wavelength as a function of position on the sample can create a map of the distribution of the absorbing component. Chemical image 150 can be created by tuning the IR source to a single wavelength and scanning over a plurality of locations of the sample and/or by measure IR absorption spectra at a plurality of positions on the sample and then analyzing the absorption at a single wavelength or over a range of wavelengths. Additional chemometric and multivariate analysis techniques can be applied to the family of sensed spectra to produce alternate compositional maps/chemical images.

One advantage of the various embodiments is that IR, Raman, and fluorescence measurements can all be sensed by collection of a single probe beam. As such it is possible to simultaneously or sequentially collect multiple chemical image maps 150 and 152, for example one map 150 being an image of IR absorption and the other map 152 being a Raman or fluorescence response image. This PTP apparatus makes it possible to obtain simultaneous or sequential measurements of IR absorption, Raman scattering, and/or fluorescence over the same region of the sample (or overlapping regions of the sample) for the purposes of correlative measurements. Furthermore, the measurements described above are performed in a non-contact mode, and it is not necessary for any physical probe or crystal to create a mechanical contact with the top surface of sample 125. This facilitates rapid, precise measurements that are non-contact and accordingly non-destructive.

Spatial Resolution.

The spatial resolution that can be achieved can be set by one or more of (1) the size of the probe beam; (2) the area of overlap of the IR and visible beams; (3) the frequency of modulation of the IR beam. When the modulation frequency of the IR beam is high enough such that the thermal diffusion length is much smaller than the spot size of the probe beam, then the spatial resolution can be much smaller than the IR beam spot size. The Abbe spatial resolution limit R is defined as $\lambda/2NA$ as described above, assuming a perfect Gaussian beam and no aberrations in the focusing optics. For example, using a 405 nm wavelength probe beam to read out the IR absorption using an NA of 0.78, this leads to an achievable spatial resolution with the probe beam of 260 nm. By comparison, the same diffraction limit at a wavelength of 10 μm in the mid-IR would give a diffraction limited resolution of 6.4 μm, almost 25× coarser. As such the IR absorption profile of the sample can be probed on much smaller length scales than the spatial resolution limit that would otherwise be constrained by the focus spot size of the IR beam. Even better spatial resolution can be achieved for example by using ultraviolet radiation for the probe beam. In practice, it is possible to achieve spatial resolution of less than 1000 nm, less than 500 nm, and less than 200 nm, in embodiments. Using schemes to control the overlap of the IR and probe beams to less than the diameter of the probe beam can be used to achieve spatial resolution better than the diffraction limit of the probe beam, for example less than 100 nm. It is also possible to follow PTP measurements with atomic force microscopy based IR spectroscopy (AFM-IR) and/or scanning scattering near-field optical microscopy to achieve measurements of IR absorption and/or scattering with a spatial resolution down to the scale of 10 nm or less.

Figure 2:
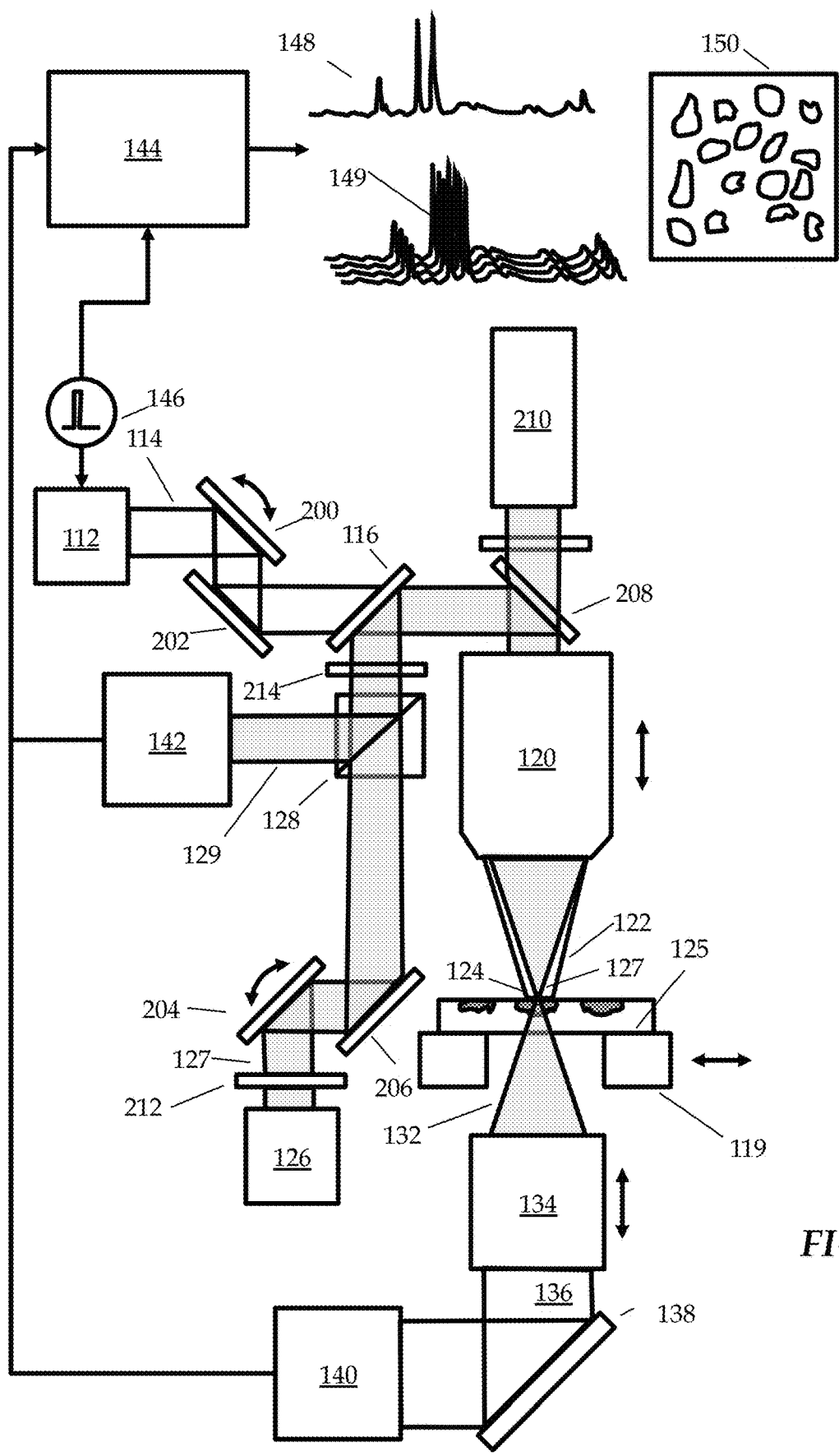
FIG. 2 is a simplified schematic diagram of an embodiment including beam steering.

FIG. 2 shows an alternative embodiment of the apparatus in FIG. 1B, and further depicts optional features configured to increase the functionality of the apparatus. The majority of figure labels are the same as FIG. 1B and the associated description generally applies. The discussion of this figure focuses primarily on the additional features.

As in FIG. 1B, an infrared source 112 emits a beam of infrared radiation 114. In this embodiment, optionally the IR heating beam is directed towards two optional mirrors 200 and 202, either or both of which can be steering mirrors. These steering can be used to compensate for wavelength dependent variations in the beam angle of the IR source 112, can be used to compensate for other deviations of the IR beam, for example due to temperature or other system variations. One or more steering mirrors 200 and 202 can also be used to align the IR beam to the sensing or probe beam 127 and/or align the IR heating beam relative to focusing objective 112, also discussed below. Beam steering mirrors may be fast steering mirrors, for example actuated by voice coils, electrostatic drives, and/or piezo elements, for example, or may be single or multi-axis galvo mirrors, MEMS-based mirrors or other devices that steer a beam in response to an external control signal. After passing the optional steering mirrors, the IR heating beam may be directed towards beam combiner 116 and focused on the sample as described above for FIG. 1B.

Turning now to the sensing or probe beam, a probe beam source 126 emits a probe light beam 127 as in FIG. 1B. Optional beam steering mirrors 204 and 206 can be used in a way analogous to beam steering mirrors 200 and 202 described previously. In addition these mirror can be used to adjust the position of the probe beam focused spot relative to the IR beam focused spot, as described associated with FIG. 5. This feature can be used to accomplish three separate tasks: (1) centering the probe beam at the point of maximum intensity of the IR spot to maximize the sensitivity of the measurement of IR absorption; (2) scanning the probe beam over a plurality of position in the probe beam to measure the IR absorption response at a plurality of position on the sample; (3) controlling the degree of overlap of the IR and probe beams for example to improve the spatial resolution of the measurement beyond even the diffraction limit of the probe beam. Each of these will be discussed in more detail associated with FIG. 4.

The probe beam optical path can also include additional optional optical elements for example half wave plate 212 and quarter waveplate 214 to increase the efficiency of illumination of the sample with the probe beam and detection of the deviation in the probe beam reflected from the sample. This can be achieved by the use of a polarizing beamsplitter for beamsplitter element 128. The half wave plate 212 can be used to rotate the probe beam polarization to maximize the transmission through polarizing beamsplitter 128. Quarter waveplate 214 can be used to rotate the polarization of the reflected probe beam by 90 degrees relative to the incident probe beam. This allows the beamsplitter 128 to selectively reflect the returning probe beam towards received 142 with minimal optical losses.

The apparatus may also incorporate an illumination system and camera 210 to visualize the sample and if desired one or more of the optical spots from the IR and/or probe beam. In this embodiment, mirror 118 of FIG. 1B is replaced with either a removable mirror, rotatable mirror, and/or dichroic mirror. In this embodiment, light from the illuminator/camera module can pass through focusing optic 120 to illuminate sample 125 and scattered/reflected light can be collected by optic 120 and returned to the illuminator camera module 210 to produce optical images of the sample. Mirror 208 can be under computer control to automatically switch in and out as needed. Alternately the sample can be illuminated in transmission from below via optic 134 or the sample can be illuminated above and the camera can be placed under the sample. The camera 210 can also be used to record laser speckle resulting from probe light scattered from the sample. This speckle pattern can be especially useful for recording the photo-thermal response of rough samples under IR absorption, for example as described by Sullenberger et al (DOI: 10.1364/OL.42.000203), which is hereby incorporated by reference. A speckle pattern is the result of the interference of light reflected from many small asperities of a rough sample with random phases. As the sample heats up due to IR absorption changing the local index of refraction and/or free surface shape, the speckle pattern can readily change due to optical phase changes from the index of refraction and or surface deformation. The camera for example can be used to identify pixels where the speckle intensity changes as a function the incident IR radiation. For example, it is possible to bin the signal from camera pixels that have a high speckle intensity and calculate the variation in intensity and/or position as a rate synchronized to the modulation/pulsing of the IR source.

Figure 3:
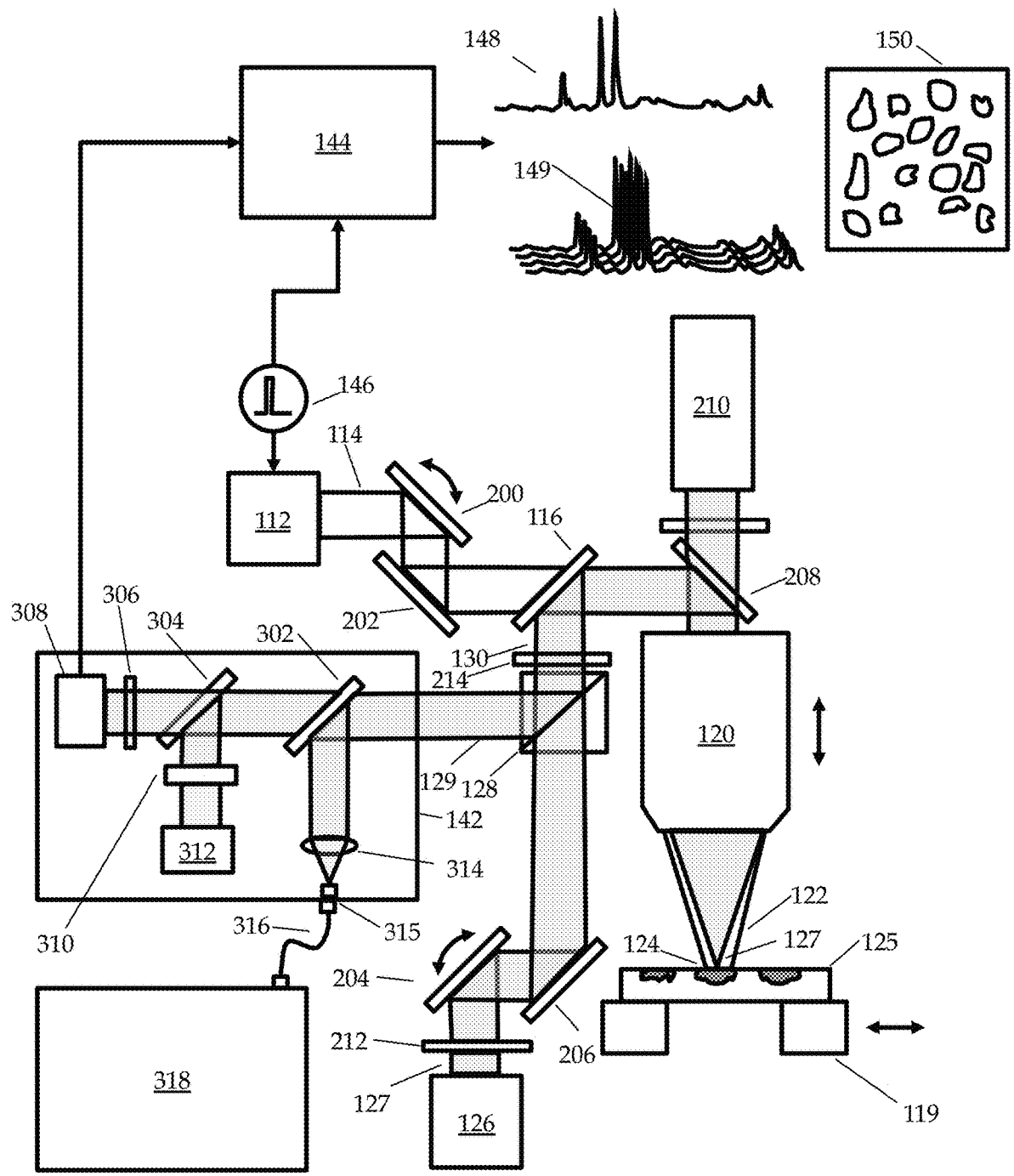
FIG. 3 is a simplified schematic diagram of an embodiment including additional details of the receiver module.

FIG. 3 is a simplified schematic diagram of an embodiment of the current apparatus showing further optional features. FIG. 3 has many common features with FIG. 1B and FIG. 2. As such the same label numbers are used in FIG. 3 for common features and the associated descriptions apply as appropriate. In FIG. 3, receiver 142 from FIG. 1B is shown in more detail comprising elements (including elements 302 to 312) to both improve the sensitivity and to perform multiple simultaneous imaging and spectroscopic modes, including for example IR spectroscopy, fluorescence imaging, and/or Raman microscopy/spectroscopy. For simplicity, FIG. 3 shows only a reflection configuration, but the following discussion can apply equivalently for a receiver module position to collected transmitted probe radiation, for example element 140 in FIG. 1B and FIG. 2.

As with FIG. 2, light reflected/back scattered from the sample is collected by optic 120, returned along the incident beam path and directed via beamsplitter 128 to the receiver module 142. Receiver module 142 can comprise multiple detectors, mirrors, spectrometers, filters, etc. as needed to direct the probe beam 129 to one of more sensor units. For example, a flipper mirror, rotatable mirror, removable mirror, or dichroic mirror 302 can direct probe light to a focusing lens 314 where the light can be focused into an optical fiber coupler 315. From the fiber coupler 315 the light can be directed via optical fiber 316 to any external/remote sensor or spectrometer 318, which can comprise for example a Raman spectrometer. The Raman spectrometer can also be coupled by a free space beam and can be located entirely within or directly attached to receiver 142. If mirror 302 is rotated or otherwise removed from the beam path, probe light can pass onto other sensors, detectors, and/or spectrometers. For example, mirror 304 can reflect light to an optical detector 312 to be used for fluorescence measurements. Mirror 304 can be a rotatable/removable mirror as described for mirror 302 or it can be a dichroic mirror selected to reflect light of the fluorescent wavelength of interest. Optional filter 310 can also or instead be used to select the fluorescent wavelength. Again, both optical paths are shown, but any combination of these additional paths may be employed.

For measurements of IR absorption, the collected probe light can also be directed to a detector 308 that is selected to be highly sensitive to the probe light wavelength. In this embodiment, the detector signal may be amplified and routed to analyzing electronics 144 as described with respect to FIG. 1B and FIG. 2 to create measurements of IR absorption via detection of modulation of the probe beams angle, size and/or intensity.

To increase the sensitivity, it may be desirable to include a beam shaping element 306. This element may be a manual or motorized iris for example that clips a portion of the collected probe beam. In this embodiment, as the angular distribution of the probe beam changes in response to the IR absorption of the sample, the angular distribution change will result in an amplitude modulation of the beam. The beam shaping element can alternately or additionally include a central obscuration that blocks the center part of the beam. The reason for this is that the photo-thermal distortion of the probe beam can affect the extreme rays the most. So blocking the central rays with an obscuration can block light from hitting the detector that does not contribute significantly to the demodulation signal. Blocking central rays or otherwise selecting a smaller portion of the probe beam the detector can allow the detector amplifier electronics to be operated at higher gain and/or longer integration times before saturating. Alternately there can be an additional lens in the collection arm that focuses beam 129 to a spot either at or before the probe light detector 308.

In one embodiment, the additional lens focuses the beam to a post before the detector, and a pinhole may be placed at the focused spot to block light that is scattered or reflected from regions outside the sample focal plane. Probe light detector 308 can be a detector that measures the relative intensity of the beam incident on it, for example a conventional photodiode, an avalanche photodiode, photomultiplier tube, and/or other detector that produces a signal that a signal indicative of an intensity of the light incident on the detector. Alternately, the detector 308 can be a position sensitive detector, for example a linear photodiode, a dual or quad segment detector or a multi-detector array. In this embodiment, the detector can also be sensitive to positional shifts in the reflected/scattered beam, for example due to angular deviations in the beam and/or lateral shifts. Alternately detector 308 may comprise a phase sensitive detector, comprising further an interferometric detection scheme that produces a signal indicative of the optical phase or optical phase shift of the beam incident on the detector. In these embodiments, the system can measure the change in intensity, beam angle and/or optical retardation induced by a temperature change in the sample due to the interaction or absorption of infrared light by the sample. Detector 308 may also be an array detector and/or a camera that is sensitive to light at the probe wavelength. In this embodiment, the array detector/camera may be used to track the deviations in intensity and/or position of light reflected or scattered from the sample, including the analysis of speckle as described in the description of FIG. 2.

The receiver can comprise a camera and/or an array detector. The use of a camera and/or array detector can provide a substantial improvement in measurement throughput by enabling parallel measurements of multiple locations on the sample simultaneously. To achieve high spatial resolution, it may be desirable to use a camera or array detector that has a fast response time, or equivalently a high measurement bandwidth. A reason for this is that as IR light or another heating beam is absorbed by the sample, the absorbed heat can diffuse away from the absorbing region, causing a reduction in the spatial resolution. To maintain high spatial resolution, it can be desirable to employ IR laser sources with high repetition rates and detectors with high bandwidths that enable measurements off the probe light on timescales shorter than the thermal diffusion time for a desired spatial resolution.

The thermal diffusion time constant $\tau$ is given by the equation:

$$\tau = 2\pi\mu^2/\alpha$$

where $\mu$ is the thermal diffusion length and $\alpha$ is the thermal diffusivity. One limit on spatial resolution is set by the thermal diffusion length $\mu$. To achieve a specific spatial resolution, it is desirable to keep the thermal diffusion length $\mu$ smaller than the target spatial resolution. Then, the probe light responses are read on timescales that are shorter than the thermal diffusion time constant $\tau$. So, for example, using a thermal diffusivity of $1.35 \times 10^{-7}$ m$^2$/sec (a typical value for polymeric materials), and a desired spatial resolution of 500 nm, the thermal diffusion time constant $\tau$ is $1.17 \times 10^{-5}$ sec, and for 200 nm, $\tau$ is $1.87 \times 10^{-6}$ sec. In certain embodiments, probe light is sampled on time scales at these times or shorter to achieve spatial resolutions comparable to the spatial resolution achievable with the focused spot size of the probe beam.

In some embodiments, it may be desirable to use cameras and/or array detectors that are capable of fast response/readout time. A few of the specific desirable characteristics for such cameras/array detectors are:

a) Fast Response times on the order of high repetition rate lasers. For instance, in one embodiment, the IR laser used has a repetition rate of up to 1 MHz and these rates could go up in the future.

b) Can respond to a trigger signal which leads to a gate length of camera exposure that can be on for time durations less than the thermal diffusion time constants mentioned above.

c) Can collect a separate background signal (either before the experiment or in real time between each signal collection pulse) and mathematically process the signal and background signals to create a background corrected signal.

d) Can co-add the signals corresponding to each laser pulse to achieve the desired Signal level for the experiment.

There are a number of cameras and detectors that can be suitable for high bandwidth detection. Researchers at the Non-Equilibrium Thermodynamics Laboratory at Ohio State University and their collaborators have demonstrated MHz frame rate camera detection with high repetition rate laser sources. (See for example N. Jiang, W. Lempert, G. Switzer, T. R Meyer and J. R. Gord, "Narrow-Linewidth Megahertz-Repetition-Rate Optical Parametric Oscillator for High-Speed Flow and Combustion Diagnostics", Applied Optics, vol. 47, No. 1, pp. 64-71, 2008.) Princeton Instruments, for example makes high speed, high sensitivity cameras for spectroscopy and imaging. The Pixis cameras can operate at sampling speeds of 100 kHz and 2 MHz in a variety of pixel configurations. Princeton Instruments' PiMax4 cameras are optimized for high repetition rate laser spectroscopy and can operate at repetition rates of up to 1 MHz and can use a trigger with a gate length adjustable from 500 ps onwards. These cameras can collect signals in 2 separate buffers that can each be triggered separately and co-added separately (or mathematically processed relative to each other via a subtraction or division or other mathematical function). Teledyne Dalsa makes a line array camera with 100 kHz/200 kHz line rates. Horiba similarly makes CCD array cameras readout rates in the range from ~10 kHz to 3 MHz. It is also possible to use linear arrays of UV/visible light detectors. Hamamatsu, OSI, and other vendors make linear arrays for example in 16, 46, and 76 elements. These detectors have high optical responsivity enabling sensitive detection and have low capacitance for high speed readout in the range from 10 s of kHz to MHz or higher.

In either embodiment, light signals from the array/camera elements can be digitized and analyzed. In one embodiment, the probe light signals from the array/camera elements can be demodulated at a frequency corresponding to the laser repetition rate or a harmonic thereof. This demodulation can be performed by a lock-in amplifier, a series of parallel lock-in amplifiers, and/or their digital equivalent. For example, the demodulation can be performed by computation in a computer, digital signal processor, field programmable gate array, or any combination thereof or other suitable digital computation means. It can also be desirable to perform time-domain analysis, for example comparing the signal strength at a time window after the start of the IR laser pulse to the signal strength during a time where the laser pulse is off. For high spatial resolution, it can be desirable to sample the camera/array detector on timescales similar to, or shorter than, the thermal diffusion time described above. In some embodiments, this may involve examining the probe light response at early times after the IR laser pulse and before thermal diffusion has had the opportunity to degrade the spatial resolution.

With an appropriate high acquisition speed camera, a variety of techniques may be accomplished with a photo-thermal imaging system. Using optics of the appropriate magnification a desired region of the sample at the probe laser wavelength may be imaged onto a 2D pixel array a camera. Using a pulsed tunable IR laser a desired sample region, maybe illuminated, possibly at a number of different of illumination wavelengths, one wavelength at a time. A broadband source could also be used.

A sensing beam (also referred to as a probe beam) can be produced by a probe light source that could be any of a variety of devices, including laser or LED sources, in combination with the source of the heating beam. The reflected light from the source of the probe beam is imaged onto the camera sensor at a desired magnification. The probe illumination can be photo-thermally modulated by the absorbance of the heating beam by the sample.

A first trigger signal can be created that is coincident with the IR laser pulse and has a gate that allows camera exposure for a time duration less than the thermal diffusion time constant of the sample being studied. The appropriate delay from the start of the laser pulse to achieve the maximum photo-thermally modulated probe signal on the camera can be determined. This trigger signal (with the appropriate delay) can trigger capture of at least one frame of image data.

A second trigger signal can be created that captures the probe beam that is reflected from the sample in the absence of the heating beam. This corresponds to a background signal and can be captured as second set of correction frames. The trigger signals can have the same gate time but will be timed so that the second trigger occurs during a time of no illumination by the heating beam.

The two sets of frames can be mathematically processed to obtain a background corrected signal. Processing could be a subtraction; division or other mathematical function. The frames processed the background corrected photo-thermal signal may be the actual data frames and correction frames can be applied as many times as needed to get an experimentally desired signal frame. The number of applications of the correction data can be determined experimentally. For instance, increasing the power of the heating beam source and/or the power of the sensing beam source as needed can increase the signal and minimize the number of corrections needed.

In an embodiment in which a source of broadband IR illumination is used, then a Fourier transform of the data will be taken at an appropriate place in the process, similar to the process used in a conventional FTIR microscope with a camera. Sub-diffraction spectroscopy and imaging or any other long wavelength spectroscopy and imaging can be accomplished for IR heating beams or even for other, longer wavelengths.

Because the gate following the trigger signal on a suitable camera can be made as narrow as 500 ps or 0.5 ns, then time resolved spectroscopy may be performed by measuring the spectra at different time scales with the camera.

In photoacoustic spectroscopy, by varying the modulation frequency (or repetition rate) of the incident heating beam illumination, information can be obtained from different depths of the sample, with higher frequencies (or higher repetition rates) giving information from shallower regions and lower frequencies (or lower repetition rates) giving spectra information from deeper in the sample. So, by varying the repetition rate in discrete intervals of 1 KHz, for example, when obtaining the IR spectroscopy and imaging information, subtracting the information from the different repetition rates may be used to obtain IR spectroscopy and imaging information from different slices at different depths. Depth profiling information could also be obtained by compared the delay times that produce a maximum absorbance signal at each wavenumber, as described above.

Signal frames may be acquired using background compensation at multiple delay times after triggering. At the end of the full spectrum data collection at each delay time, determine the delay time at each wavelength which produced the maximum difference signal from the background may be determined. Those wavelengths with longer delay times for maximum difference peak absorbance signal likely originated from deeper in the sample, as there would be a time delay for the photo-thermal response to reach the sample surface.

By studying the variation of the photo-thermal signal intensity across the camera pixel array, the angular dependence may be analyzed of this photo-thermal signal for different heating beam wavelengths and this information may be used to improve the technique sensitivity, for use with a 1 dimension line array detector or also with a single point detector. Because the visible probe laser may be continuous wave, there will usually be a significant background signal even when the pumped IR pulsed source is not illuminating the sample. Use of a large-format, fast acquisition visible camera, will also allow probing of the angular distribution of reflected light containing the modulated IR absorption information from the illuminated area of the sample. In some embodiments, the maximum background compensated signal will occur at specific pixel locations (resulting from different reflection angles). By selecting only these hot spots in binning the pixels, higher signal to noise ratios can be achieved. By adjusting the incidence angle of the visible probe beam, it may be possible to optimize the difference signal amplitude between the unmodulated background and the modulated signal which arises from absorption of the heating beam by the sample.

Optical properties of larger areas of the sample can be measured with a single snapshot. By illuminating a larger area of the sample with both the heating beam and the sensing beam, it is possible to obtain IR transmission-like spectra in a reflection configuration using a fast acquisition camera system. The measurements in this mode may no longer be at sub-diffraction-limited spatial resolutions, but larger areas of the sample can be examined in a single measurement. In some embodiments, all of the pixels in the area could be combined and normalized to produce a single average IR spectrum of an illuminated area of the sample.

A continuous wave source of probe illumination could be set up pass adjacent to the sample surface. The IR pulsed beam would illuminate the sample at much smaller angles of incidence relative to the sample normal. The gas phase molecules in the path of the probe beam will produce a modulated effect when the wavelength of the pump beam is absorbed by the sample. The probe beam modulation could then be detected as a function of angle using either a one-dimensional or two-dimensional fast acquisition visible array camera.

Mirrors 302 and 304 can alternately be beamsplitters that divide the light between multiple sensors allowing simultaneous measurements of IR absorption, Raman scattering, and/or fluorescence intensity. The beamsplitters can also include dichroic coatings to separate the probe light by wavelength. Fluorescently scattered and Raman scattered light will return at a different wavelength than the probe light excitation wavelength. Since IR absorption information is carried by light at a wavelength similar to that of the sensing beam, separating out a minority of light that is scattered at fluorescent or Raman wavelengths has a minimal impact on the PTP sensitivity. As such it is possible to simultaneously measure IR absorption, Raman, and/or fluorescence of the same region of the sample at the same time, and with the same probe excitation beam. In this embodiment, "simultaneously" is meant to convey that both the IR and Raman measurements are performed at substantially the same time, not sequentially. However, the data collection may be performed sequentially as well, even if the collection elements operate in parallel. Specifically, in this embodiment the system does not need to be reconfigured between measurements and that the measurement of the IR response does not block the measurement of the Raman response or vice versa. This feature has an advantage in terms of measurement throughput. For example, if a series of IR and Raman measurements would each take 30 minutes over some specified area in a conventional system, the ability to perform the measurements simultaneously reduces the total test time to 30 minutes, rather than 60 minutes. "Simultaneously" as used in this embodiment does not mean that the IR and Raman data is necessarily sampled at exactly the same microsecond, but instead that the two measurements can be done substantially in parallel.

Figure 4A:
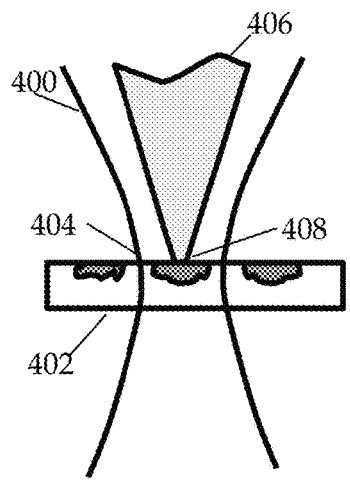
FIGS. 4A-4I are simplified conceptual diagrams of overlap between heating and sensing beams according to an embodiment.

FIGS. 4A-4I show simplified conceptual diagrams illustrating the relative size and overlap between the IR beam and probe beams. In many embodiments, the probe beam will have a shorter wavelength than the IR beam such that it can be focused to a smaller diffraction limited spot than the IR beam. In general, the focused spot of the probe beam will illuminate a region of the sample that comprises smaller subset of the focused IR spot, as illustrated in FIG. 1A and in FIG. 4A. In FIG. 4A, IR beam 400 is focused onto a sample 402. The IR beam comes to a beam waist 404, the narrowest part of the focused beam, at or near a plane of interest in the sample. In this embodiment, it is not necessary that this plane correspond to a surface of the sample; the beam waist may instead be internal to the sample.

Figure 4D:
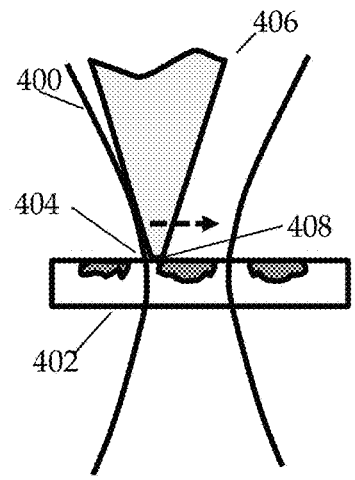
Figure 4G:
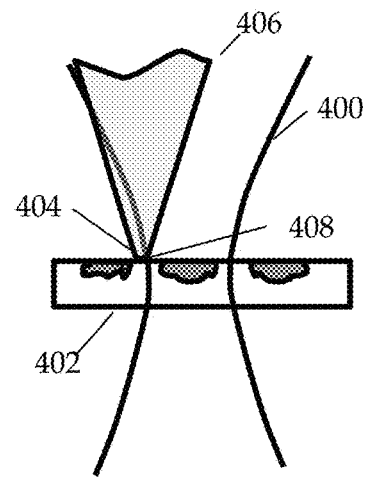
Figure 4B:
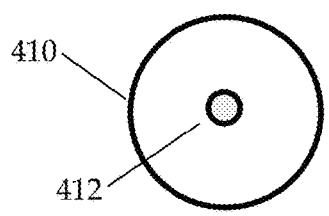
Figure 4E:
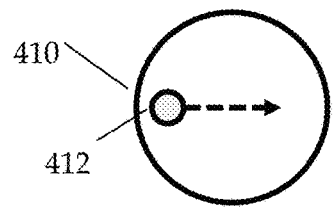
Figure 4H:
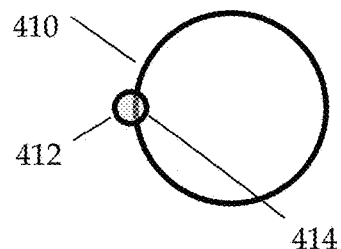
Figure 4C:
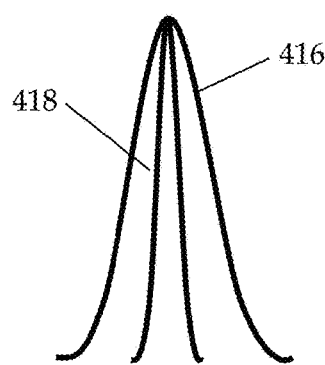

An example of the overlap of the IR and probe beams are shown in cross-section if FIG. 4B when the IR and probe beams are substantially centered. FIG. 4C shows a cross-section through the intensity profiles of the two beams as overlapped in FIGS. 4A and 4B. The intensity of the deviation of the probe beam generally occurs when the intensity peaks of the probe beam and the intensity of the IR beam are substantially overlapped. Beam steering mirrors, for example 200, 202, 204, and 206 in FIGS. 2 and 3 can be used in any combination to achieve the optimal alignment between the IR beam and the probe beam to maximize the sensitivity of the probe beam to IR absorption. This can be done automatically by sweeping the position of one or more of the beams while measuring the demodulation signal and selecting the positions of the steering mirror(s) that substantially maximize the signal strength.

Figure 4F:
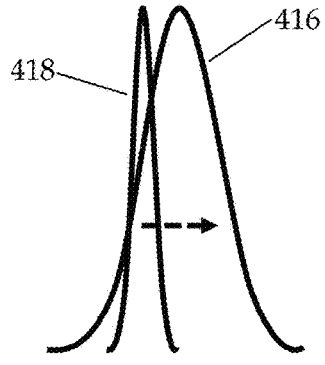
Figure 4I:
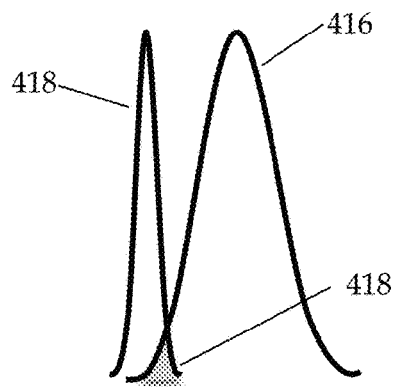

It is also possible to sweep the position of the probe beam 408 relative to the IR beam 400. As indicated in FIG. 4D the focused spot 404 of the probe beam can be swept over a plurality of locations within IR beam waist 404 to map probe beam deviation and hence IR absorption at a plurality of positions on the sample. In this embodiment, the intensity of the IR beam will vary over the focused spot area, so it can be desirable to normalize the measured probe response by the intensity of the IR beam at a given location of the probe beam. FIGS. 4E and 4F show analogous figures to FIGS. 4B and 4C except with the probe beam focused at a plurality of positions, not necessary simply centered with the IR beam. FIG. 4G shows an alternate positioning of the probe beam with respect to the visible beam that can provide spatial resolution even further below that of the diffraction limit of the probe beam. In this embodiment, the probe beam is positioned at a point where the focus spot 404 of the probe beam is not entirely enclosed in the beam waist 404 of the IR beam. As shown in the cross-section image FIG. 4H, this leads to a situation where there is only a partial overlap 414 of the two beams. As there is only a signal at the demodulator when there is both simultaneous absorption of IR by the sample and readout of the absorption by the probe beam, the intentional mis-alignment of these two beams can reduce the spatial resolution to the size of the overlap, not set by the size of the probe beam. In an example discussed earlier, a 405 nm laser can be focused to achieve a diffraction limited resolution of around 260 nm. If this spot is aligned as shown schematically in FIGS. 4G-4I, it is possible to arrange an overlap much smaller than the 260 nm Abbe diffraction limit.

With this approach, it is possible to achieve a spatial resolution of less than 100 nm. Normal Gaussian beams will have a significant drop-off in intensity away from the point of maximal overlap, but this can be tolerable in embodiments where higher spatial resolution is required and sensitivity can be sacrificed. Alternately it is possible to employ optics to shape one or both of the beams into so called "flat-top" beams instead of Gaussian profiles. Even in the embodiment that the beam shaping optics result in larger focused beams, the spatial resolution can still be improved below the conventional diffraction limit by controlling the amount of beam overlap.

Spatial resolution. The spatial resolution that can be achieved can be set by one or more of (1) the size of the probe beam; (2) the area of overlap of the IR and visible beams; (3) the frequency of modulation of the IR beam. When the modulation frequency of the IR beam is high enough such that the thermal diffusion length is much smaller than the spot size of the probe beam, then the spatial resolution can be much smaller than the IR beam spot size. In various embodiments, it is possible to achieve spatial resolution of less than 1000 nm, less than 500 nm, and less than 100 nm.

Figure 5:
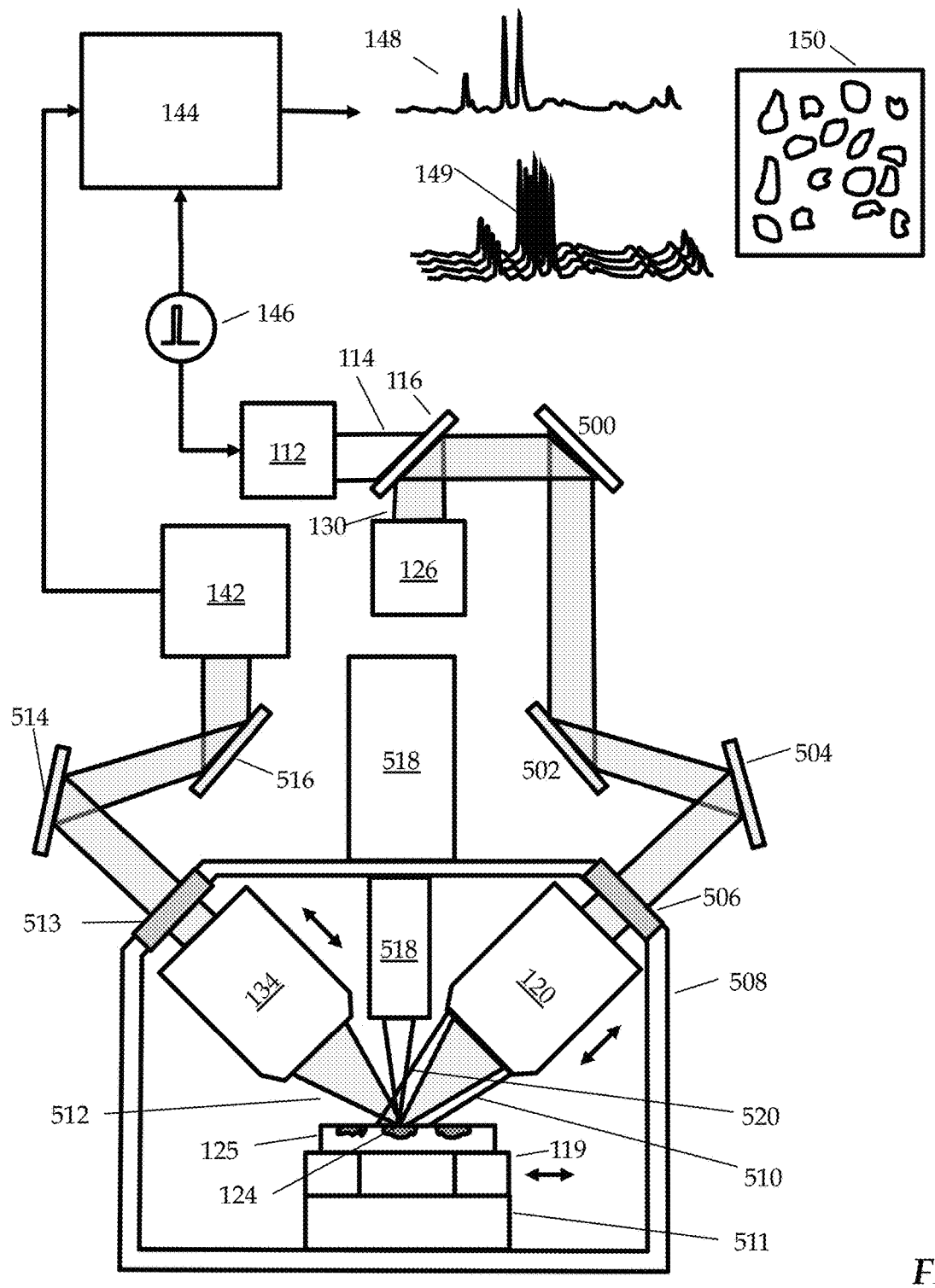
FIGS. 5-7 are simplified schematic diagrams of embodiments within a vacuum enclosure.

FIG. 5 shows a simplified schematic diagram of an embodiment a microscopy and analysis platform employing the photo-thermal detection system described previously, but in this embodiment operating in a vacuum environment. The ability to perform this measurement in vacuum enables the ability to perform analyses by infrared spectroscopy, Raman spectroscopy, and/or fluorescence imaging along with collocated measurements by any number of vacuum analytical techniques, including, but not limited to: scanning electron microscopy (SEM), transmission electron microscopy (TEM), x-ray photoelectron spectroscopy (XPS), x-ray diffraction (XRD), energy dispersive X-ray spectroscopy (EDS), time of flight mass spectrometry (TOF-SIMS), mass spectrometry (MS), and atomic force microscope-based mass spectrometry (AFM-MS), for example. FIG. 5 shares many components with previous diagrams and similar elements share the same numerical labels as previous drawings and associated descriptions apply as appropriate. As before, both heating beam source 112 and a sensing beam source 126 direct a corresponding heating beam 114 and sensing beam 130 on a parallel and overlapping path via optional steering mirrors (not shown in this embodiment) and beam combiner 116. The combined beams may be reflected off additional steering and beam conditioning optics, for example turning mirrors 500, 502, and 504 before impinging on a window 506 in a vacuum chamber 508. The window is selected to be transmissive to both the IR and probe beams over the wavelength range of interest. Note that it may be desirable to have the probe beam parallel to but not collinear with the pump beam so that it can pass through an optional hole in any antireflection coating in the window that is optimized for the IR radiation. Once in the vacuum chamber the combined beam may be focused by focusing optic 120, analogous to the focusing optics shown in FIGS. 1B-3. In the embodiment shown focusing optic 120 is inclined relative to the sample to provide access for other analyzers, shown schematically by blocks 518. The analyzer 518 may comprise one or more electron guns, ion beams, ion focusing optics, X-ray sources and optics, mass analyzers, charge detectors, sensors, etc in support of the vacuum analysis techniques listed earlier.

After the combined IR and probe beams interact with region of interest 124 of sample 125, the reflected/scattered beam 512 can be collected by collection optic 134 for analysis. The desired detectors can be placed inside the vacuum chamber and/or the light may be coupled out through another window 513, which can then be coupled to one or more mirrors or other beam steering/beam conditioning optics, for example mirrors 514 and 516, before entering receiver 142. As described previously receiver module 142 can comprise one or more detectors and spectrometers to analyze the collected light to perform IR spectroscopy, fluorescence, and/or Raman via analysis of the probe beam returning from the sample. The sample 125 can be mounted on one or more translation/scanning stages 119 that can optionally be mounted on mount 511 providing rigid or vibration isolating connection to a surface of the vacuum chamber. The translation/scanning stage 119 allows coarse positioning of the sample and/or performing measurements at a plurality of locations on the sample to create a plurality of spectra 149 and/or chemical/compositional maps 150. This substantially simplifies the required optical path and mechanical access required to make multiple analytical measurements, enabling compatibility with other vacuum analytical techniques.

In FIG. 5 the illumination and collection optics 120 and 134 are shown inclined relative to the sample to provide access in the vertical plane for one or more of the analytical techniques described above, while being able to illuminate and collect light from the sample in a reflection/forward scatter configuration. In alternative embodiments, it is possible to operate in a transmission configuration, for example placing the collection optic 134 underneath the sample. The illumination focus optic 120 and collection optic 134 can be inclined as in FIG. 5 or if desired can be positioned on a vertical axis similar to that shown in FIG. 1B.

Figure 6:
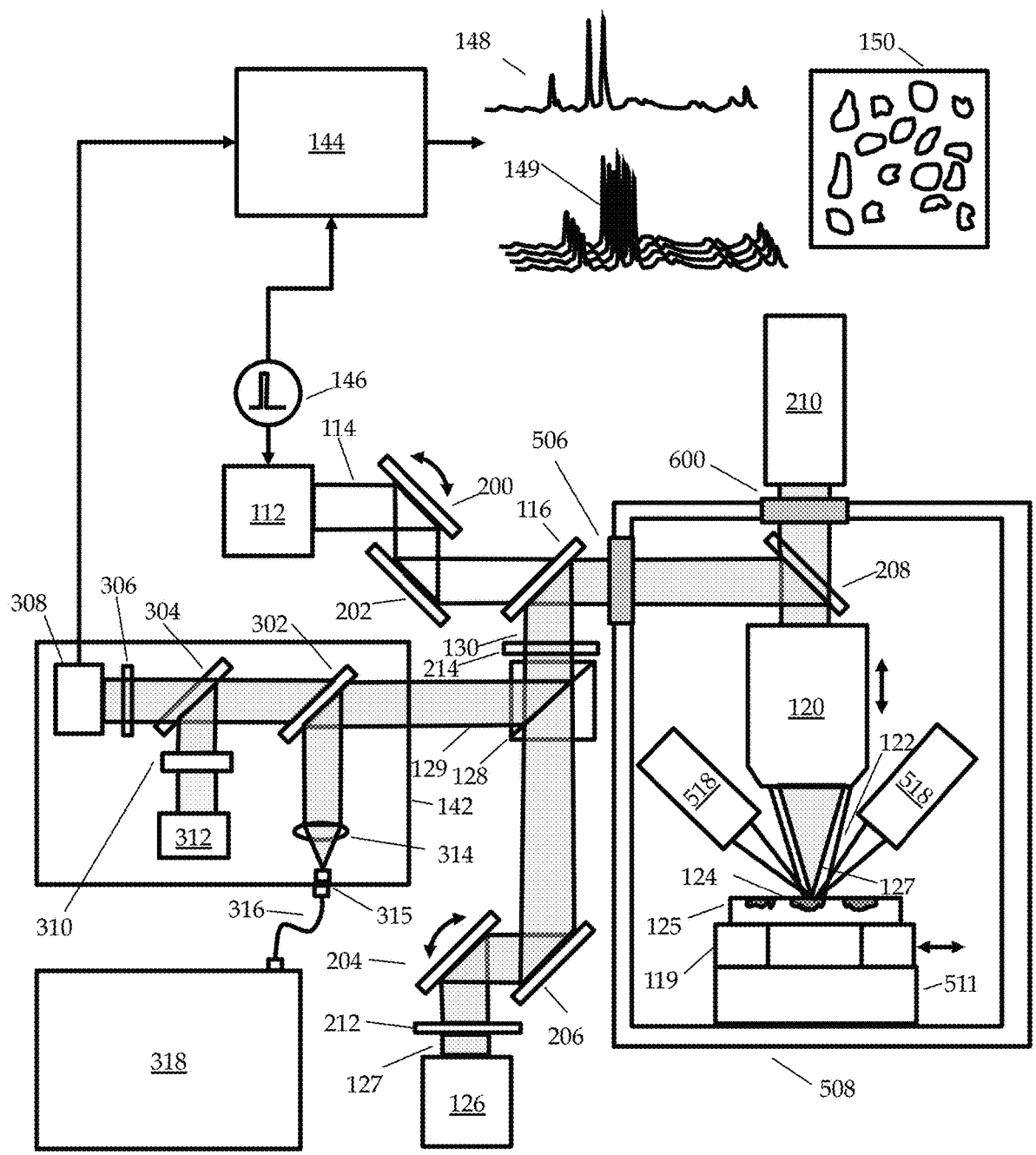

FIG. 6 shows an alternative embodiment for operating the current device in a vacuum chamber. FIG. 6 is very similar to the apparatus shown in FIG. 3 and the associated descriptions apply to like-numbered parts. In FIG. 6, in contrast to FIG. 3, a portion of the apparatus is enclosed in vacuum chamber 508 similar to the vacuum chamber having the same reference number described above with respect to FIG. 5. Vacuum chamber 508 can be evacuated to be compatible with various vacuum analytical techniques. After heating and sensing beams are combined at beam combiner 116, the combined beam passes through window 506. Once in vacuum the combined beams can reflect off optional mirror 208 and are then directed into focusing optic 120 that focuses the combined beams 122 to spots on a region of interest 124 of sample 125. In the embodiment shown the focusing optic 120 is oriented substantially perpendicular to the sample to provide access for beams and detectors of vacuum analytical techniques in complementary solid angles. As described earlier mirror 208 may be a dichroic mirror to provide an optical path to a camera 210 that can be placed either inside the vacuum chamber or as shown outside the vacuum chamber, positioned outside a window 600.

Figure 7:
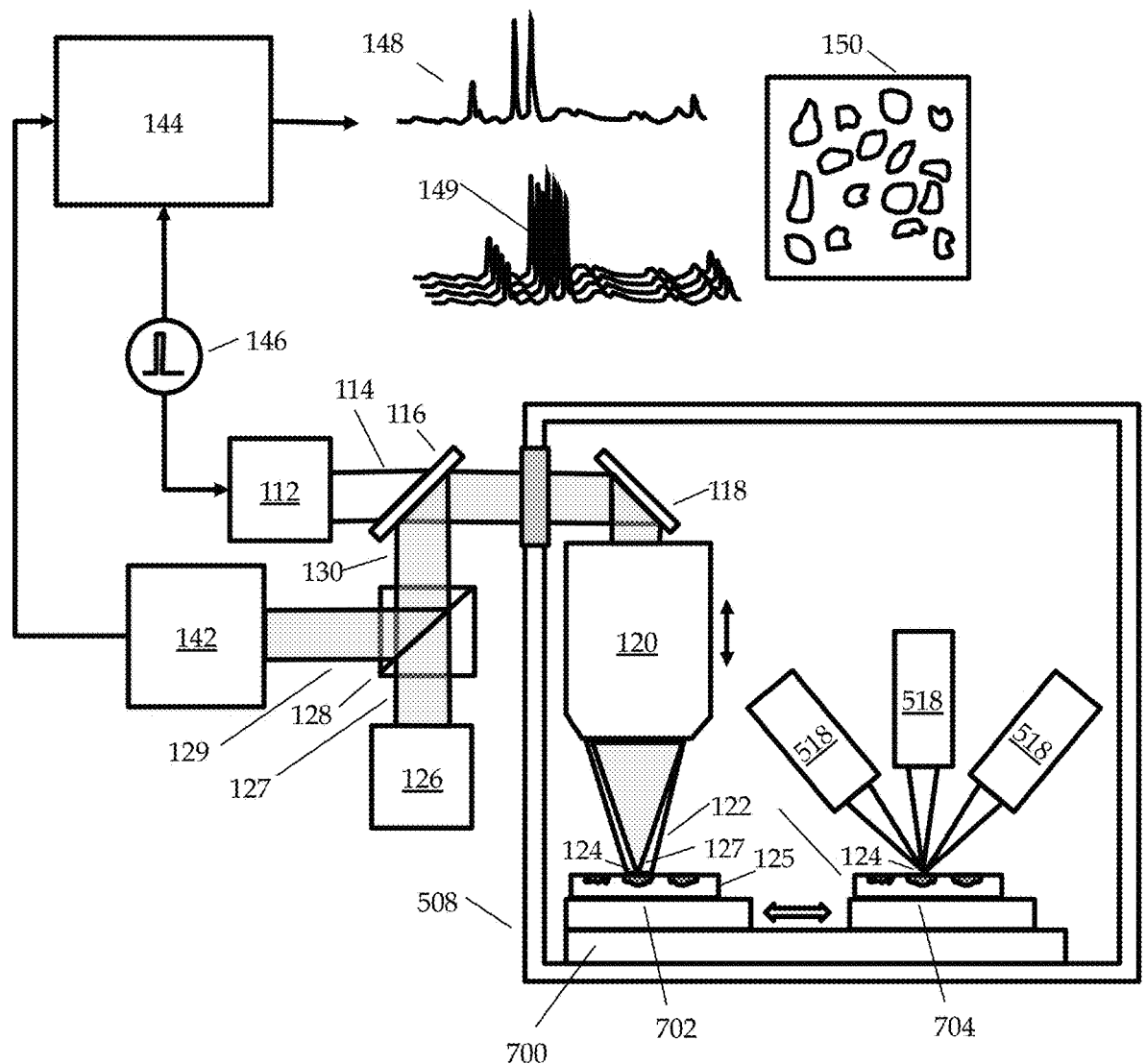

FIG. 7 shows an alternative embodiment of the current apparatus for performing IR spectroscopy, Raman spectroscopy, and other analytical techniques, within vacuum. The embodiment shown in FIG. 7 is a variation of the simplified schematic of FIG. 1B, but the concepts described below can be applied in any combination with various other vacuum and non-vacuum embodiments. In various embodiments, the sample 125 is placed on a long travel stage 700 that can shuttle the sample between two different location to position the sample at two or more locations 702 and 704 that are centered under different analytical techniques.

In the embodiment shown, sample location 702 positions the region of interest 124 under the focused IR and probe beams 122. At this location, it is possible to perform IR spectroscopy, Raman spectroscopy and/or fluorescence measurements. In the second sample location 704, the sample 125 is shuttled such that the region of interest 124 is centered under one or more vacuum analytical techniques, for example SEM, TEM, XRD, TOF-SIMS, EDS or other similar techniques. The objects labeled 518 represent for example electron guns, ion guns, mass samplers, ion optics, X-ray sources, collectors, detectors, etc as needed to perform the desired analytical technique. This shuttle arrangement is desirable in a situation where the required solid angle required by the vacuum analytical techniques does not provide sufficient physical and/or optical clearance for the focusing/collection optic 120 and the associated illumination and sample return beams 122. The objects 518 can also or alternatively be a device for etching the sample, for example via focused ion beam etching, plasma etching or other etching methods. In this embodiment, the system can be used to perform chemical tomography by alternately etching and analyzing the sample. For example, the sample can be positioned at location 702 and have the surface analyzed by IR spectroscopy, Raman spectroscopy, and/or fluorescence, and then shuttled to position 704 to remove a desired amount of material, then returned to location 702 for subsequent chemical analysis. By repeating this process, it is possible to reconstruct a three dimensional map of the chemical composition of the sample. Vacuum etch technique exist that can be used to remove nanometer level amounts of material. So, it is possible to create a 3D map of the sample composition with nm vertical spatial resolution and lateral spatial resolution below 1000 nm and even below 100 nm using the partial beam overlap scheme described earlier.

Another advantage of the photo-thermal IR technique is that it overcomes the limitations of conventional reflection based IR spectroscopy. In conventional reflection-based IR spectroscopy, the sample is illuminated with IR light the light that is transmitted through the sample or reflected/scattered from the sample is collected and analyzed. Transmission IR absorption spectra are extremely useful for analyzing the chemical makeup of a sample because there are vast databases with bulk transmission spectra for hundreds of thousands of materials. Transmission IR spectroscopy, however, generally requires preparing a thin section of a sample, which can range from time consuming to impractical or impossible, depending on the type of sample.

Alternative IR spectroscopy techniques exist that are based on reflectance arrangements, where the system can measure the IR light that is reflected and/or scattered from the sample. This can eliminate the need to prepare a thinly sectioned sample, but reflection-based IR spectroscopy has many artifacts relative to transmission IR spectroscopy. The artifacts are primarily due to a variety of factors resulting from the scattering of light and dispersive effects resulting from contributions of both the real and imaginary components of the index of refraction in the amount of reflected/scattered IR light. These artifacts frequently distort measured IR spectra versus transmission IR spectra, making chemical analysis and identification significantly more challenging.

An alternative technique is attenuated total reflection (ATR). ATR brings an IR transparent crystal into contact with a sample and then illuminates the crystal and sample with IR light in total internal reflection configuration. The ATR approach also eliminates the need for thin sections, although the spectra can still be distorted relative to transmission spectra. Further, the required contact between the ATR crystal and the sample can be difficult to accomplish for some samples and measurements, and can especially be challenging for imaging application.

The various embodiments described herein overcome the limitations of transmission, reflection and ATR-based IR spectroscopy. Using a dual-beam detection beam having a sensing beam and a heating beam, it is possible to avoid the reflection artifacts and collect undistorted IR absorption spectra that are a good match to conventional transmission IR spectroscopy, thus enabling the use of materials databases to characterize and/or identify an unknown material. The methods disclosed herein improve both detection of the chemical composition of the sample, and also improve upon the imaging resolution compared to conventional systems that were limited by the diffraction limit of an IR beam (or other long wavelength heating beam like terahertz radiation).

Figure 8:
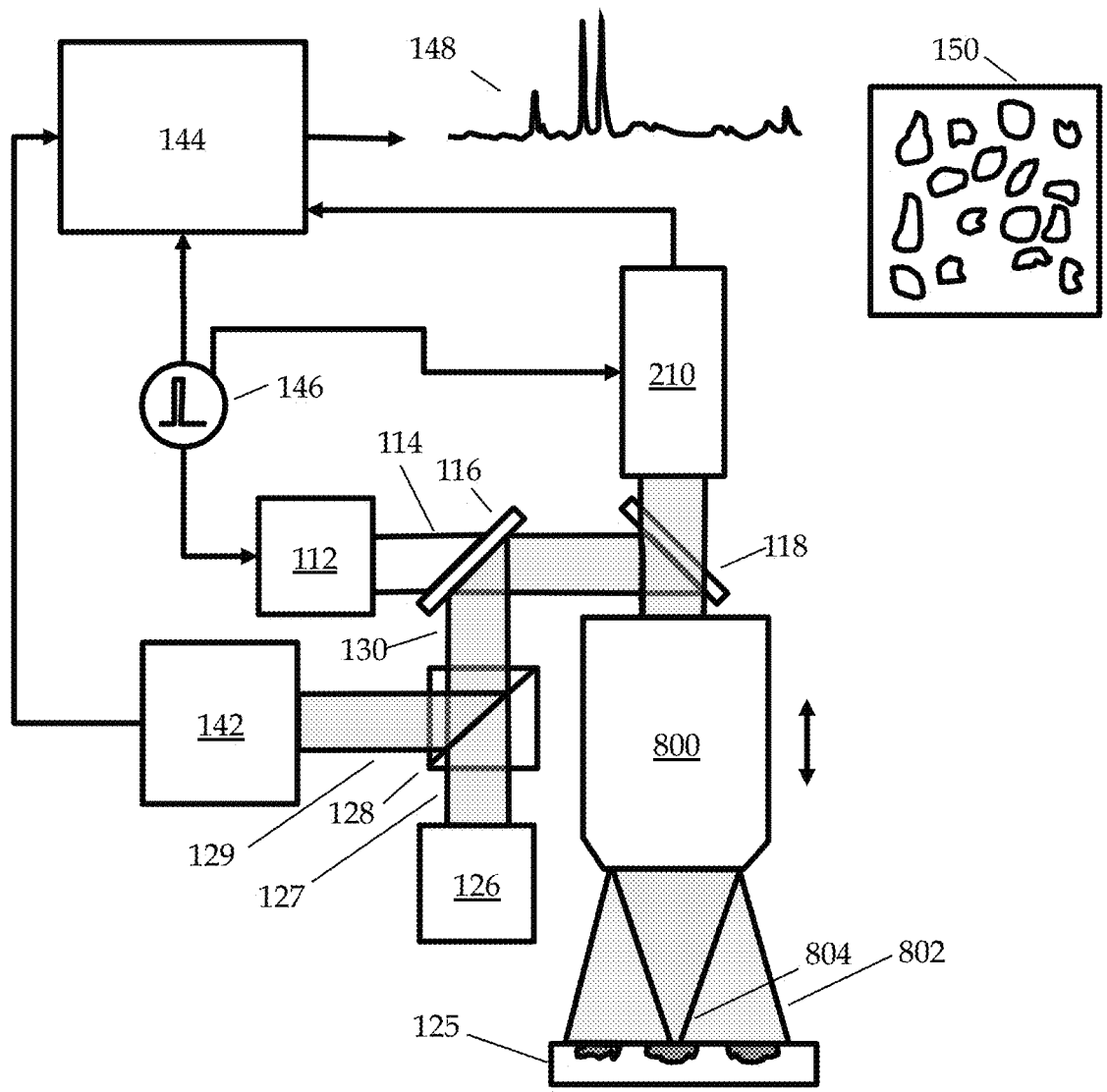
FIG. 8 is a simplified schematic diagram of an embodiment configured for wide area imaging.

FIG. 8 shows a simplified schematic diagram for an embodiment where the current technique is used to obtain high quality transmission-like IR absorption spectra over various length scales, ranging from <100 nm to many mm. FIG. 8 is similar to FIG. 1B and where common callouts are used, the discussion associated with FIG. 1B applies. As with FIG. 1B, in FIG. 8 infrared beam 114 and probe beam 127 are combined with beam combiner 116 and directed towards an optic 800. Unlike FIG. 1B, however optic 800 is not necessarily a focusing optic that focuses the IR and probe beams to small focus spots. Instead, optic 800 may in fact expand the beam 802 to cover a wide area of the sample 125.

Alternately optic 800 may be a focusing optic like focusing optic 120 of FIG. 1B, but positioned at a distance from the sample where the sample is out of focus such that the illuminated area is larger than at the focus. In either embodiment, probe light reflected and/or scattered from the wide area of the sample may be collected by the same optic 800 or by an additional optic (not shown) positioned at an angle relative to optic 800 and the sample 125. In either embodiment, probe light that is collected after interacting with the sample can be directed to either a receiver 142 as described with FIG. 1B and following figures and/or can be directed towards a camera 210. The camera can capture the probe light that is reflected or scattered from a wide area of the sample. The camera can be synchronized to the pulse control sync signal 146 that is used to pulse/modulate the IR source. The camera can be programmed to acquire one or more frames when the IR laser pulse is on and one or more frames when it is off, in embodiments. By comparing the differential signals with the heating beam either on or off, over an accumulated number of frames it is possible to determine the change in reflected/scattered intensity at each of the pixels in the field of view of the camera.

Alternately, the camera can be used to acquire a time series of data for a plurality of pixels and then a computational device (controller) can be used to demodulate the time series of data at a frequency corresponding to the pulse control sync signal 146, typically either directly at the modulation frequency or an integer harmonic thereof. For example, an FFT can be performed on the pixel time series data, or a digital lock-in algorithm or any similar technique to demodulate the pixel time series data into a signal indicative of a modulation in the signal induced from the IR absorption by the sample. Via this approach, it is possible to obtain signals indicative of IR absorption spectra that are spatially resolved via the camera detection and/or averaged over a large area, for example by sending light collected over a wide area to the receiver 142.

It is also possible to change the widefield optic 800 to a collimating optic (for standoff measurements of distance objects) or to a focusing optic 120 for microscopic measurements, to then provide focused IR and probe beams 804 to perform a measurement on a small area. In this embodiment, the wide field configuration using wide field beams 802 can perform a large area survey measurement and a microscopic measurement can be performed with focused beams 804. In the embodiment of using focus beams, it is possible then to achieve a spatial resolution of IR absorption of 700 nm or less by focusing the probe beam using high NA optics as described previously. As mentioned previously, it is also possible to conduct atomic force microscopy based IR spectroscopy (AFM-IR) in parallel with the large survey measurement to achieve IR absorption measurements, down to the scale of ~10 nm. Depending on the desired data, this can be accomplished by either by swapping optics, changing the internal configuration of the optic and/or changing the vertical position of the optic 120 or 800 relative to the sample 125. In the embodiment of wide field illumination for example using the wide field optic 800 of FIG. 8, it may be desirable to use high power IR and visible laser sources to maintain similar optical power density as used for microscopy applications. For microscopy applications where the beams are focused to diffraction limited spots, it is common to use beams with average most often in the scale of about 1 mW to about 10 mW, although for some applications either higher or lower power can be used. Available tunable sources in the mid-IR can produce output beams on the scale of several hundred milliwatts to many watts of optical power. For example, the Firefly-IR from MSquared Lasers can produce >250 mW of mid-IR radiation. Nanosecond optical parametric oscillators (OPO) for example from Ekspla can produce 450 µJ at 1 kHz or 450 mW of IR power. Amplitude Systemes produce an OPO laser that can take up to 50 W of input power and produce mid-IR output with >12% efficiency, producing for example 6 W of mid-IR energy. Jiang et all have demonstrated high power pulsed OPOs with up to 8.5 W of power at 3.3 um wavelength (DOI:10.1364/OE.23.002633). Peng et al. demonstrated a tunable mid-IR laser with output power in excess of 27 W (DOI:10.1134/S1054660X1201015X). Hemming et all demonstrated a high power mid-IR ZGP ring OPO with over 30 W of optical power (DOI: 10.1364/CLEO_SI.2013.CW1B.7)

Each of these mid IR sources would in turn provide sufficient power to illuminate increasingly larger areas of the sample with the same average power density as used for the microscopic focus embodiment. For example, assume that for the microscope embodiment the IR beam is focused to a 10 µm spot with 1 mW of power for sufficient sensitivity. With 30 W of IR power from the Jiang et al OPO, it is possible to illuminate an area with a diameter 122× bigger than with a 10 µm focused spot (via the square root of the power ratio of 30 W to 1 mw). So, this would correspond to the ability to illuminate an area 1220 µm in diameter. Similarly, visible, UV and near IR pump lasers are available with extremely high power as well. For example, 532 nm green laser systems are available from Optotronics with up to 6 W of power. Coherent manufactures a 1064 nm laser with up to 55 W of optical power. Thus, this embodiment could provide measurements over a sample area of more than 1 mm in diameter, or areas greater than 1 square mm. Visible, near IR, UV and mid-IR laser power sources are increasing in power output over time, so the sample area available for IR spectroscopic measurement, as well as collated Raman and/or fluorescence, can be expected to increase as more powerful sources become available.

The dual beam technique described above produces spectra that are substantially free of dispersive artifacts associated with conventional reflection/back scattered IR spectroscopy. Because the probe beam is sensitive only to the change in temperature of the sample due to the photo-thermal response (e.g., from change in index of refraction and/or thermal expansion), it is completely independent of the wavelength dependent reflectivity and/or scatter of the IR beam. As such the disclosed techniques provide the ability to provide IR absorption spectra that correlate well to conventional FT-IR spectroscopy, substantially without dispersive artifacts, and allow accurate material characterization and identification. These characterization spectra can include in mid-IR wavelengths where the so-called "fingerprint bands" exist that provide rich information for discriminating materials, even highly similar materials.

It is not strictly necessary for the sensing or probe beam to have a shorter wavelength than the heating beam, in embodiments. While this is desirable for microscopic measurements where the desired spatial resolution is smaller than the optical diffraction limit of the heating beam, it is not needed for wide area measurements with coarser spatial resolution requirements or for bulk measurements. Rather, it can be sufficient in some embodiments to use a substantially fixed wavelength probe beam, rather than necessarily a shorter wavelength. Using a fixed wavelength probe beam allows the measurement of the photo-thermal distortion of the sample with no issues of wavelength dependent variations in the optical properties of the sample as is the embodiment when measuring an IR response from the heating beam by observing the reflection over the IR wavelengths of the incident beam. This insight allows the application of photo-thermal IR technique using probe beams that are of any desired wavelength that produces sufficiently high power to produce a detectable signal.

Probe or sensing beams can be produced by sensing beam sources such as lasers operating in the UV spectrum, visible spectrum, near IR spectrum, or even the mid-IR spectrum. It also may not be necessary to employ the same power density for widefield/bulk applications as for a microscope implementation. Although the power density and associated photo-thermal deformation may be lower when the IR and/or probe beam are spread over a larger area, the aggregate impact on the sample may still be detectable. For example, a detection system that integrates the small photo-thermal distortion over a large area may have sufficient sensitivity even at small optical power densities. One way of achieving this for example is to use camera 210 or an alternate camera or array detector in received 142. A camera or array detector can measure the small change in intensity and/or position of reflected or scattered light over a plurality of pixels and then coherently sum the aggregate impact on the motion/intensity of scattered probe light collected from a large area. Speckle patterns from rough samples, as discussed previously, can be analyzed to determine a signal that is indicative of the photo-thermal distortion of the sample and in turn the IR absorption of the sample.

The ability to obtain spectra from a wide area of a sample makes the photo-thermal IR technique viable for use in a variety of applications, including material inspection, material composition analysis, evaluation of material treatments, hazardous materials detections, detection of defects and contaminants, and process control to name a few. For example, a PTP-IR/Raman system could be used to performing incoming material inspection on bulk materials to verify composition against a vendor or customer specification. Similarly, the PTP system can be used to determine the material composition of an unknown material or check the composition against some predetermined targets. In this embodiment, the measured spectra can be a linear superposition of component spectra scaled by their relative concentrations. With chemometric or spectral decomposition techniques, the PTP system can be used to deconvolve the mixed spectra into component spectra and relative concentrations.

The evaluation of treated materials is also an important application. For example, many materials are exposed to chemical treatments to impact their wettability, flammability, resistance to ultraviolet radiation, or for other purposes. A common analytical desire is to understand the degree and uniformity of the uptake of the treating chemical into the bulk material. The PTP technique can be used to measure and map the distribution of chemical treatments on materials, either in the microscopy mode with highly focused beams, or via wide area measurements or both. The PTP technique can also be used for hazardous materials detection, either with lab grade instruments in laboratories or in the field via handheld instruments as described below in and shown in FIG. 9 or alternately via a standoff detection mechanism.

Figure 9A:
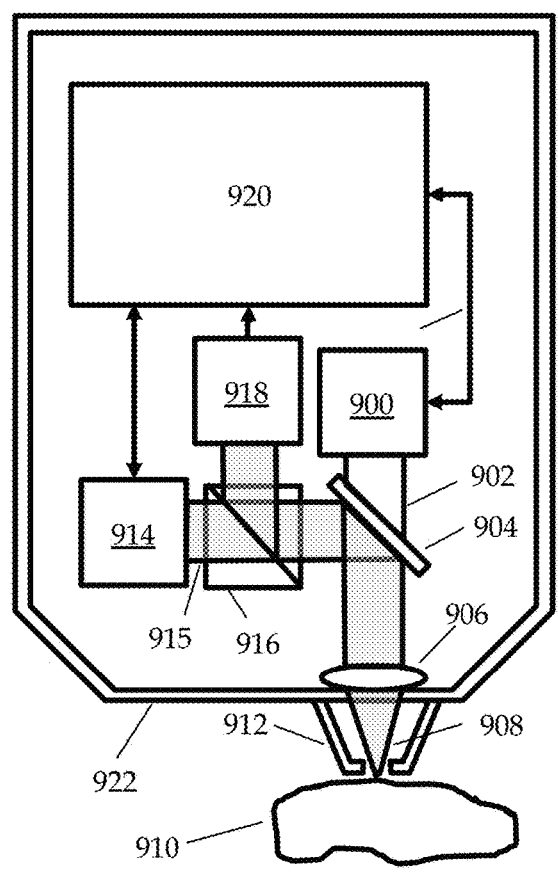
FIGS. 9A and 9B are simplified schematic diagrams of handheld measurement system embodiments.

The photo-thermal probe technology of the current application can also be applied to detection and identification of chemicals and materials with a portable/hand-held device. FIG. 9A shows a simplified schematic of a miniaturized dual-beam device capable of performing IR spectroscopy in a reflection/backscatter mode. A compact tunable infrared source 900 emits a beam of 902 that passes through beam combiner 904 to focusing optic 906 for focus a beam 908 onto sample 910. Optional nosecone 912 can provide a reference surface to position the miniaturized PTP device at a desired distance from the sample to ensure optimal focus. The nosecone 912 may be removable or exchangeable to operate at different standoff distances, for example to position an IR beam such that it is focused a fixed distance past the end of the nosecone. A probe light source 914 emits a beam 915 of UV, visible, near IR or other fixed wavelength radiation that passes through optional beamsplitter 916 towards beam combiner 904 where the probe beam is reflected to the same focusing optic 906 to focus the probe beam to a location on the sample at least partially overlapping the focused IR beam. As discussed previously, the configuration of the beam combiner 904, IR and probe beams can be reversed, that is so that the probe combiner 904 transmits visible light and reflects IR.

The probe beam can be used for multiple purposes. It can be used to probe the IR absorption of the sample due to the photo-thermal process described previously, but it can also be used to generate Raman scattering and/or fluorescence in the sample. For the IR measurements, as before, regions of the sample that absorb IR light will heat up, resulting in a photo-thermal distortion of the sample associated with the absorbing regions. The photo-thermal distortion of the sample is detected via the probe beam whose beam shaper and/or trajectory can be modulated by the photo-thermal heating of the sample. Probe light returning from the sample (along with any resulting fluorescent and/or Raman scattered light excited by the probe beam) can be collected by optic 906 or alternately a separate offset collection optic (not shown). In the embodiment, the probe light is collected by the same optic 906, the collected probe beam reflects off beam combiner 904 and into beam splitter 916 where a portion of the beam passes through to receiver 914. The receiver can comprise any desired combinations of optical sensors and spectrometers. Electronics 920 can be used to amplify/condition and demodulate sensor and/or spectrometer signals to compute signals indicative of IR absorption, Raman scattering and/or fluorescence signals. The entire device may be surrounded with a ruggedized case 922 to permit usage in harsh environments and/or workplaces where the device may be exposed to shocks, drops, and/or chemical exposure.

Figure 9B:
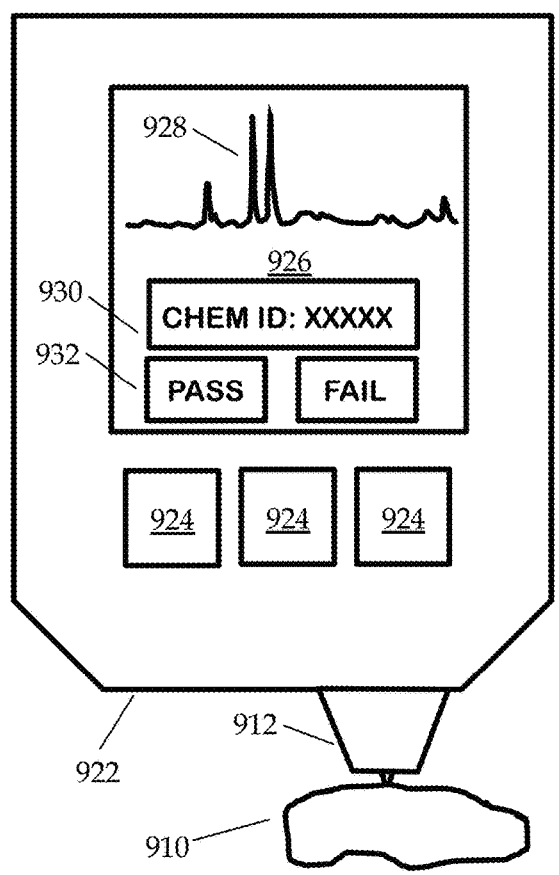

FIG. 9B shows a simplified conceptual diagram of the exterior of the miniature handheld PTP device measuring a sample 910. The view shows the top view of the ruggedized case 922 with optional nosecone 912 in proximity of the sample 910. On the surface of the device there may be one or more buttons 924 for controlling various functions of the device. There may also be a display 926 that can display various controls, settings, measurement protocols, etc. used to configure a measurement. The display 926 can also show one or more spectra 928 obtained by IR and/or Raman spectroscopy and/or fluorescent measurements, or an indication of a particular chemical or composition of interest that has been detected based upon the reflected spectrum. Spectra and/or fluorescent measurements can be used optionally in combination with chemometrics to identify an unknown material, producing a chemical identification 930 with the likely chemical composition of the sample. Alternately or additionally, the device can produce an analysis of the sample, for example providing a compositional makeup or percentage composition of one or more constituent chemicals. The device can also or instead indicate whether the measured material meets specified standards for the target material and indicate whether a measured material passes or fails a test for constituent levels via indicators 932. The device can also or instead be used to measure the concentration of a specific component, for example analyzing the percentage fat or protein or to detect the potential presence of a contaminant or hazardous substance.

Returning to FIG. 9A, heating beam source 914 can be an IR source. For example, IR source 914 can be a tunable quantum cascade laser (QCL) device. Block Engineering for example makes a miniature QCL module that can tune over 250 cm$^{-1}$ with a size of 46.5×32.5×20.5 mm, a size that can fit into handheld device. Multiple QCL modules can be combined to cover about 5.4 µm to about 13.3 µm. In recent years both the average power and tuning range of QCLs have been increasing, so it is expected that broader tuning ranges will be possible in the future with similarly sized or smaller sources.

Similarly, laser diodes suitable for sensing probe light sources are available from many vendors in a size suitable for a handheld device. Thorlabs sells many laser diode devices ranging from a few mW to more than a watt over many wavelength ranges. For example, Thorlabs sells a laser diode part number LD785-SEV400 in a TO-9 can (9 mm diameter) with 400 mW of optical power at 785 nm, sufficient for both sensing beam measurements and as a source for Raman spectroscopy. Alternate packages are available with fiber coupled laser diodes in many wavelengths.

Miniature collimating lenses are also available and complete laser diode modules with collimation and drive electronics are also available in a variety of form factors from various vendors. IR and probe beam diameters can be kept at the size of a few millimeters or less to enable the use of small or miniature optics for beam combiner 904, focusing optic 906, and beamsplitter 916. The beam combiner, focusing optic and beamsplitter could each be 5 mm or less across, in an embodiment. For example, Edmund Optics makes a polarizing beamsplitter in a 5×5×5 mm size and smaller beamsplitters and other optics can be fabricated on a custom basis. Visible laser diodes are similarly small, for example less than about 5 mm long and less than about 9 mm diameter. Thermoelectric or other cooling may be desired, but the space required for this can be on the scale of a few mm to a few cm depending on the optical power level and associated heat load. Optical detectors, Raman spectrometers, and/or cameras are also available in miniature form factors with sizes on the scale from a few mm to a few cm. Power supplies, signal conditioning a computational electronics can also be miniaturized, down to the scale of a few cm for the functions required. As such, it is possible to assemble an entire handheld photo-thermal probe device to fit into a package that is smaller than 125 mm across, in one embodiment.

For higher power applications, it may be desirable to have a portion of the device remoted, for example with power supply, batteries, additional computation resources, and/or larger IR and/or probe light sources. In this embodiment, the handheld unit may be coupled to the remote unit via a wired connection or a wireless connection. A wired connection can include one or more cables and/or optical fibers to provide electrical and/or optical coupling between the handheld unit and the remote portion of the device. For example, separate IR and visible optical fibers may transmit the IR and probe light to a handheld unit where the two beams are combined as described in associated with FIG. 9A above.

The miniature PTP device can be used for a large number of applications, including but not limited to material inspection, material composition analysis, evaluation of material treatments, hazardous materials detections, detection of defects and contaminants, and process control. In the embodiment of standoff detection, where the unit is used to perform chemical analysis of a distant object, focusing optic 906 can be replaced with a collimating optic so as to emit collimated IR and probe beams. Then the probe beam can measure the photo-thermal response and hence IR absorption from a distant object. For standoff detection, it is possible to collect reflected/scattered light with the same collimating optic or alternately a separate optic, even with a standalone collector, for example an optical telescope fitted with an optical detector and/or camera.

Figure 10:
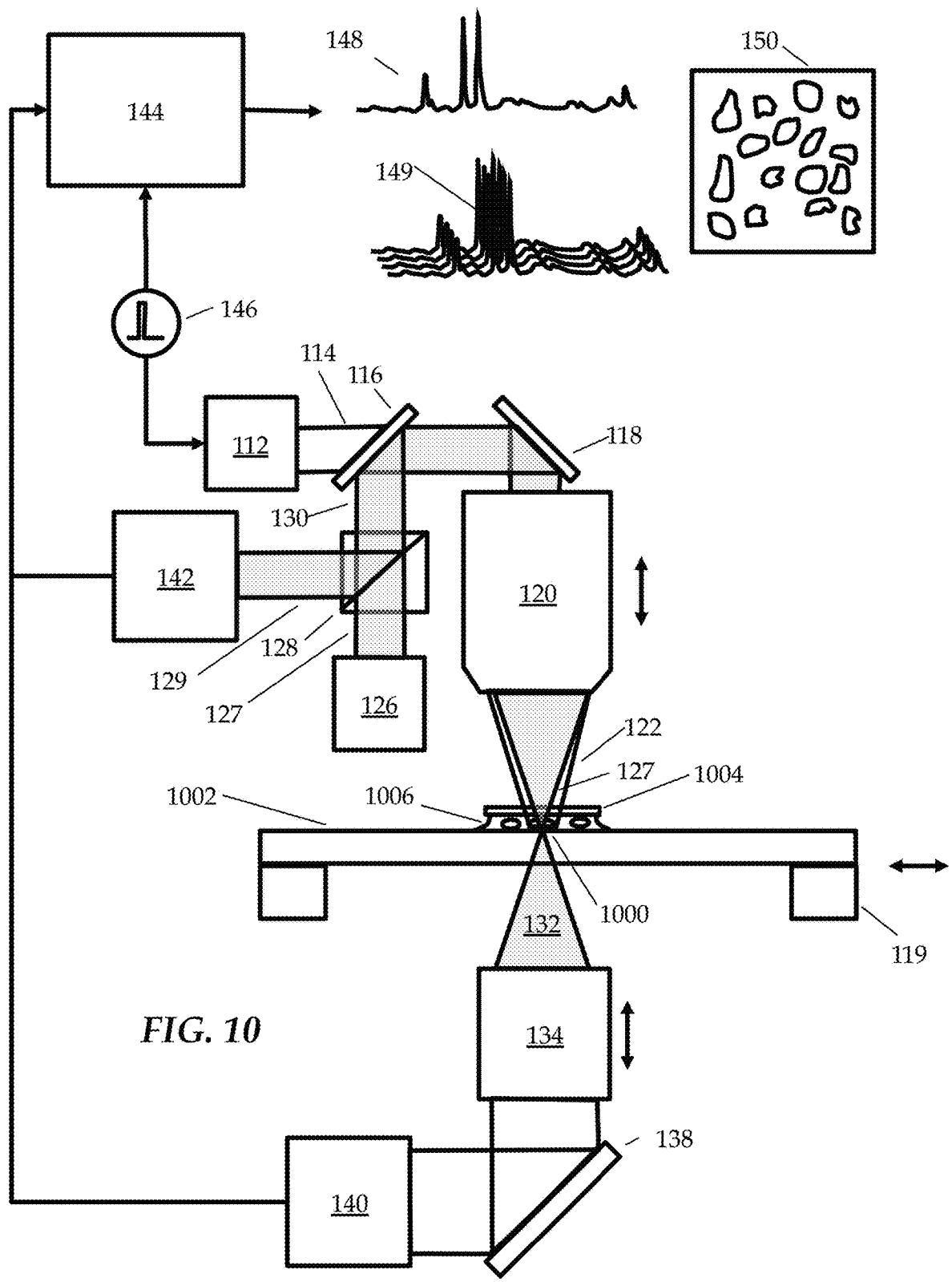
FIG. 10 is a simplified schematic diagram of an embodiment configured for measurements of samples immersed in liquid.

FIG. 10 shows an alternative embodiment of a PTP apparatus supporting measurements of samples in liquid, for example live biological cells. FIG. 10 is a modified version of FIG. 1B and similar objects are referred to by the same reference numbers. The embodiment shown in FIG. 10 enables measurements of IR spectroscopy and Raman and/or fluorescence using the same probe beam excitation and with the sample immersed in liquid. As with FIG. 1B and other similar figures, IR and probe beams are combined together then sent through a focusing optic 120 to create a focused beam 122 to interrogate a sample. In this embodiment, the sample specimen 1000 is mounted on a suitable substrate 1002 for measurements in liquid, for example a glass slide or petri dish. A drop of liquid 1006 covers at least a portion of the substrate 1002 and specimen 1004. The specimen and liquid drop are covered with an infrared transparent cover slip or window 1004. In a cover slip configuration, the cover slip is usually mounted on the sample substrate 1002 trapping a small amount of liquid between the substrate and coverslip. Alternately, the coverslip may be replaced with an IR transparent window that is independent of the sample substrate. For example, it may be separate structure of a liquid cell and/or may be attached to or a part of focus optic 120.

In either embodiment, IR and probe light can pass through the coverslip or window 1004 to impinge on specimen 1000 immersed in liquid. The probe light can pass through the sample substrate 1002, which chosen to be substantially transparent at the probe wavelength. The probe light and any resulting Raman or fluorescently scattered light 132 are collected by collection optic 134 as in FIG. 1B and other similar figures. The collected light can be collected as before by receiver 140 and/or 142 and analyzed to produce signals indicative of IR absorption, Raman scattering and/or fluorescence. In embodiments, probe light and any Raman or fluorescent light can be collected in reflection via optic 120.

The liquid can be any number of liquids depending on the purpose of the experiment. For measurements on biological specimen, the liquid will normally be an aqueous solution, for example a biological buffer solution, perhaps with various chemicals, drugs, toxins, etc that are being studied in interaction with the specimen. The liquid can also be an oil or other liquid chosen to maintain the sample in an optimal environment, for example clean and/or not exposed to the atmosphere. The liquid can also be used to provide an electrochemical environment, for example for battery, fuel cell, or similar research. It can also be a liquid to test environment and/or chemical exposure to a sample or substrate. In the embodiment that the liquid absorbs IR radiation it can be desirable to use a very thin layer of liquid to avoid excessive loss of optical power by the liquid. These concerns can be mitigated with tunable IR sources that facilitate modifications to the intensity of the light. In embodiments, the intensity of the heating beam can be increased whenever the source is tuned to an absorption band of the liquid to overcome signal loss to the liquid. Additionally or alternatively, background signals generated by the liquid absorption can be removed by subtracting absorption signals related to regions of the substrate with no specimen from absorption signals from regions of the sample with specimen. The sample substrate 1002 can be placed on a manual and/or motorized translation stage 119 to allow measurements to be performed at a plurality of locations on the sample substrate 1002 to enable mapping of IR absorption, Raman, and/or fluorescence over arbitrarily large areas of the sample.

Figure 11:
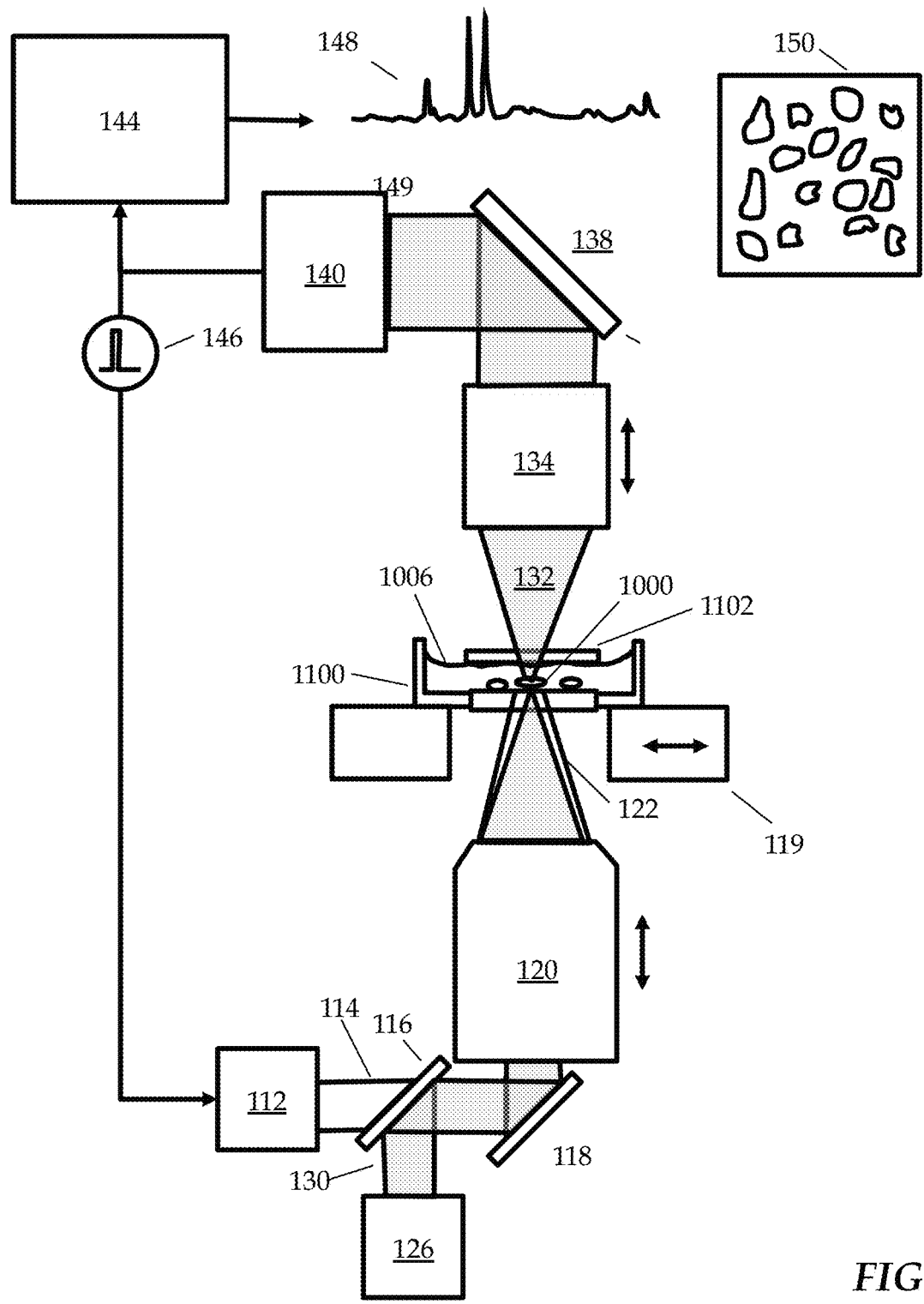
FIG. 11 is a simplified schematic diagram of an embodiment configured for measurements of a sample immersed in liquid.

FIG. 11 shows an alternative embodiment for optical measurements with a sample immersed in liquid. In this embodiment, the heating beam 122 illuminates the sample from below. This arrangement permits uses of specimen 1000 that are immersed in larger volumes of liquid, for example in a petri dish 1100, perfusion cell, electrochemical cells or other fluid immersion configurations in which it is difficult to invert the liquid. In the orientation shown in this embodiment, gravity keeps the liquid within the petri dish 1100 or other open container. To provide a stable optical interface, an optional window 1102 can be placed at the top surface of the liquid. The window may be part of an enclosed fluid cell can be spaced off the bottom of the petri dish with spacers, mounted to the housing or other structure of optic 134, or supported by other structure, for example on the sample translation stage 119 or any other arrangement that provides a support for the window 1102. As with other embodiments, the probe light can be collected either in transmission mode with optical collector 134 or in reflection mode.

The measurement technique is not constrained just to mid-infrared wavelengths. The same benefit of sub-diffraction limited spatial resolution can be applied to longer wavelength measurements as well. The ratio of spatial resolution improvement can be much larger for longer wavelengths than for shorter wavelengths due to the difference in their diffraction limits.

Figure 12:
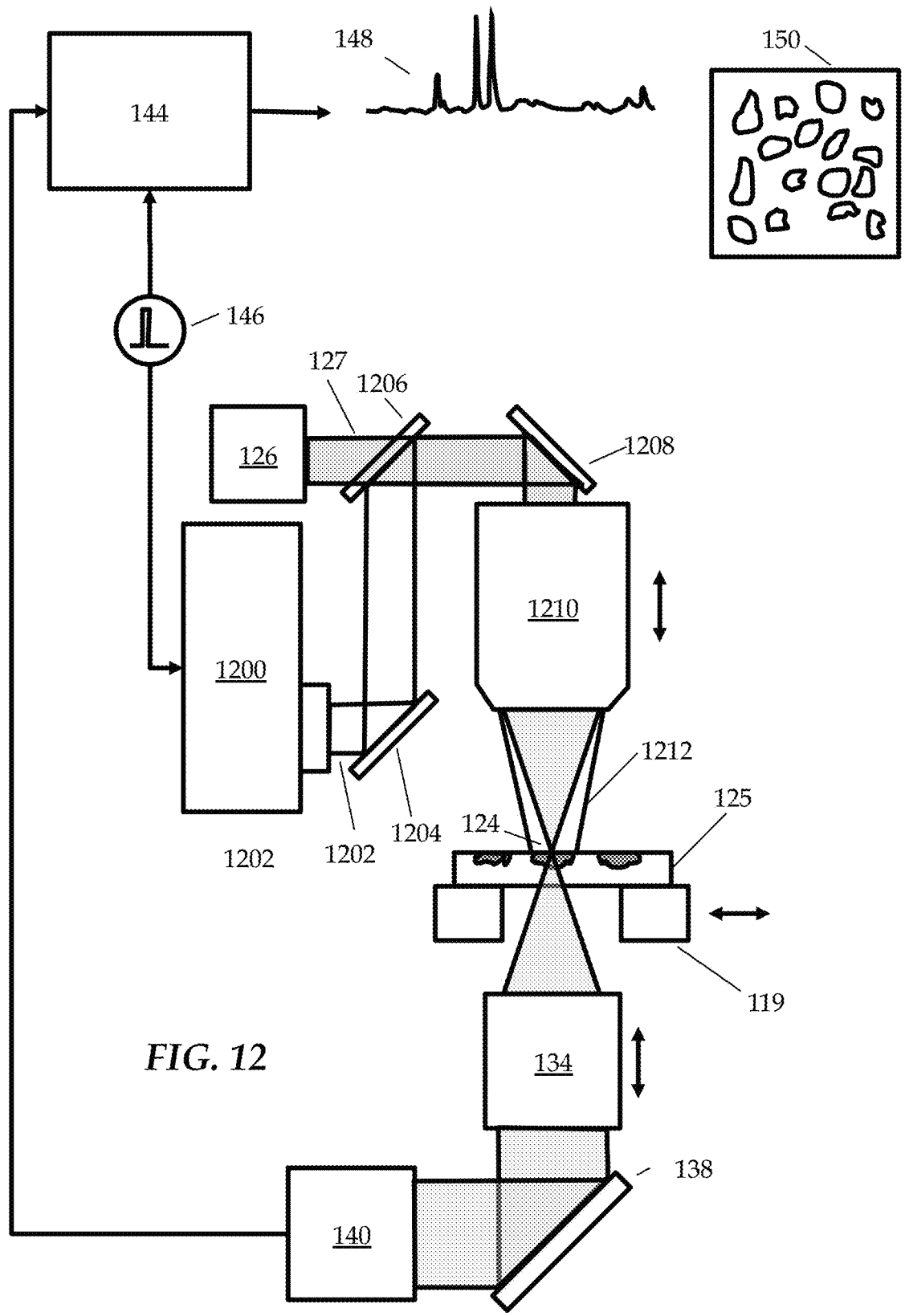
FIG. 12 shows a simplified schematic diagram of an embodiment configured for use with a low frequency heating beam.

FIG. 12 is a simplified schematic of an embodiment of a dual-beam, photo-thermal system and technique for sub-diffraction limited imaging. A source 1200 emits a beam of heating radiation 1202 that is reflected off one or more optional steering mirrors 1204 towards beam combiner 1206 which reflects the heating beam towards optional mirror 1208 and into focusing optic 1210. Focusing optic 1210 focuses the heating beam 1212 to a spot on a region of interest 124 of sample 125. Because the heating beam can have a wavelength that is much larger than mid-IR wavelengths, the focused spot size in the embodiment shown in FIG. 12 is proportionately larger, for example about 1 mm in diameter. To perform spatially resolved spectroscopy and chemical imaging below the diffraction limited size of the heating beam, a probe light beam is used to read out the photo-thermal distortion of the sample resulting from the heating of the sample due to absorption of heating beam. Probe light source 126 emits a beam of probe light 127 that passes through beam combiner 1206, is reflected off optional mirror 1208 and is focused by optic 1210 onto the sample 125 in a region that at least partially overlaps the region of the sample illuminated by the heating beam. The probe light is generally selected to have a smaller wavelength that the heating beam, for example in the UV, visible, near IR or even mid-IR wavelength range. The smaller wavelength of the probe beam allows it to be focused to a much smaller diffraction limited spot, for example to less than 1000 nm, less than 500 nm, and even less than 200 nm. After interacting with the sample the probe light can be collected by collecting optic 134 and transmitted to receiver 140 that can comprise any number of optical detectors, spectrometers, cameras, etc as described previously associated with previous figures. Receiver 140 can also include a detector for bulk/wide area THz spectroscopy. Heating beam source 1200 may be one of a number of THz sources in that embodiment. For example, a number of vendors, for example Toptica and Menlo Systems make THz emitters based on femtosecond fiber lasers being used to pump a ZnTe THz emitter to generate a beam of THz radiation. The company M Squared makes a 30 nsec pulsed THz laser.

Edinburgh Instruments makes a continuous wave far-IR/THz laser with emission lines over 0.25-7.5 THz with power ranging from 10-150 mW.

An external chopper can be used to modulate the intensity of the heating beam. For example, Scietec makes a high speed chopper that can modulate a laser to over 100 kHz modulation rates. Alternately, various research groups and commercial manufacturers have demonstrated THz emitters based on quantum cascade lasers (QCLs). Wang has demonstrated CW THz QCL with 230 mW of optical power (article "High-power terahertz quantum cascade lasers with ~0.23 W in continuous wave mode" published as DOI: 10.1063/1.4959195). The Wang QCL is also a continuous wave device and could be chopped as described previously. Burghoff et al has demonstrated the use of broadband pulsed THz frequency combs to deliver 5 mW over 60 THz laser lines (DOI:10.1038/nphoton.2014.85). Longwave Photonics makes a THz QCL product line called "EasyQCL" that delivers 10 mW of optical power, and can be pulsed up to 100 kHz, with emission frequencies in the range of 1.9-5 THz. Brandstetter et al developed THz QCL with 200 nsec pulses, 10 kHz rep rate, almost 500 mW optical power (article "High power terahertz quantum cascade lasers with symmetric wafer bonded active regions," DOI: 10.1063/1.4826943). Each of these may be a suitable THz source for the heating beam of FIG. 12, in embodiments, and can be used to take measurements depending on the power, wavelength range, and pulse repetition requirements of a specific measurement. Because many of the THz QCLs operate at cryogenic temperatures, the THz QCL source 1200 may comprise a Dewar, a cryostat or other cooling apparatus to maintain the QCL chip at a sufficiently low temperature for operation.

FIG. 12 is shown in a configuration where the heating beam is reflected by beam combiner 1206 and the probe light passes through the beam combiner. A suitable optic for this configuration would for example be the "Terahertz Visible Beamsplitter" model 20TZBS02-C available from the Newport Corporation. The relative orientation could be reversed for use with an alternate beam combiner 1206 that reflected IR and transmitted heating beam radiation. The same type of probe beam may be used in this embodiment as in previous embodiments. Specifically, this means that the probe light source can (1) have a much smaller wavelength to provide much better spatial resolution than the diffraction limit for the heating beam; and (2) the probe light source may be a light source that excites fluorescence and Raman scattering in the sample thus providing the ability to perform collocated heating beam, Raman, and/or fluorescence measurements. It is also possible to provide an additional or alternate light source in the form of an IR light source to provide sub-diffraction limited measurements of IR absorption. THz measurements can be combined with IR measurements and Raman and/or fluorescence using the same probe light beam, in one embodiment. The embodiment shown in FIG. 12 can also be combined with beam steering (FIGS. 2, 4, and 13), Raman and fluorescence (FIG. 3), measurements in vacuum (FIGS. 5-7), wide area measurements (FIG. 8), handheld measurements (FIG. 9), with a sample immersed in liquid (FIGS. 10 and 11).

Additional design advantages and options discussed below also apply while using very large (1 mm or more) wavelengths. In each of these embodiments the IR sources of and IR compatible beam combiners of FIGS. 10 and 11 are replaced or augmented with one or more longer wave sources and longer wave compatible beam combiner as described above. Such systems can employ both IR and longer wave sources such that it is possible to perform IR and longer wave spectroscopy of the same regions of the sample for the purposes of correlative measurements.

Figure 13:
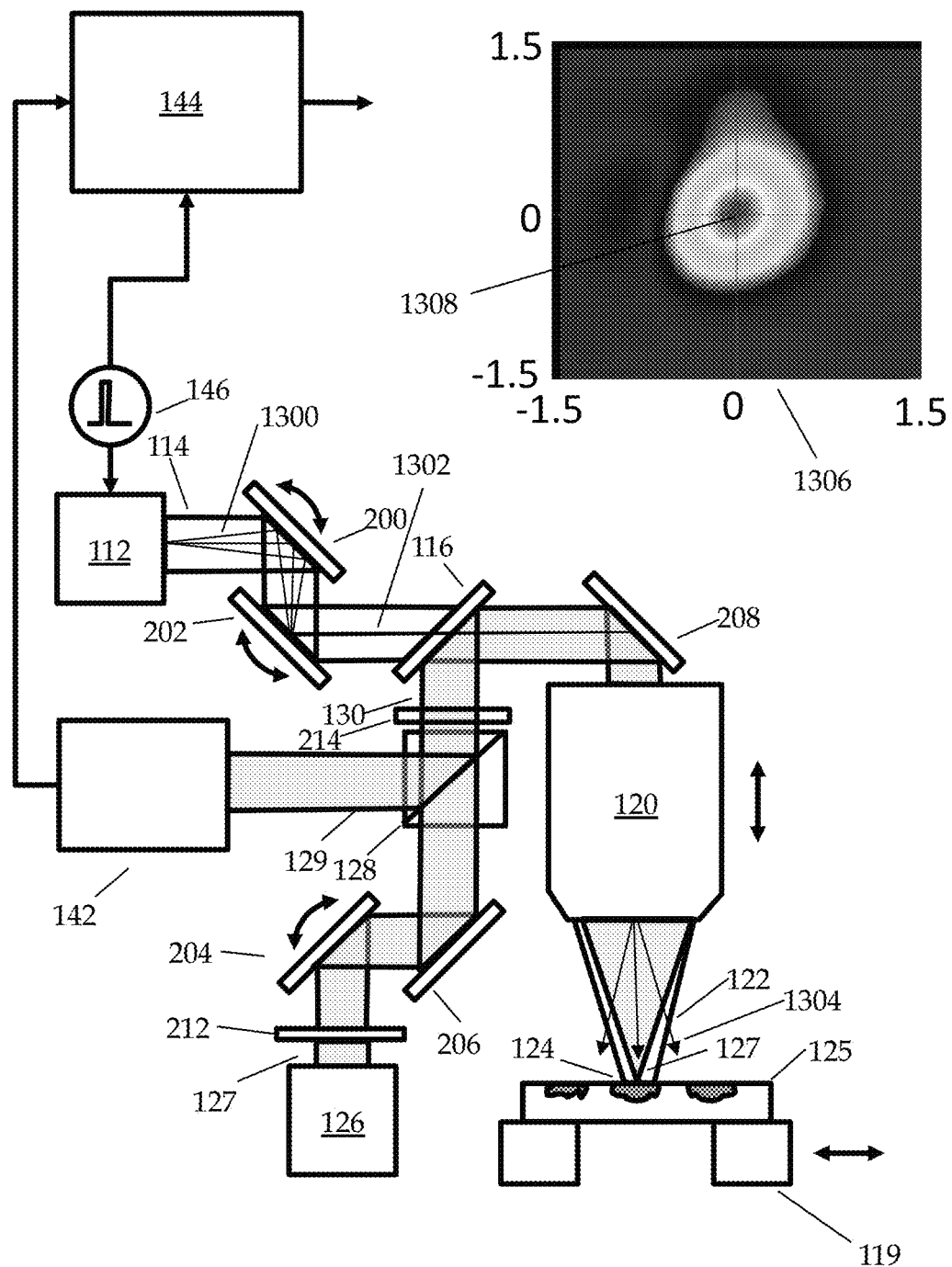
FIG. 13 is a simplified schematic diagram of a beam steering and automated optimization system according to an embodiment.

FIG. 13 is a simplified schematic diagram of one aspect of a dual-beam instrument according to an embodiment. In embodiments it can be desirable for the probe beam is well aligned with the IR beam, as described in more detail with respect to FIG. 4. Even as the IR beam is rapidly swept across a range of wavelengths, control of the positions of the two beams of the dual-beam system remains important. Many tunable IR sources have pointing errors that depend on wavelength and/or the thermal conditions of the IR source. This is illustrated schematically by center rays 1300 that leave the IR source 112 at different angles. Optional steering mirrors 202 and 204, as discussed earlier associated with FIG. 2 can be used to counteract these wavelength and temperature dependent pointing errors. The mirrors 202 and 203 can be for example 2 axis galvo mirror scanners, voice coil driven fast steering mirror (for example sold by Optics in Motion), piezo driven tip/tilt stages, tiltable MEMS mirrors or other devices that can change the angle of a mirror or a laser beam in response to an applied control signal, for example an applied voltage. The steering mirrors can be used to adjust the IR beam such that it is on a collinear or at least parallel path for all wavelengths within a given sweep range. This is illustrated schematically by central ray 1302 after mirror 202 where the three central rays 1300 have been corrected to once again be overlapping. To achieve this overlap the demodulated probe signal is measured as a function of the angular position of one or more steering mirror 200 and 202. The demodulated probe signal, for example produced by analyzer 144, is an indicator of the product of the IR intensity absorbed by the sample 125 times the probe beam sensitivity to this IR absorbed light. The modulated signal is generally maximized when the peak intensity of the IR beam is substantially aligned with the peak intensity of the probe beam, for example as shown in FIGS. 4A-C.

By measuring the PTP intensity as a function of steering mirror positions it is possible to sweep the IR beam emitted from the focusing optic 120 over a plurality of angles 1304 to identify the tilt angle that provide the best alignment of IR and probe beams. It is possible to construct a plot 1306 of the relative alignment by plotting the PTP intensity as a function of the mirror tilt angles (the plot shown indicates the mirror tilt angle in milliradians). This plot can be generated for any specific IR wavelength or for a plurality of wavelengths. From the plots, it is possible to select for example the peak intensity or centroids of the response peak to determine optimal mirror tilt angles for a plurality of IR wavelengths.

Based on this result, appropriate control signals can be applied to the mirrors 200/202 during the process of a spectroscopic measurement to keep the dual beams co-aligned over a range of wavelengths, for example during the process of generating a signal indicative of an infrared absorption spectrum of a region of the sample. A look-up table of mirror angles can be created that can be rapidly applied during the wavelength sweep of the IR source. IR sources are available now that can be swept over a range exceeding 1000 $cm^{-1}$ in less than a second and in fact in less than 100 msec. At 4 $cm^{-1}$ spectral resolution it may be desirable to adjust the mirror positions as much as 250 times per second for a 1 second sweep over 1000 $cm^{-1}$. Fast steering mirrors from Optics in Motion have a 3 dB bandwidth of 850 Hz, sufficient for the 4 cm-1 spectral resolution, especially for smoothly varying beam pointing errors are a function of wavelength. Even a large step can be completed relatively quickly, as the fast steering mirror can have a 5 msec step and settle time for a 1 mrad step. Scanning at 1000 cm$^{-1}$/sec would therefore incur at most a steering error for at most 5 cm$^{-1}$ after a steering discontinuity. Faster solutions for beam steering are also available. Tapos et al (DOI: 10.1117/12.617960) demonstrated a piezo driven fast steering mirror with a bandwidth in excess of 2 kHz. Physike Instruments manufactures a piezo tip/tilt fast steering mirror stage (model S331) with a resonant frequency of 10 kHz and a step response of 1.8 msec. Kluk et al at MIT Lincoln Labs have demonstrated a 2D fast steering mirror with sub-msec step and settle time (published as DOI: 10.1016/j.mechatronics.2012.01.008).

To provide good tracking of the heating beam position as a function of wavelength, it is necessary to synchronize the position of the fast steering mirror while the heating beam source sweeps over a plurality of wavelengths. To do this it is desirable that either the heating beam source (e.g., an IR source) or controller driving the IR source emits one or more sync signals to indicate the time at which the IR source is at a given wavelength, or after a fixed increment of wavenumber, for example every 1 cm$^{-1}$ or 5 cm$^{-1}$ etc. as desired or required to provide sufficient accuracy to control the fast steering mirror to correct the wavelength dependent beam pointing errors. Using the sync signal(s), a control waveform can be applied to the fast steering mirror to program the right amount of correction at a plurality of wavelengths in the scan while the IR source wavelength is being swept. Note that it may be desirable to apply a feed forward scheme to compensate for the finite response time of the fast steering mirrors. That is that control signal may be applied a short time before the IR laser is at a given wavelength to allow the fast steering mirror to be at the correct tip/tilt angle when the IR source reaches the given wavelength.

Another way to create a calibration trajectory for the fast steering mirror is to measure a series of IR absorption spectra on a sample as a function of mirror tip/tilt angle. Then a computational algorithm can compute the maximum amplitude for any given wavelength in the array of spectra and then from that determine the position of the fast steering mirror(s) than enabled the maximum amplitude. Then the fast steering trajectory is computed to be the set of tip/tilt values that produced the substantially maximal response at each wavelength in the absorption spectrum. The fast steering trajectory represents the set of mirror angles for a plurality of wavelengths that produce substantially the best alignment between the IR and probe beams. The fast steering trajectory can then be programmed to be supplied to the fast steering mirror(s) synchronized with the wavelength sweep, as discussed above. It may also be desirable to apply an adjustable offset to the fast steering mirror trajectory positions to compensate for temperature dependent fluctuations in beam pointing. For example, a sweep of the steering mirror(s) may be performed at one or a small number of wavelengths to determine an offset from an original reference position. This offset can then be applied to other wavelengths in the steering mirror trajectory without the need to recalibrate the beam angle at each wavelength. Additionally, it is possible to calibrate the beam pointing errors with temperature and then apply offset corrections based on a measured temperature of the IR laser and/or any associated mounting structure and optical elements involved in the beam pointing. Using one or more of the steps described above it is possible to create beam steering corrections that are synchronized to the wavelength of the IR source and to acquire signals indicative of the IR absorption of the sample with very fast sweep speeds, for example in less than one second, or in less than 0.1 second.

Figure 14:
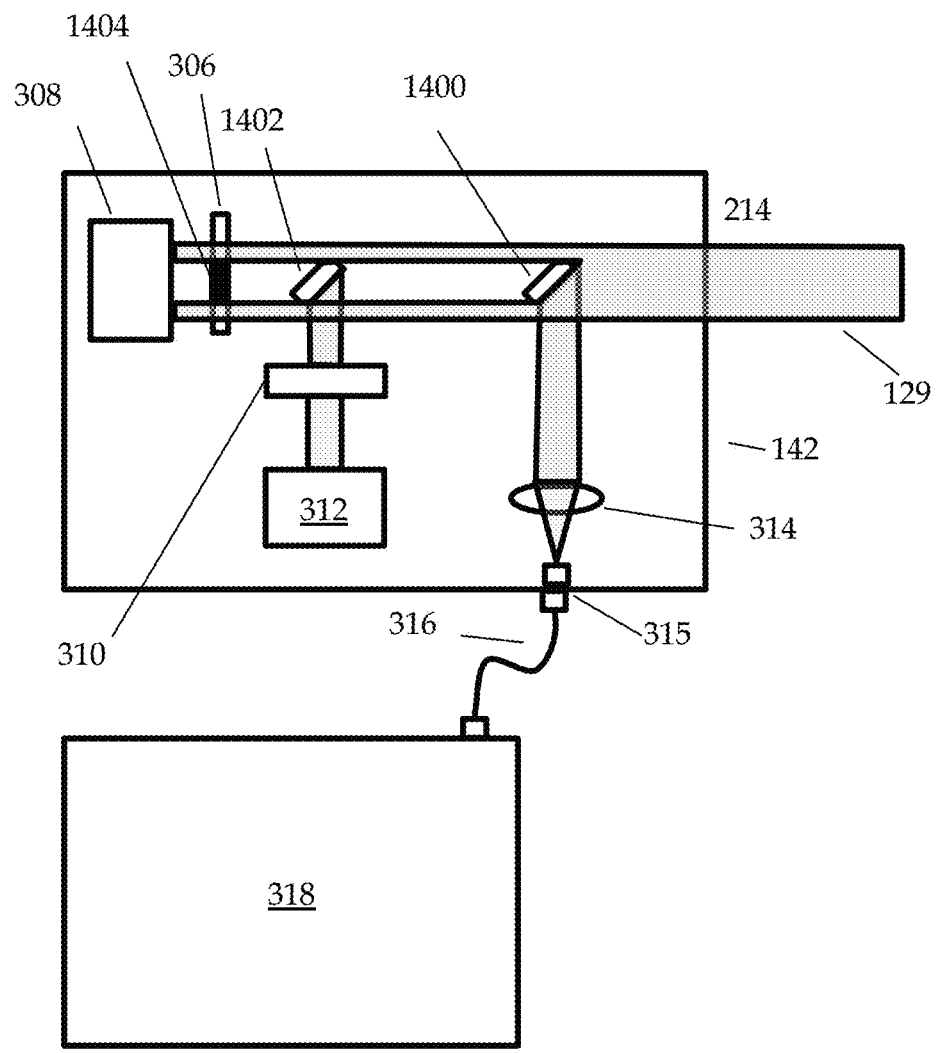
FIG. 14 is a simplified schematic diagram of a portion of a PTP system configured for selective masking of the sensing probe beam according to an embodiment.

FIG. 14 shows an embodiment of a receiver module configured to support PTP measurements with high sensitivity along with additional optical paths for Raman and/or fluorescence measurements. FIG. 14 is an expanded and somewhat modified version of a region of the region of FIG. 3 showing the receiver module 142 and spectrometer 318. For items that are the same as in FIG. 3, the same numerical callouts are used and the associated discussion from FIG. 3 apply as appropriate. In FIG. 14 the probe beam 129 is shown starting with returning from the collection optics that enters the receiver module 142. The probe light 129 can be intercepted by optional pickoff mirrors 1400 and/or 1402 that can direct a portion of the probe beam towards spectrometer 318 and/or towards fluorescence detector 310. In FIG. 3 mirrors 302 and 304 were drawn to be larger than the probe beam to have the option of directing all the probe light to the spectrometer 318, fluorescence detector 312, and/or optical detector 308. FIG. 14 shows the option of using smaller pickoff mirrors 1400 and 1402 to sample only a portion of the beam. There are two reasons for this. First, it provides one mechanism for providing parallel measurements of IR absorption and Raman and/or fluorescence by directing a portion of the collected probe light simultaneously to one or more detector/spectrometer. But more significantly, the size and placement of the pickoff mirrors is chosen to substantially amplify the sensitivity of the PTP technique. Photo-thermal distortion of the probe beam due to IR absorption tends to more significantly affect the extreme rays that strike the sample with the largest angle. The central rays that strike the sample closer to normal are more minimally affected. As such, blocking a portion of the central rays has no negative impact on the PTP sensitivity and in fact can provide an improvement in signal to noise ratio.

In some configurations, the signal to noise may be constrained by detector noise in the measurement circuit optical detector 308 and/or downstream signal conditioning or acquisition electronics. By blocking a portion of the probe beam that contributes only minimally to PTP sensitivity, the detection electronics can operate at higher gain without saturation. This increase in gain can boost the signal further above the noise floor of the detector electronics and achieve higher signal to noise ratio. Pickoff mirrors 1400 and/or 1402 can be sized specifically to block a portion of the collected probe light that does not provide a significant fraction of the rays that provide the bulk of the PTP sensitivity and then reflect that light to one or both of the Raman spectrometer 318 or the fluorescence detector 312. One or both pickoff mirrors can alternately be a dichroic mirror chosen to selectively reflect light of a target wavelength or over a specific wavelength range.

FIG. 14 also shows one embodiment of the beam shaping element 306 described in FIG. 3. In the embodiment shown the beam shaping element has an obscuration 1404 to block a portion of the probe beam with the purpose of increasing the sensitivity of the PTP measurement. Although shown in the configuration with the Raman and/or fluorescence optical paths, the obscuration feature may be used in PTP only systems as well. For example, beam shaping element 306 may have a central obscuration, for example a round opaque region or a transparent annulus that selectively blocks a portion of the probe beam that contributes minimally to the PTP sensitivity. Alternately it may block a portion of the light such that angular changes in the probe beam from sample IR absorption will result in intensity modulations at the optical detector 308. The optimal size of the central obscuration can be determined experimentally. For example, it is possible to insert an adjustable iris in the path of probe beam 129. The iris can be closed down while monitoring the strength of the PTP signal and/or the PTP signal to noise ratio. The iris can be closed down until there is a certain threshold loss of PTP sensitivity or SNR. At this point it can be determined that most of the PTP sensitivity is delivered by extreme probe rays that are outside the diameter of adjustable iris. By then creating a central obscuration that blocks an area substantially similar to the current iris diameter will provide substantially maximal PTP sensitivity and/or SNR. The central obscuration may be a simple disc for example that is substantially opaque at the wavelength of the probe beam and is supported by thin support(s), e.g. so called "spider legs" that block a minimal amount of the desired extreme rays of the probe beam. Alternately the obscuration may be an opaque or reflecting mask on an otherwise transparent substrate, for example a metal or ink coating on a glass substrate. Alternately the beam shaping element may have a more complicated shape, for example a transparent annulus in an otherwise opaque or reflective substrate. For example, Thorlabs sells annular aperture obstruction targets that have pinholes in a variety of sizes with a central obscuration in the center of the pinhole. For these targets, it may be desirable to additionally shape the probe beam with focusing optics (not shown) to size the beam appropriately relative to the annulus and central obstruction.

Auto-Optimization

As can be seen by some of the embodiments of in this specification, it is possible for a PTP system to have a very large number of degrees of freedom that can require adjustment or optimization. For example, the IR power, the probe beam power, the position of the focusing objective, the position of the collection optic (if used), the relative alignment of the IR and probe beams to the focusing optic and the relative alignment of the IR and probe beam to each other are all critical parameters that need to be carefully optimized. If not optimized it is possible to have a compromised signal to noise or even no signal. The large number of degrees of freedom could make it daunting or impossible for a user of limited skill to perform successful PTP measurements. In various embodiments, different techniques are used to automate the optimization of the PTP technique. Some of these have already been described in part, for example associated with beam steering and IR/probe beam overlap. Some other techniques used for automated optimization are discussed below.

Avoiding Sample Damage.

One challenge associated with PTP measurements is optimizing the signal strength without damaging the sample. To maximize the PTP signal strength it can be desirable to increase the laser power of the IR beam and/or the probe beam. The limit to which the power can be adjusted depends on the absorptivity of the sample at the IR and probe wavelengths, along with the sample damage threshold. There are several ways to maximize the sensitivity while avoiding/minimizing sample damage. For example, it is possible to record the PTP sensitivity and/or SNR while increasing the optical power of at least one of the IR source and the probe beam until either (1) the sensitivity/SNR reaches a maximum; and/or the (2) damage is observed in the sample. Sample damage can be observed in a number of ways. For example, it is possible to perform a spectroscopic sweep by measuring the PTP signal across a plurality of wavelengths. In the case that damage is caused by IR absorption, the damage will occur first at the strongest absorbing wavelengths. Sample damage can be detected by observing non-linearities and/or discontinuities in the spectra. For example, when some materials reach a sufficiently elevated temperature they can undergo a glass to rubber transition, resulting is a significantly larger thermal expansion coefficient and hence a substantially larger change in the index of refraction with temperature do/dT. In practices this can mean that strong absorption peaks can look out of proportion to weaker peaks compared to the same measurements performed with lower IR laser intensity. So, it is possible to calculate for example the ratio in amplitude between a major peak and a minor peak. If that ratio changes abruptly at elevated IR laser powers, it can indicate that the sample is being damaged at the stronger absorption peaks and that lower laser power should be used. Other samples may be melted and/or burnt at elevated temperatures resulting from excessive laser power. These effects can also be detected via distortions and/or discontinuities in the PTP IR absorption spectra. For example, one can measure a series of spectra at increasing laser power. By plotting the amplitude of one or more absorption peaks as a function of laser power the onset of damage can be indicated with a nonlinear response of PTP signal intensity versus laser power, a drop in response, a discontinuity, and/or an irreversible change in the peak intensities or spectral quality. Detecting the onset of any of these conditions can establish a damage threshold that can be used to constrain the laser power. It is also possible to use a video optical microscope with an image compare algorithm. For example, a series of optical microscope images can be obtained with increasing laser power of either the IR beam or the probe beam power. Each subsequent image can be compared to one or any of the images prior. An image compare algorithm can look for differences between the images that are indicative of potential sample damage. For example, static images of the same locations measured below the damage threshold should have substantially no differences except due to camera noise. So, subtracting two images without intervening damage should show minimal difference. But after even subtle sample damage occurs, the image subtraction will reveal a difference zone associated with thermal changes to the sample. This process can be performed automatically by rapidly taking an image alternating with an exposure of increasing IR and/or probe beam power and damage thresholds can be determined for each wavelength range. It is possible to then use these thresholds to dynamically maximize the PTP sensitivity and/or SNR even as a function of wavelength. For example, it is possible to increase the laser power at weakly absorbing wavelengths and reduce the power at strongly absorbing wavelengths. Alternately, it is possible to dynamically reduce the probe beam power at strongly absorbing wavelengths and vice versa.

It is also possible to infer the sample damage threshold by observing the thermal IR radiation emitted from the sample. As the temperature of a sample increases, it emits an increasing amount of IR radiation and the center wavelength of the emission changes in accordance with Planck's law. From the intensity and/or center wavelength of the emitted IR radiation it is possible to estimate quantitatively the temperature of regions of the sample that are illuminated by the IR and probe beams. The temperature can be compared against known or experimentally determined sample threshold temperatures that cause an unwanted material changes. For example, IR and probe beam intensities can be maintained below material transition temperatures for example associated with glass-to-rubber transitions, melting, decomposition, desorption, etc. The sample IR temperatures from thermal radiation emission can be determined for example with an IR detector, an IR camera, and/or an IR spectrometer to measure the intensity and/or center wavelength of the IR emission. While this IR temperature measurement will in general be performed with diffraction limited spatial resolution, it is still possible to use such measurements to infer the maximum temperature within the illuminated volume.

Figure 15:
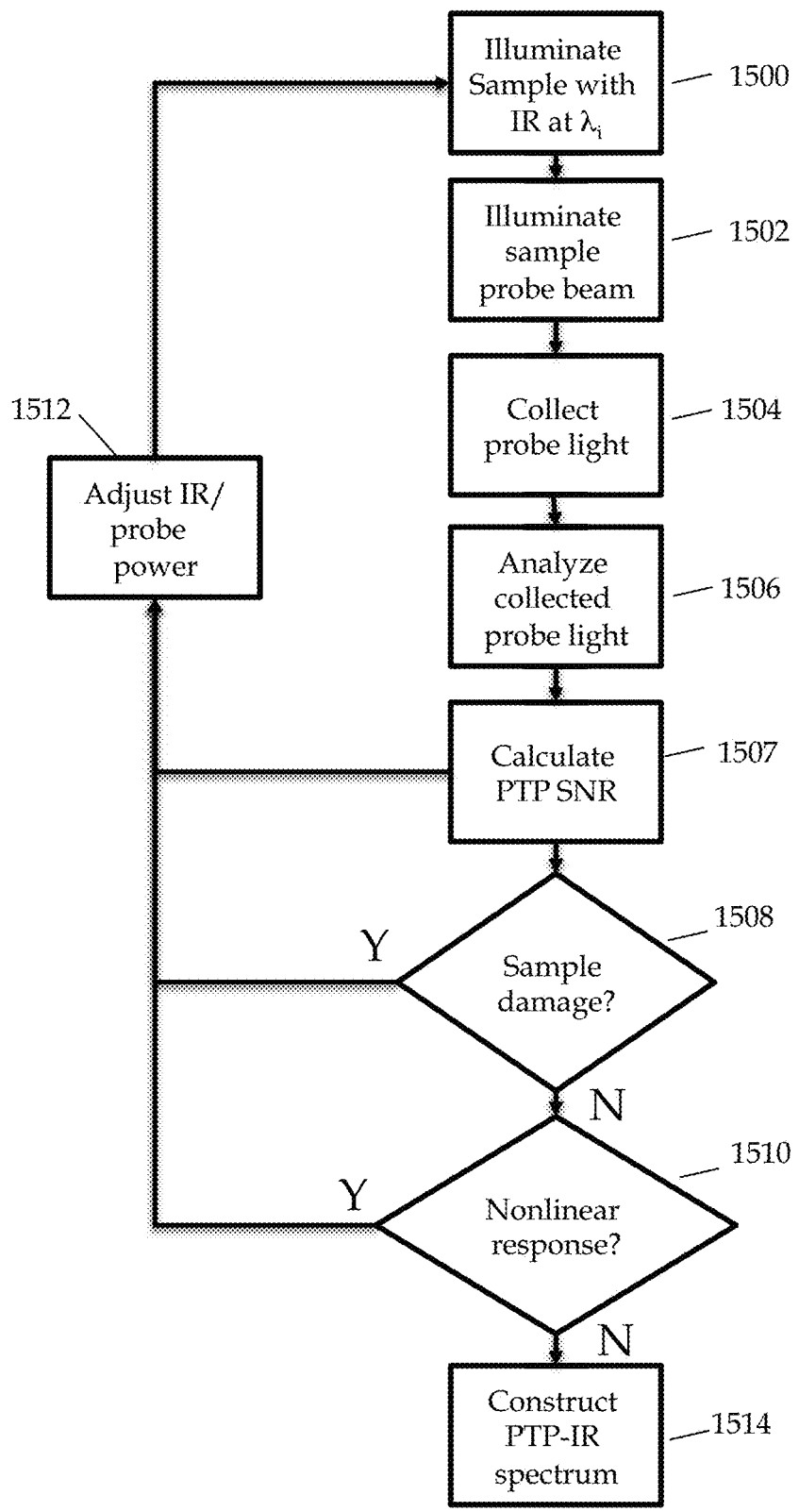
FIG. 15 shows a simplified flowchart of an embodiment for substantially minimizing sample damage and/or spectral distortion while performing a measurement.

FIG. 15 shows a simplified flow chart diagram for an embodiment of a method to obtain dual-beam data while substantially minimizing or avoiding sample damage altogether. For convenience, throughout the description of FIG. 15, the sensing beam is referred to as the "probe beam" and the heating beam is referred to as the "IR beam." At 1500, the sample is illuminated with the IR beam at a wavelength $\lambda_i$ or over a plurality of wavelengths as described previously. The sample is also illuminated with the probe beam (1502) and the probe light is collected (1504) and analyzed/demodulated as described previously associated with FIG. 1B and related figures.

At 1507, the probe response as a function of wavelength or at a fixed wavelength can be analyzed to determine a signal indicative of the signal to noise ratio (SNR) of the PTP measurement. The IR and/or probe power can be iteratively adjusted (step 1512) to substantially maximize the PTP signal strength. At 1508, the sample is optionally analyzed for signs of damage via one or more of the methods described above or similar/equivalent techniques for identifying overheating, burning, decomposition, and/or melting of the sample. If damage is detected (the Y branch), the IR and/or probe power is reduced (1512) and 1500-1508 can be repeated. If no damage to the sample is detected or 1508 is omitted, the probe response can be analyzed for a nonlinear response (1510). By nonlinear response, it is meant, for example, that for a given increment in probe power the PTP signal does not increase proportionately. For example, it may respond super-linearly if the sample temperature has exceeded a glass transition or phase transition causing a dramatic increase in thermal expansion coefficient and/or do/dT. The PTP signal may instead decrease with increasing laser power if the sample damage results in a change in the material conformation, or at the onset of dissociation, desorption, ablation and/or other damaging effects.

A nonlinear response can also be detecting by comparing peak ratios at different IR absorption bands. If for example the peak ratio changes between the amplitude of two or more absorption peaks as a function of incident laser power, it can indicate a chemical change in the sample. If any of these nonlinear responses is detected, the IR power can also be adjusted and steps repeated as with the sample damage condition. If no nonlinear response is detected and/or one or both tests are omitted, the system can produce a PTP-IR spectrum of one or more regions of the sample. All of these steps can proceed in an automated manner without need for user intervention, in an embodiment.

Surface Tracking.

Figure 16A:
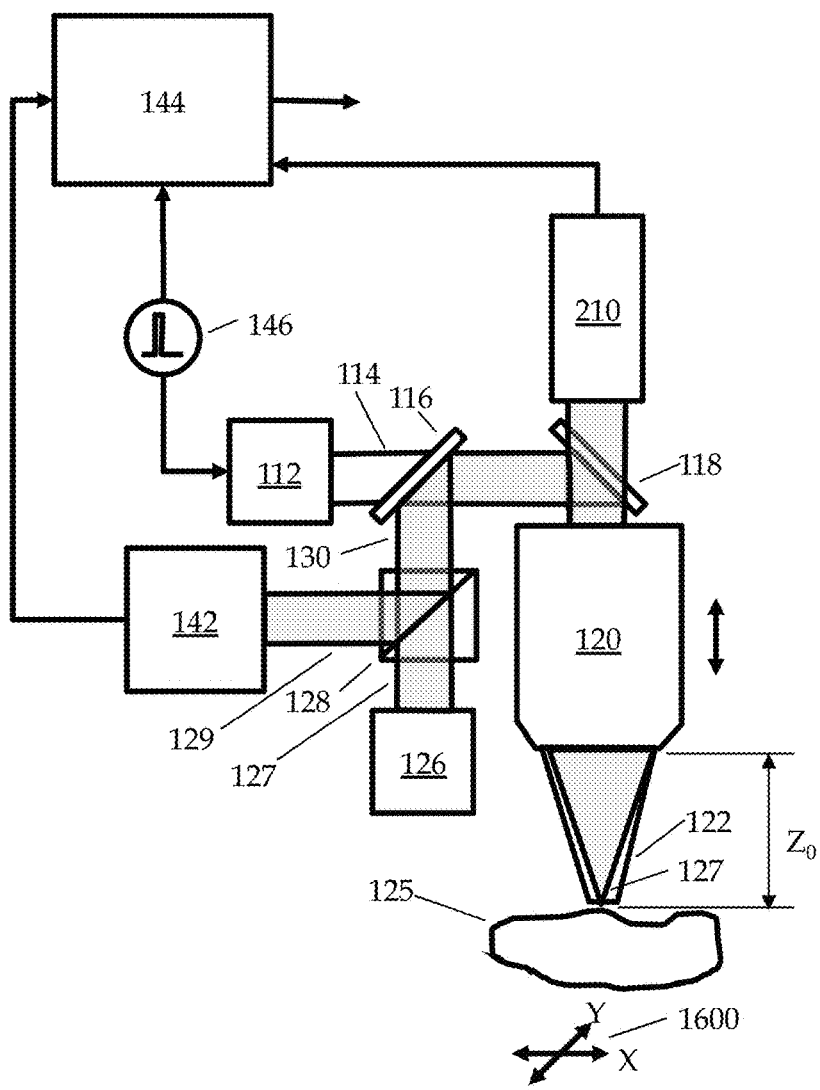
FIGS. 16A, 16B, and 16C are simplified schematic diagrams of an embodiment configured to map the topography of a sample.
Figure 16B:
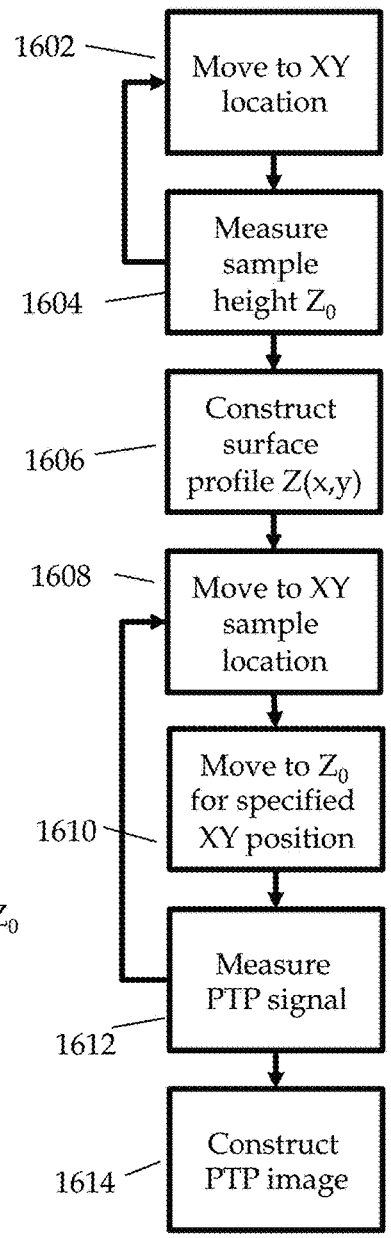
Figure 16C:
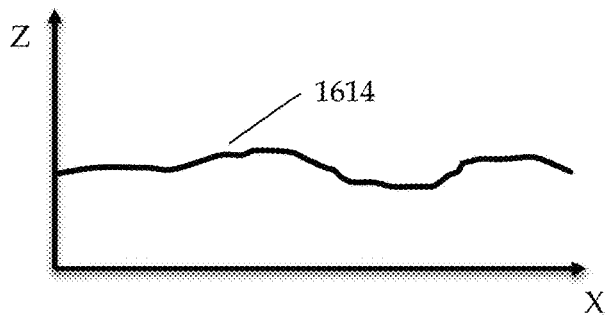

Because of the small depth of focus, PTP measurements on rough and/or highly curved samples may be a challenge as the PTP signal can dramatically decrease as the sample surface moves out of the plane of focus of the probe beam. To overcome this issue, it is possible to dynamically adjust the focus of the probe beam in response to the sample profile. FIGS. 16A, 16B, and 16C relate to this issue. FIG. 16A is based on FIG. 1 and common elements share the reference numerals from FIG. 1 and the associated description applies to those components.

As before, IR and probe light is focused on sample 125 and it is desired to measure the PTP response is measured at a plurality of sample of locations. To accommodate for non-flat surface profile of sample 125, a measurement is made of the position of the sample surface under the focusing optic 120 to determine a relative distance $Z_0$ from some reference position within the system. This can be achieved using the process shown in FIG. 16B. At 1602, the sample is positioned at an XY location corresponding to a region of interest. At 1604, the relative sample height $Z_0$ is measured, using for example one or more of the height measuring methods described in the next paragraph. The relative sample height $Z_0$ can either be relative to a fixed point within the system, for example a reference location of the focus optic 120 or relative to a previous measurement of sample height at a prior reference location. This process is repeated as often as desired at as many XY locations as desired. The XY locations may for example be a linear array and/or a regular grid of XY locations and/or a select set of XY locations over specific regions of interest. This sample distance $Z_0$ is measured at a plurality of locations, for example across a linear profile or at an array of X, Y locations on the sample to obtain one or more 1D surface profiles $Z_0(X)$ (1614) and/or a 2D surface contour $Z_0(X,Y)$.

After measurements of the relative sample height at a plurality of XY locations, the resulting measurements form a profile or surface (1606) that represents the variation in height of the sample. A single slice of a surface profile 1614 for example is shown in FIG. 16C. Once the desired number of XY locations are measured to create a sample height profile, this profile can be used to make optimal measurements of the PTP signal. Specifically, the sample is moved to a desired XY location (1608), the focus optic is moved to the height $Z_0$ recorded during step 1604 (1610), and the PTP signal is measured (1610). These steps are repeated for as many XY locations as desired. Then a PTP image can be created from the measurements acquired at the optimal focus positions $Z_0$.

This relative sample distance $Z_0$ can be measured in any number of ways, for example with a distance measuring interferometer, a capacitance sensor, by optical triangulation, by confocal optical microscopy, by a white light interferometer, optical autofocus, or other similar means sensitive to the surface position. Some example arrangements and relevant data are shown in FIGS. 17A, 17B and 17C as well as FIGS. 18A, 18B, and 18C. FIG. 17A shows an example of performing the measurement using a Mirau interferometer built into a specially constructed Schwarzchild objective. Light 1700 is directed through the central aperture 1702 of a primary mirror 1704 where it strikes a small secondary mirror 1706. The light from the secondary mirror is reflected to the bottom surface 1707 of the primary mirror 1704 where it is then focused on a region of interest 1710 of a sample 1712. A thin plate beamsplitter 1708 may be placed between the secondary mirror 1706 and the sample 1712. A portion of the incident light reflects off the beamsplitter 1708 and is reflected up to a reference reflector 1714 which can optionally be coincident with the back side of secondary mirror 1706. Light reflected from the reference reflector travels back to the beamsplitter 1708 where a portion of the light is reflected back along the incident beam path. This light combines with light reflected from the sample surface. These two beams, one from the sample and one from the reference reflector combined to create an optical interference. These two beams can be collected and measured by a suitable optical detector (not shown). If the optical intensity at the detector is measured as a function of the position of the Schwarzchild objective is moved vertically as shown by arrow 1714 (or equivalently the height of sample 1712 is varied), an interferogram 1714 will result.

The detailed shape of the interferogram will depend on the optical bandwidth of the light source used to illuminate the sample. In general, it is preferable to measure with a shorter wavelength, e.g., the wavelength of a probe beam, for example in the UV or visible wavelength range. For a narrowband source, the interferogram 1714 will have a generally sinusoidal shape at it is possible to interpolate the relative position of the sample to a nanometer or better. It is also possible to use a less coherent source, for example an LED or a white light source. In this embodiment, as shown in FIG. 17B, the interferogram will have an oscillating envelope with a peak 1716 corresponding to the point of greatest phase coherence and hence greatest interference. This so called "centerburst" can be used to identify an absolute position at which the surface of sample 1712 surface and the reference reflector 1714 are equidistant from the beamsplitter 1708. By measuring the position of the peak 1716 of the interferogram at a plurality of X or XY locations on the sample, it is possible to create a map of the sample height, i.e. a surface profile 1718 in FIG. 17C to use to obtain optimal measurements of the IR absorption via the PTP technique. Thus, it is possible to measure the position of the peak or center 1716 of the centerburst at plurality of locations on the sample to obtain a surface profile 1718 and then follow this surface profile 1718 during subsequent measurements of a PTP signal. It is also possible to interleave the sample height measurements and PTP measurements. For example, the sample height can be measured at each sample XY location just prior to the PTP measurement and the relative separation between the focusing optic and the sample surface can be driven to the $Z_0$ position determined just prior to the PTP measurement.

Note that the Mirau interferometer setup shown in FIG. 17A may also be used in combination with the probe beam to measure IR absorption of the sample. For example, the IR and probe beams can directed through the Schwarzchild objective with the integrated Mirau interferometer in the position of focusing optic 120 in FIG. 1B, and the resulting interfering light can be detected and measured by receiver 142 in FIG. 1B. The amplitude and/or optical phase of the interfering probe light can be indicative of the IR absorption. For example, thermal expansion of the sample due to IR absorption can cause a deformation of the reflecting surface that will result in an optical path difference between the light reflected from the sample surface versus the beamsplitter 1708. This difference can result in a change in the intensity of the light detected at receiver 142 in FIG. 1B. The detected intensity can be demodulated as described previously, by measuring an amplitude of the modulation of the intensity at a frequency corresponding to the modulation of the IR beam or a harmonic thereof. The beamsplitter 1708 can also be removable such that it is not in the beam path for PTP measurements. Beamsplitter is preferable constructed such that it is highly transmissive at IR wavelengths and partially reflective at the probe wavelengths and/or the wavelengths employed for sample height measurements.

FIG. 18A shows an alternative embodiment for rapidly measuring the profile of a sample surface in advance of a PTP measurement. FIG. 18A is similar to FIG. 17A and descriptions associated with FIG. 17A apply as appropriate. In this embodiment, a light beam 1800 is directed through the same center aperture 1702 of primary mirror 1704 as in FIG. 17A. The incoming beam strikes secondary mirror 1706 and is reflected to the bottom surface of primary mirror 1704 and then directed to a region of interest 1710 of sample 1712. The returning beam 1802 follows a path that is similar to the incoming beam, but on the opposite sides of the secondary mirror 1706 and primary mirror 1704. After passing through the central aperture the outgoing beam is reflected off mirror 1804 towards detector 1806. Mirror 1804 can be a removable mirror, an automatically rotatable mirror, or a beamsplitter. Detector 1806 may be a simple intensity detector or may also comprise a position sensitive detector. In either embodiment, as the Schwarzchild objective is moved up or down relative to the sample 1712 as indicated by arrow 1714, the position and/or intensity of the beam on 1806 can change. The system can automatically adjust the objective position to rapidly drive the objective to a height that for example gives the maximum signal on an intensity detector or reflects the light to a desired reference location on a position sensitive detector.

A related way of finding the surface height is by monitoring the DC intensity of the probe beam as a function of the objective height. For example, the probe beam that is reflected/scattered from the sample is directed towards a receiver (e.g., receiver 142 of FIGS. 1B and 16A) that can comprise an optical detector. While the AC component of this signal is analyzed by analyzer 144 in FIG. 1B, the DC component may also be used to determine the relative position of the surface to substantially maximize the PTP signal. FIG. 18B shows an example of concurrent measurements of the DC intensity 1808 of the probe beam and the PTP signal 1810 as a function of the relative position (in μm) of the focusing optic (120 in FIGS. 1B and 16A). While the DC signal 1808 has a much broader depth of focus, the centroid of the DC signal curve 1808 has substantially the same center as the PTP curve 1810. The advantage of using the DC signal is that it is many, many times stronger than the PTP signal and hence can be measured much faster. In addition, measuring the DC signal requires no knowledge of the sample, whereas to obtain a PTP signal it is necessary to tune the IR laser to an absorbing wavelength of the region of interest 1710 of the sample 1712. This can be problematic when the sample is an unknown material as it will not be clear what wavelength should be used to optimize the measurement. So, using the probe DC signal to determine the surface height first removes a degree of freedom and ensures that the PTP measurement is started at a substantially optimal focus height. Note that it also not necessary to measure a whole curve as in FIG. 18B. FIG. 18C illustrates an efficient way to quickly find the peak of the probe DC signal (or in fact the PTP signal) by sampling only a few points. FIG. 18C illustrates performing a measurement of the DC signal at a select few points, in this example 3 points, and then using these three points to fit a parabola or other curve 1814 to the measured data. (A parabola can be fit to 3 points algebraically with no need for iterations.) From the fit it is possible to determine the peak position $Z_0$ 1816 of the probe DC signal and then use this $Z_0$ position to perform PTP measurements at this location on the sample. And as described above, this process can be repeated at a plurality of locations on the sample to make a map of the surface variation across regions of interest of the sample to enable optimal PTP measurements at those sample locations.

Figure 19A:
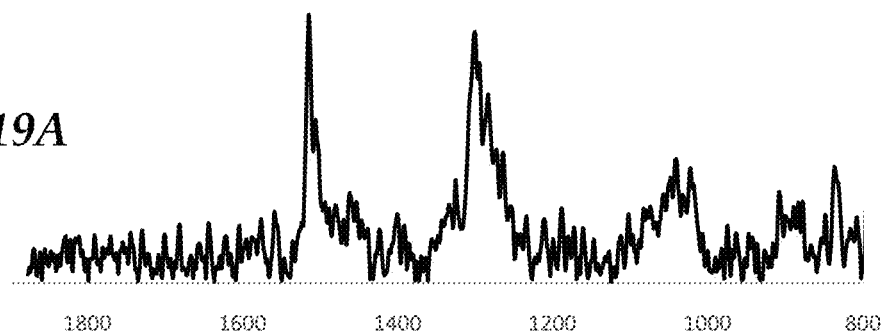
FIGS. 19A, 19B, and 19C show example transmission spectra.

Under the embodiments described, it is possible to use the PTP device to perform high quality measurements of IR absorption spectra of materials with a signal to noise ration (SNR) of greater than 20 with a measurement time of 1 second per spectrum or less, while achieving a with a spatial resolution well below the diffraction limit of mid-IR light, specifically less than 1 μm. FIG. 19A shows an example of a single spectrum obtained with 1 second acquisition time over the wavenumber range from 765 cm-1 to 1868 cm-1 with a SNR of 21 on a sample of epoxy. This spectrum was obtained using a Block LaserTune QCL operating at a repetition rate of 96.5 kHz in reflection mode (as shown in FIG. 3). The probe beam was collected with an amplified Thorlabs silicon photodetector with variable gain, and the PTP signal was demodulated with a Zurich Instruments HF2LI lock-in amplifier using the QCL pulse signal as a reference. The PTP signal was demodulated with the lock-in using a 1 msec time constant. The Block QCL was set to operate in continuous sweep mode with 1 second spectrum time and 0.3 sec time to return to the starting wavelength of the next spectrum. Data was transferred from the lock-in every 0.5 cm$^{-1}$. No additional signal processing has been applied, i.e. no averaging, smoothing, etc. and the spectrum has not been corrected for the QCL power background. The spectrum was acquired with the sample and IR beam path in open air, so IR absorption bands associated with $CO_2$ and water vapor absorption can be present. These absorptions can be largely eliminated by enclosing the system in an enclosure that is purged with dry nitrogen, an inert gas, and/or exposed to a desiccant.

Figure 19B:
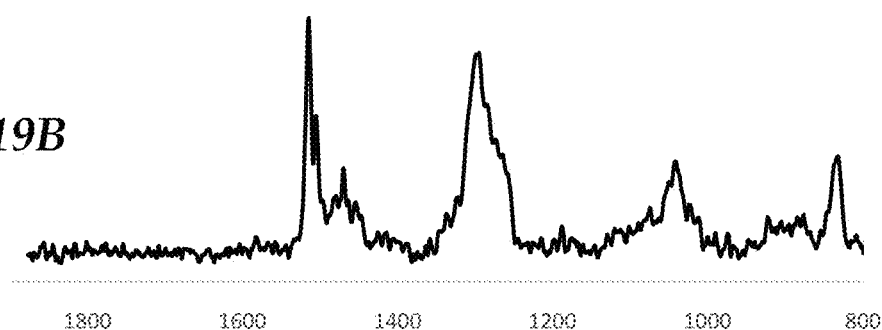
Figure 19C:
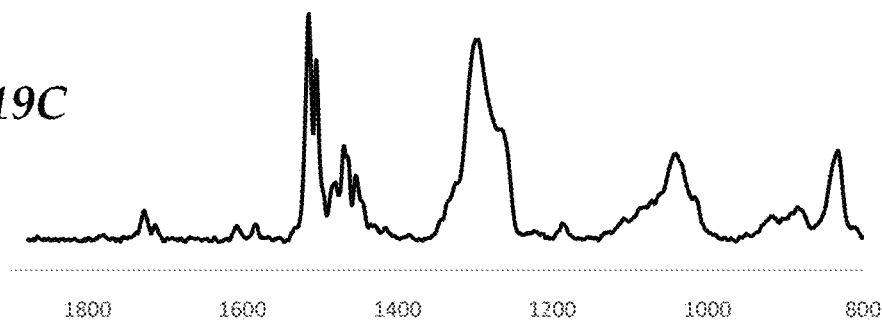

The signal to noise was calculated by determining the ratio between the peak height for the maximum absorption band divided by the RMS noise in a non-absorbing region of the spectrum. Using these operating conditions, it is possible to perform a hyperspectral array of 50×50 PTP-IR spectra in less than 1 hour over a region of more than 1000 cm$^{-1}$ with a spectral resolution of better than 1 cm$^{-1}$. Faster hyperspectral arrays can be achieved with faster spectral sweep speeds, for example down to 100 msec, using bi-directional sweeps, i.e. acquiring data in both the forward and reverse wavenumber sweeps. Higher signal to noise can be achieved by averaging multiple spectra, using longer sweep times with longer lock-in time constants, and/or using longer lock-in time constants at the cost of spectral resolution. FIGS. 19B and 19C shows the averages of 10 spectra and 244 spectra respectively measured in a plurality of locations on epoxy regions from a hyperspectral array as described above. The SNR for the 10 spectra is 76. It is equivalently possible to obtain a similar or better SNR from a 10 second acquisition time at a single point on a sample. The SNR for the spectrum in FIG. 19C is 269. Note that these spectra were obtained on the block face (top surface) of a microtomed sample in reflection. Thin sectioning was not required. Note also that the spectra, while these PTP measurements were obtained in reflection, they are substantially free of reflection-based spectral distortions that common to measurements performed by conventional FTIR spectroscopy measurements performed in reflection mode.

Depth profiling. It is also possible to use the PTP technique for sub-surface depth profiling. The PTP signal primarily comes from a small region centered around the focus of the probe beam, from a volume enclosed within the depth of focus of the PTP beam. A confocal aperture can be placed in the PTP beam path to block light that does not pass through this depth of focus volume. The IR absorption through the depth of a sample can therefore be determined by scanning the focus of the probe beam relative to the sample surface. Because the PTP apparatus can also perform confocal Raman measurements using a Raman spectrometer in or connected to one or more of the receiver modules, this apparatus enables simultaneous or sequential IR and Raman depth profiling on the same regions of the same sample. This provides an unparalleled capability to perform correlative measurements between Raman and IR spectroscopy.

Figure 20:
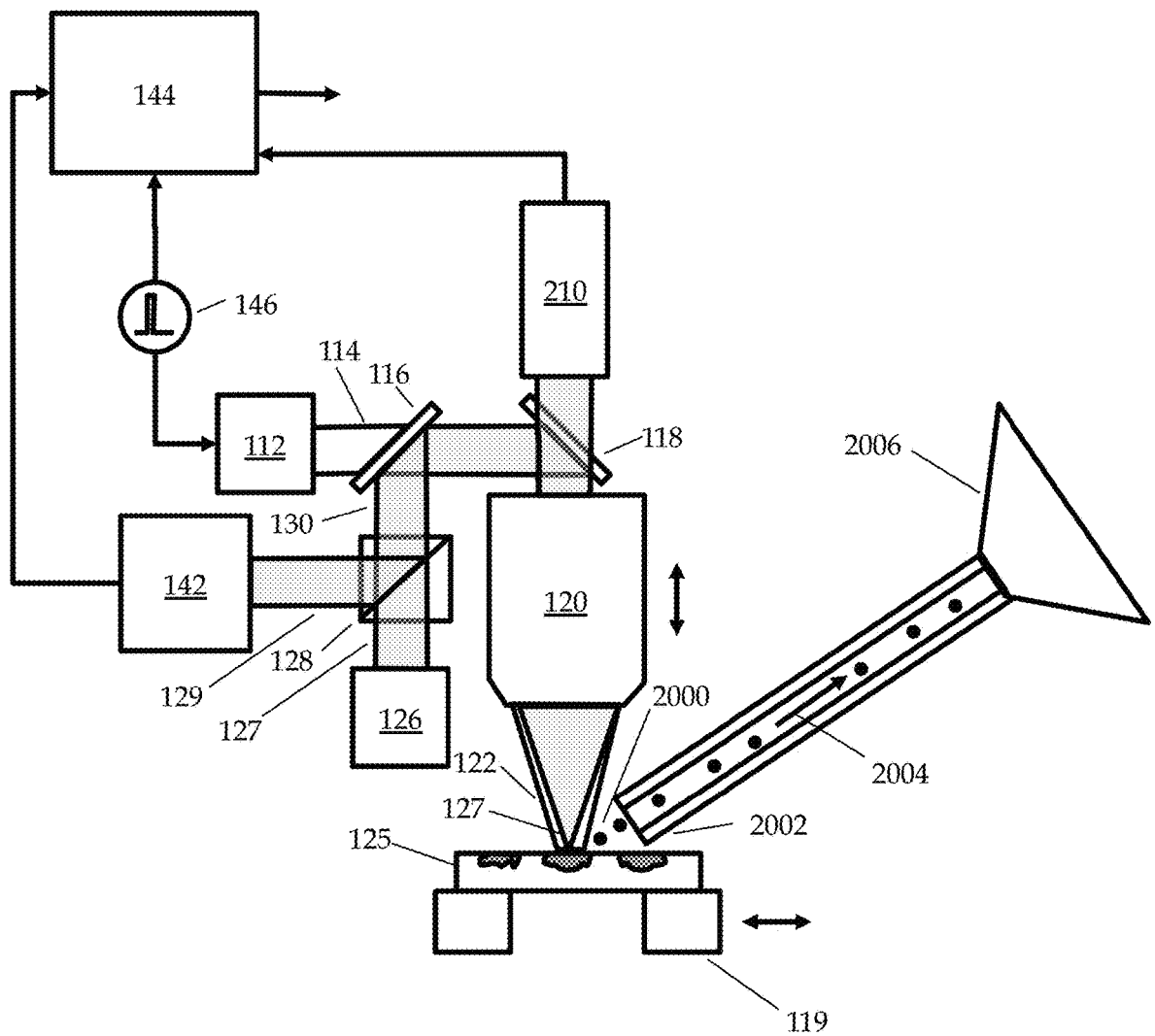
FIG. 20 shows a simplified schematic diagram of a combined sensing and heating system with an atmospheric sampling laser desorption mass spectrometry system.

FIG. 20 shows a simplified embodiment combining PTP measurements with thermal desorption mass spectrometry. FIG. 20 is similar to FIG. 1B and FIG. 2, and where common callouts are used, the discussion associated with FIGS. 1B and 2 applies as appropriate. In FIG. 20 the IR beam 122 and/or probe beam 127 may be supplied with sufficient intensity to thermally desorb and/or ablate material 200 from the surface of sample 125. Desorbed/ablated material 2000 can be captured by a capillary 2002 or other collection device and transferred in the direction of arrow 2004 to the inlet of a mass spectrometer 2006. The desorbed/ablated material may also be ionized prior to introduction into the mass spectrometer, for example using atmospheric pressure chemical ionization (APCI), electrospray ionization (ESI), or any other desired ionization technique. Other fragmentation/separation techniques may be applied as common with mass spectrometry. In the end, the desorbed/ablated sample material can enter one or more mass analyzer to determine the distribution of molecular masses/mass fragments in the desorbed/ablated mass stream. From this it is possible to determine the chemical makeup of the sample using a diverse set of techniques, including IR absorption, Raman, fluorescence, and mass spectrometry.

Figure 21:
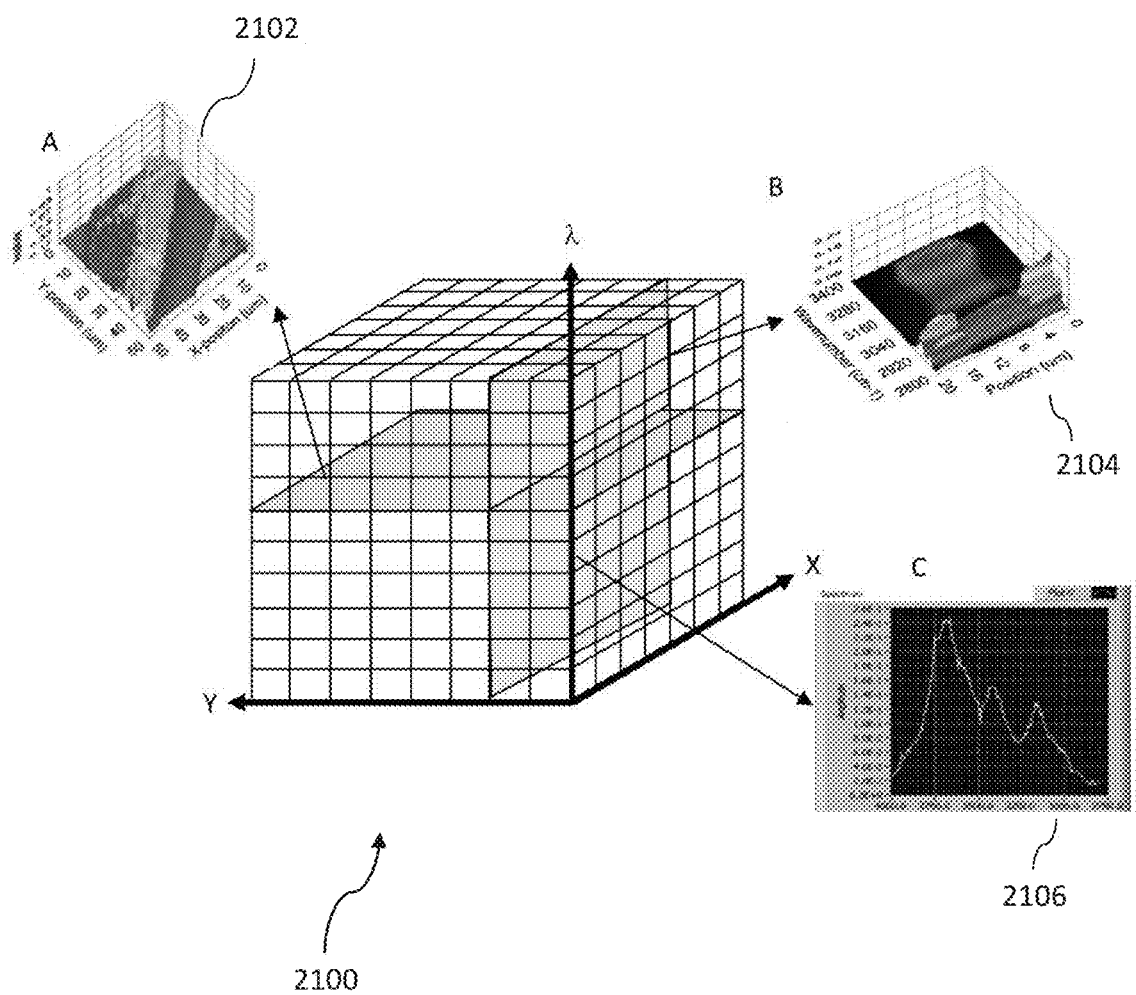
FIG. 21 is a schematic of a spectral cube according to an embodiment.

FIG. 21 is an illustration of a hyperspectral cube 2100 according to an embodiment. Hyperspectral cube 2100 is a variation on a conventional system for depicting sensed optical data. Hyperspectral cube 2100 includes an x axis, a y axis, and a X axis. The x and y axes correspond to positions on a sample of interest. In embodiments, a dual-beam measurement is taken of the sample at a particular x and y Cartesian coordinate. That location can be probed for optical properties at a particular wavelength. The cube is formed by probing for optical properties at each of a series of wavelengths along the λ axis, or equivalently at a series of wavenumbers Compared to conventional systems, the dual-beam system described above provides for significantly higher resolution along both x and y axes. Whereas conventional IR systems might have resolution down to on the order of 1 μm, the systems described herein can have resolution down to hundreds nanometers. By using low wavelengths or interference as described in FIG. 4, the resolution can be enhanced even further to provide for resolution down to 10 nm or shorter when combined with AFM-IR measurements. Furthermore, this improvement in spatial resolution along the x and y axes does not correspond to any decrease in resolution in the λ axis, and the same wavelengths of interest can be probed with the heating beam to sense IR spectroscopy data or Raman spectroscopy.

Each layer 2102 within the spectral cube 2100 corresponds to an absorption of a particular wavelength as a function of position. As shown in layer 2102, absorption at a particular wavelength follows several bands throughout the x-y plane in that particular layer. Layers can indicative of a material of interest, for example where the material of interest has strong or weak absorption characteristics at a certain wavelength. Likewise, each plane 2104 in the y-λ plane can be used to point out bands in the x axis. Similar planes could be constructed in the x-λ plane to sense bands in the y axis. Each column within the spectral cube 2100 contains spectral profile 2106. That is, at any particular position, the absorption spectrum of the material at each wavelength extends along the λ axis. In the illustration of FIG. 21, the data used is from an AFM-IR measurement, but all of the techniques described above apply similarly for PTP measurements.

Figure 22:
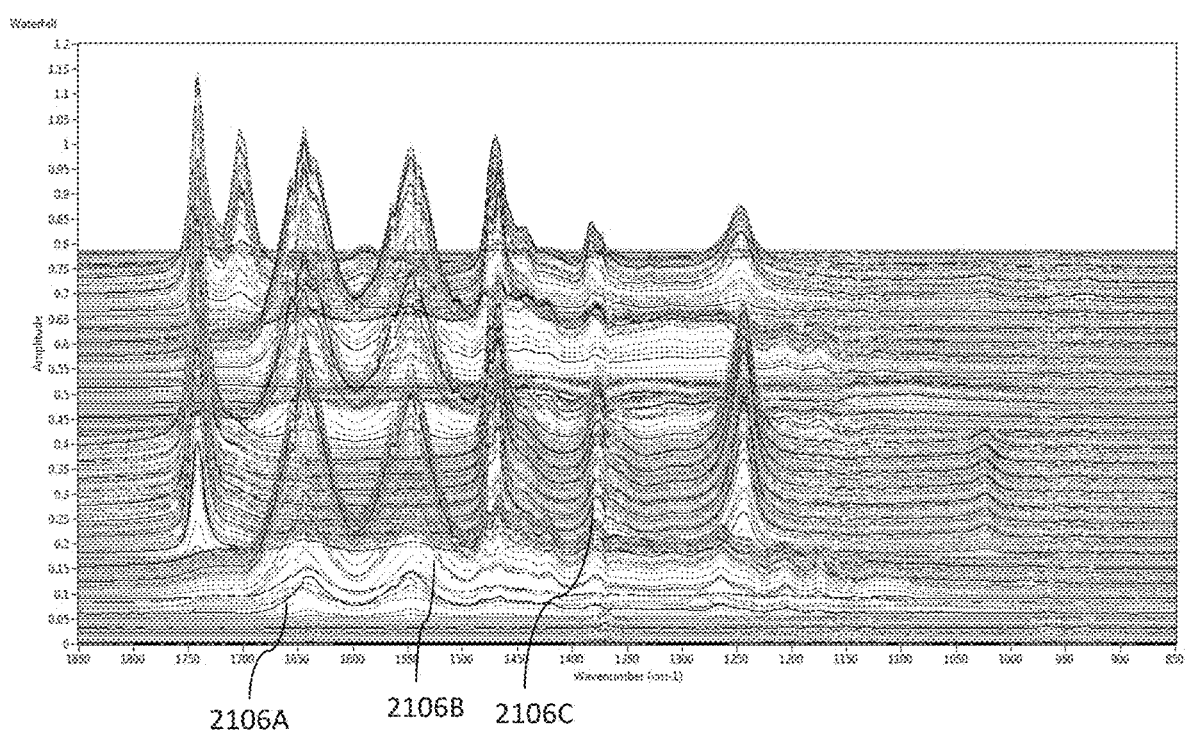
FIG. 22 depicts IR absorption across a cross-section of a sample measured according to an embodiment.
Figure 23:
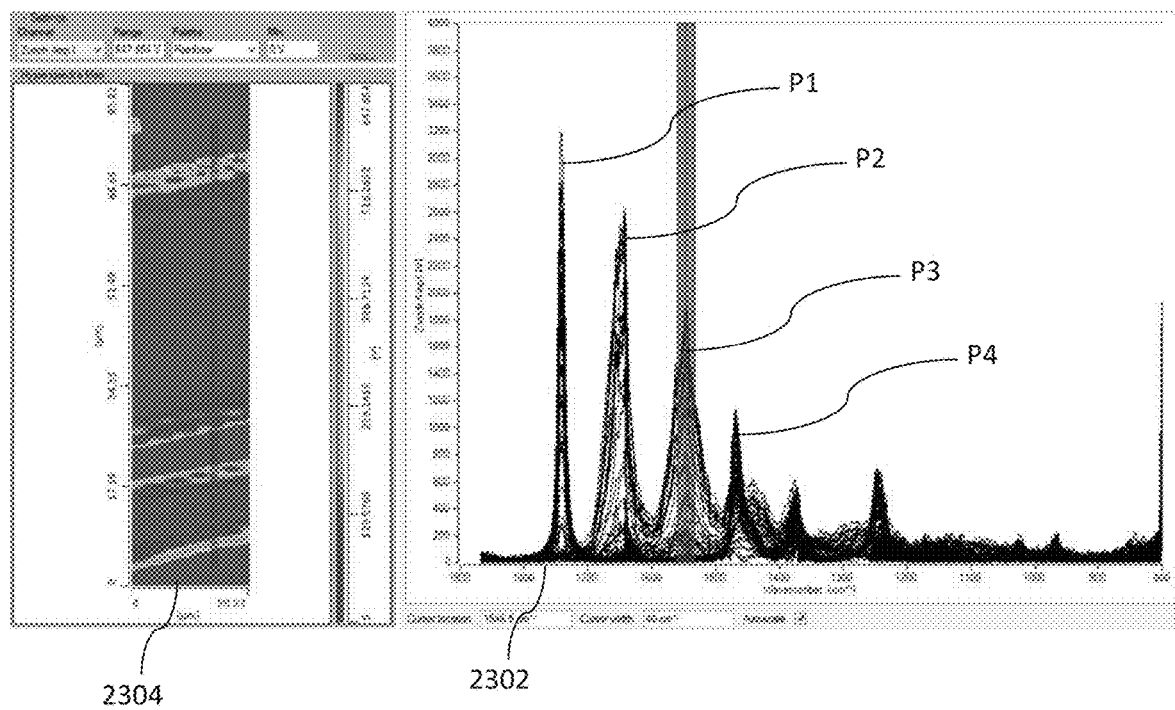
FIG. 23 is a cross-sectional view depicting locations of substances of interest in a sample according to an embodiment.

FIG. 22 shows a plurality of such spectra, three of which are numbered 2106A, 2106B, and 2106C. These spectra were acquired in a line spectral array, i.e. a series of spectra accumulated at successive locations across a sample in a linear array. The curves shown in FIG. 22 are absorption as a function of wavenumber. The peaks in each line correspond to molecular absorption peaks. It is possible to use such a linear spectral array to identify the chemical composition of material components and the key absorption peaks associated with the material components. To determine the location of a material of interest, an operator of a dual-beam system could determine the spatial location where one or more peaks of interest shown in FIG. 22. It is then possible to use the knowledge of the absorption peak locations to perform chemical imaging in the x-y plane at absorption peaks of interest, as shown in FIG. 23. Such information can also be obtained from the hyperspectral cube 2100 in FIG. 21, i.e. identifying absorption bands and then determining where it would be beneficial to conduct a scan and determine which regions absorb at those wavelengths/wavenumbers.

FIG. 23 is an example of a selection of a λ or wavenumber that can be used to detect the location of a substance. As shown in the absorption spectrum 2302, peaks P1, P2, P3, and P4 exist corresponding to a material of interest. An operator can select one of these peaks for further analysis. Here, peak P3 has been selected. A sample can be scanned for absorption at that peak, as shown at 2304. Bands indicative of high absorption within that wavelength correspond to areas of high concentration of the material of interest (or vice versa, depending on whether an absorption peak or transmission peak is selected).

In embodiments, the absorption spectrum 2302 can be taken from a database of known materials, or alternatively it can be measured from the sample or a reference material. Once a peak is selected, absorption can be measured using a scanning mode across the sample, or it can be determined according to the "snapshot" or image capture embodiments described in more detail above.

Figure 24:
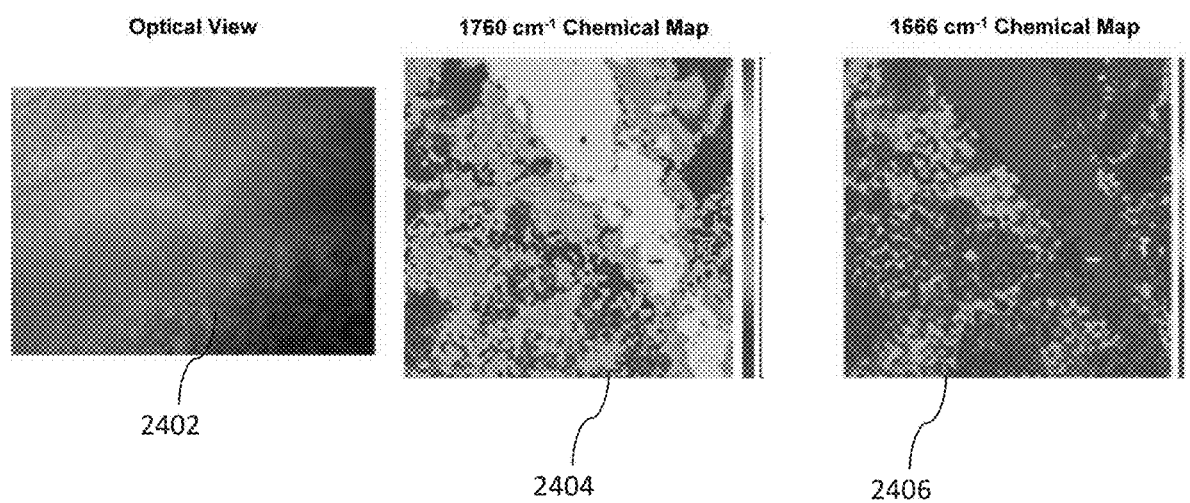
FIG. 24 depicts examples of three x-y scans corresponding to particular wavelengths/wavenumbers

FIG. 24 depicts examples of three x-y scans corresponding to particular wavelengths/wavenumbers First x-y scan 2402 is an optical view of a sample. Second x-y scan 2404 is an absorption spectrum at 1760 $cm^{-1}$, which has been identified as a wavelength of interest for detecting a substance. Third x-y scan 2406 is an absorption spectrum at 1666 $cm^{-1}$, which has also been identified as a wavelength of interest for detecting the substance. The comparison of second x-y scan 2404 and third x-y scan 2406 can show the position of material that absorbs at both wavelengths, just 1760 $cm^{-1}$, and just 1666 $cm^{-1}$. Based on this comparison, the location of specific materials that absorb at each wavelength can be resolved. The embodiments described herein are exemplary. Modifications, rearrangements, substitute processes, alternative elements, etc. may be made to these embodiments and still be encompassed within the teachings set forth herein. One or more of the steps, processes, or methods described herein may be carried out by one or more processing and/or digital devices, suitably programmed.

Depending on the embodiment, certain acts, events, or functions of any of the method steps described herein can be performed in a different sequence, can be added, merged, or left out altogether (e.g., not all described acts or events are necessary for the practice of the algorithm). Moreover, in certain embodiments, acts or events can be performed concurrently, rather than sequentially.

The various illustrative logical blocks, optical and control elements, and method steps described in connection with the embodiments disclosed herein can be implemented as electronic hardware, computer software, or combinations of both. To clearly illustrate this interchangeability of hardware and software, various illustrative components, blocks, modules, and steps have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks and modules described in connection with the embodiments disclosed herein can be implemented or performed by a machine, such as a processor configured with specific instructions, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor can be a microprocessor, but in the alternative, the processor can be a controller, microcontroller, or state machine, combinations of the same, or the like. A processor can also be implemented as a combination of computing devices, e.g., a combination of a DSP and a microprocessor, a plurality of microprocessors, one or more microprocessors in conjunction with a DSP core, or any other such configuration.

The elements of a method, process, or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of computer-readable storage medium known in the art. An exemplary storage medium can be coupled to the processor such that the processor can read information from, and write information to, the storage medium. In the alternative, the storage medium can be integral to the processor. The processor and the storage medium can reside in an ASIC. A software module can comprise computer-executable instructions which cause a hardware processor to execute the computer-executable instructions.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements, and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," "involving," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y or Z," unless specifically stated otherwise, is otherwise understood with the context as used in general to present that an item, term, etc., may be either X, Y or Z, or any combination thereof (e.g., X, Y and/or Z). Thus, such disjunctive language is not generally intended to, and should not, imply that certain embodiments require at least one of X, at least one of Y or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of Section 112, sixth paragraph of 35 U.S.C. are not to be invoked unless the specific terms "means for" or "step for" are recited in a claim.

While the above detailed description has shown, described, and pointed out novel features as applied to illustrative embodiments, it will be understood that various omissions, substitutions, and changes in the form and details of the devices or methods illustrated can be made without departing from the spirit of the disclosure. As will be recognized, certain embodiments described herein can be embodied within a form that does not provide all of the features and benefits set forth herein, as some features can be used or practiced separately from others. All changes which come within the meaning and range of equivalency of the claims are to be embraced within their scope.

The invention claimed is:

1. A method for analyzing a sample with a photothermal microscope, the method comprising:
   (a) illuminating a region of the sample in the photothermal microscope with a light beam of infrared radiation;
   (b) illuminating at least a sub-region of the region of the sample in the photothermal microscope with a probe light beam, the probe light beam having a shorter wavelength than the light beam of infrared radiation;
   (c) analyzing probe light collected from the sample to obtain measurements indicative of infrared absorption of the sub-region of the sample; and
   (d) analyzing probe light collected from the sample to obtain measurements indicative of Raman scattering of the sub-region of the sample.

2. The method of claim 1 wherein (c) and (d) are performed substantially simultaneously.

3. The method of claim 1 wherein (a)-(d) are repeated at a plurality of wavelengths of the beam of infrared radiation.

4. The method of claim 3 further comprising generating a spectrum of infrared absorption by the sub-region of the sample.

5. The method of claim 1 further comprising analyzing probe light collected from the sample to construct a signal indicative of fluorescent response of the sub-region of the sample.

6. The method of claim 1 wherein the probe light is collected with an optical detector.

7. The method of claim 1 wherein the probe light is collected with at least one of (i) an array detector and (ii) a video camera.

8. The method of claim 1 wherein the probe light is collected in a transmission configuration in which a detector collects probe light that has passed through the sample.

9. The method of claim 1 wherein the probe light is collected in a reflection configuration in which a detector collects probe light that is reflected and/or backscattered from the sample.

10. The method of claim 1 wherein measurements of IR absorption and Raman scattering are performed on substantially the same region of the sample.

11. A method for analyzing a sample with a photothermal microscope, the method comprising:
    (a) illuminating a region of the sample with a light beam of infrared radiation;
    (b) illuminating at least a sub-region of the region of the sample with a probe light beam having a shorter wavelength than the light beam of infrared radiation;
    (c) analyzing probe light collected from the sample to obtain measurements indicative of infrared absorption of the sub-region of the sample;
    (d) analyzing probe light collected from the sample to obtain measurements indicative of Raman scattering of the sub-region of the sample; and
    (e) repeating (a)-(d) at a plurality of locations on the sample.

12. The method of claim 11 wherein (c) and (d) are performed substantially simultaneously.

13. The method of claim 12 further comprising creating a map of infrared absorption of at least a portion of the region of the sample and a map of Raman scattering of at least a portion of the region of the sample that is overlapping with the map of infrared absorption.

14. The method of claim 11 further comprising generating a map of infrared absorption of a plurality of locations on the sample.

15. The method of claim 11 wherein (a)-(d) are repeated at a plurality of wavelengths of the beam of infrared radiation to generate a spectrum of infrared absorption by the sub-region of the sample.

16. The method of claim 11 further comprising analyzing probe light collected from the sample to construct a signal indicative of fluorescent response of the sub-region of the sample.

17. The method of claim 11 wherein the probe light is collected with at least one of (i) an optical detector, (ii) an array detector and (iii) a video camera.

18. The method of claim 11 wherein the probe light is collected in one of a transmission configuration in which a detector collects probe light that has passed through the sample or a reflection configuration in which a detector collects probe light that is reflected and/or backscattered from the sample.

19. The method of claim 11 wherein measurements of IR absorption and Raman scattering are performed on substantially the same region of the sample.

20. A method for analyzing a sample with a photothermal microscope, the method comprising:
    (a) illuminating a region of the sample with a light beam of infrared radiation;
    (b) illuminating at least a sub-region of the region of the sample with a probe light beam having a shorter wavelength than the light beam of infrared radiation;

(c) analyzing probe light collected from the sample to obtain measurements indicative of infrared absorption of the sub-region of the sample; and (d) analyzing probe light collected from the sample to obtain measurements indicative of Raman scattering of the sub-region of the sample, wherein the light beam of infrared radiation comprises mid-IR radiation within the wavelength range of 2.5-25 microns.

21. The method of claim 20 wherein (a)-(d) are repeated at a plurality of wavelengths of the beam of infrared radiation to generate a spectrum of infrared absorption by the sub-region of the sample.

22. The method of claim 20 further comprising analyzing probe light collected from the sample to construct a signal indicative of fluorescent response of the sub-region of the sample.

23. The method of claim 20 wherein the probe light is collected with at least one of (i) an optical detector, (ii) an array detector and (iii) a video camera.

24. The method of claim 20 wherein the probe light is collected in one of a transmission configuration in which a detector collects probe light that has passed through the sample or a reflection configuration in which a detector collects probe light that is reflected and/or backscattered from the sample.

25. The method of claim 20 wherein measurements of IR absorption and Raman scattering are performed on substantially the same region of the sample.

26. A method for analyzing a sample with a photothermal microscope, the method comprising:

(a) illuminating a region of the sample with a light beam of infrared radiation;

(b) illuminating at least a sub-region of the region of the sample with a probe light beam having a shorter wavelength than the light beam of infrared radiation;

(c) adjusting an overlap between a focused spot of the light beam of infrared radiation and a focused spot of the probe light beam on the sample;

(d) analyzing probe light collected from the sample to obtain measurements indicative of infrared absorption of the sub-region of the sample; and (e) analyzing probe light collected from the sample to obtain measurements indicative of Raman scattering of the sub-region of the sample.

27. The method of claim 26 wherein adjusting the overlap adjusts the overlap between the focused spots to substantially maximize the measurements indicative of infrared absorption of the sample.

28. The method of claim 26 wherein adjusting the overlap adjusts the overlap between the focused spots to arrange an overlap that is smaller than a diameter of the focused spot of the probe light beam.

29. The method of claim 26 wherein adjusting the overlap adjusts the overlap between the focused spots to achieve a spatial resolution of less than 100 nm for the measurements indicative of the infrared absorption of the sample.

30. The method of claim 26 wherein (a)-(d) are repeated at a plurality of wavelengths of the beam of infrared radiation to generate a spectrum of infrared absorption by the sub-region of the sample.

31. The method of claim 26 further comprising analyzing probe light collected from the sample to construct a signal indicative of fluorescent response of the sub-region of the sample.

32. The method of claim 26 wherein the probe light is collected with at least one of (i) an optical detector, (ii) an array detector and (iii) a video camera.

33. The method of claim 26 wherein the probe light is collected in one of a transmission configuration in which a detector collects probe light that has passed through the sample or a reflection configuration in which a detector collects probe light that is reflected and/or backscattered from the sample.

34. The method of claim 26 wherein measurements of IR absorption and Raman scattering are performed on substantially the same region of the sample.

35. A method for analyzing a sample immersed in a liquid, the method comprising:

(a) illuminating a region of the sample immersed in the liquid with a light beam of infrared radiation;

(b) illuminating at least a sub-region of the region of the sample with a probe light beam having a shorter wavelength than the light beam of infrared radiation;

(c) analyzing probe light collected from the sample to obtain measurements indicative of infrared absorption of the sub-region of the sample; and (d) analyzing probe light collected from the sample to obtain measurements indicative of Raman scattering of the sub-region of the sample.

36. The method of claim 35 wherein (a)-(d) are repeated at a plurality of wavelengths of the beam of infrared radiation to generate a spectrum of infrared absorption by the sub-region of the sample.

37. The method of claim 35 further comprising analyzing probe light collected from the sample to construct a signal indicative of fluorescent response of the sub-region of the sample.

38. The method of claim 35 wherein the probe light is collected with at least one of (i) an optical detector, (ii) an array detector and (iii) a video camera.

39. The method of claim 35 wherein the probe light is collected in one of a transmission configuration in which a detector collects probe light that has passed through the sample or a reflection configuration in which a detector collects probe light that is reflected and/or backscattered from the sample.

40. The method of claim 35 wherein measurements of IR absorption and Raman scattering are performed on substantially the same region of the sample.

41. A method for analyzing a sample, the method comprising:

(a) illuminating a region of the sample with a light beam of infrared radiation;

(b) illuminating at least a sub-region of the region of the sample with a probe light beam having a shorter wavelength than the light beam of infrared radiation;

(c) analyzing probe light collected from the sample to obtain measurements indicative of infrared absorption of the sub-region of the sample; and (d) analyzing probe light collected from the sample to obtain measurements indicative of Raman scattering of the sub-region of the sample, wherein at least one focusing optic is used to focus the light beam of infrared radiation and the probe light beam illuminating the sample and further comprising adjusting a relative separation between the at least one focusing optic and the sample to perform depth-resolved measurements of sub-surface features of a sample.

42. The method of claim 41 wherein (a)-(d) are repeated at a plurality of wavelengths of the beam of infrared radiation to generate a spectrum of infrared absorption by the sub-region of the sample.

43. The method of claim 41 further comprising analyzing probe light collected from the sample to construct a signal indicative of fluorescent response of the sub-region of the sample.

44. The method of claim 41 wherein the probe light is collected with at least one of (i) an optical detector, (ii) an array detector and (iii) a video camera.

45. The method of claim 41 wherein the probe light is collected in one of a transmission configuration in which a detector collects probe light that has passed through the sample or a reflection configuration in which a detector collects probe light that is reflected and/or backscattered from the sample.

46. The method of claim 41 wherein measurements of IR absorption and Raman scattering are performed on substantially the same region of the sample.

* * * * *